US012412529B2

(12) United States Patent
Minami

(10) Patent No.: US 12,412,529 B2
(45) Date of Patent: Sep. 9, 2025

(54) DISPLAY DEVICE

(71) Applicant: Sony Group Corporation, Tokyo (JP)

(72) Inventor: Tetsuo Minami, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/910,625

(22) Filed: Oct. 9, 2024

(65) Prior Publication Data

US 2025/0209982 A1    Jun. 26, 2025

Related U.S. Application Data

(63) Continuation of application No. 18/360,614, filed on Jul. 27, 2023, now Pat. No. 12,148,384, which is a
(Continued)

(30) Foreign Application Priority Data

Nov. 5, 2019    (JP) ................................ 2019-200562

(51) Int. Cl.
*G09G 3/00*      (2006.01)
*G09G 3/3233*   (2016.01)
*H10K 59/80*    (2023.01)
(Continued)

(52) U.S. Cl.
CPC ......... *G09G 3/3233* (2013.01); *H10K 59/876* (2023.02); *G09G 2300/0842* (2013.01);
(Continued)

(58) Field of Classification Search
CPC ....... G02B 27/0172; G09F 9/30; G09F 9/302; G09G 2300/0452; G09G 2300/0804;
(Continued)

(56) References Cited

U.S. PATENT DOCUMENTS

| 2005/0243039 A1 | 11/2005 | Kwak |
| 2013/0050067 A1* | 2/2013 | Yamashita ........... G09G 3/3233 345/76 |
| 2014/0139106 A1* | 5/2014 | Minami ............... G09G 3/3233 315/53 |

FOREIGN PATENT DOCUMENTS

| CN | 1779766 A | 5/2006 |
| JP | 2004-264633 A | 9/2004 |

(Continued)

OTHER PUBLICATIONS

International Search Report (PCT/ISA/210), International Application No. PCT/JP2020/038902, dated Dec. 1, 2020.

*Primary Examiner* — Insa Sadio
(74) *Attorney, Agent, or Firm* — Michael Best & Friedrich LLP

(57) ABSTRACT

Display devices are disclosed. In one example, a display device includes light emitting element groups each including light emitting element units, each of the light emitting element units including first, second and third light emitting elements. Each of the light emitting element groups includes first drive circuits that drive the first light emitting elements, second drive circuits that drive the second light emitting elements, and third drive circuits that drive the third light emitting elements, and in each of the light emitting element groups, the number of first drive circuits is equal to the number of first light emitting elements, the number of second drive circuits is less than the number of second light emitting elements, and the number of third drive circuits is less than the number of third light emitting elements.

17 Claims, 30 Drawing Sheets

Related U.S. Application Data continuation of application No. 17/771,999, filed as application No. PCT/JP2020/038902 on Oct. 15, 2020, now Pat. No. 11,776,475.

(51) Int. Cl.
*H10K 50/858* (2023.01)
*H10K 50/86* (2023.01)
*H10K 59/131* (2023.01)
*H10K 59/38* (2023.01)

(52) U.S. Cl.
CPC ....... *G09G 2310/08* (2013.01); *H10K 50/858* (2023.02); *H10K 50/865* (2023.02); *H10K 59/131* (2023.02); *H10K 59/38* (2023.02); *H10K 59/879* (2023.02)

(58) Field of Classification Search
CPC .............. G09G 2300/0819; G09G 2300/0842; G09G 2310/08; G09G 2320/045; G09G 2360/16; G09G 3/3233; H05B 33/12; H10K 50/858; H10K 50/865; H10K 59/121; H10K 59/131; H10K 59/351; H10K 59/38; H10K 59/876; H10K 59/879
See application file for complete search history.

(56) References Cited

FOREIGN PATENT DOCUMENTS

| | | |
|---|---|---|
| JP | 2007141561 A | 6/2007 |
| JP | 2009186876 A | 8/2009 |
| JP | 2009-271198 A | 11/2009 |
| JP | 2010-002531 A | 1/2010 |
| JP | 2010-002676 A | 1/2010 |
| JP | 2010056017 A | 3/2010 |
| JP | 2010-515102 A | 5/2010 |
| JP | 2010-151865 A | 7/2010 |
| JP | 2012-113245 A | 6/2012 |
| JP | 2013-187187 A | 9/2013 |
| JP | 2016-075868 A | 5/2016 |
| JP | 2016091953 A | 5/2016 |
| JP | 2016102935 A | 6/2016 |
| JP | 2017-147051 A | 8/2017 |
| JP | 2018124540 A | 8/2018 |
| JP | 2019-078808 A | 5/2019 |
| JP | 2019-128468 A | 8/2019 |
| JP | 2019-179716 A | 10/2019 |
| WO | WO-2014148263 A1 | 9/2014 |

\* cited by examiner

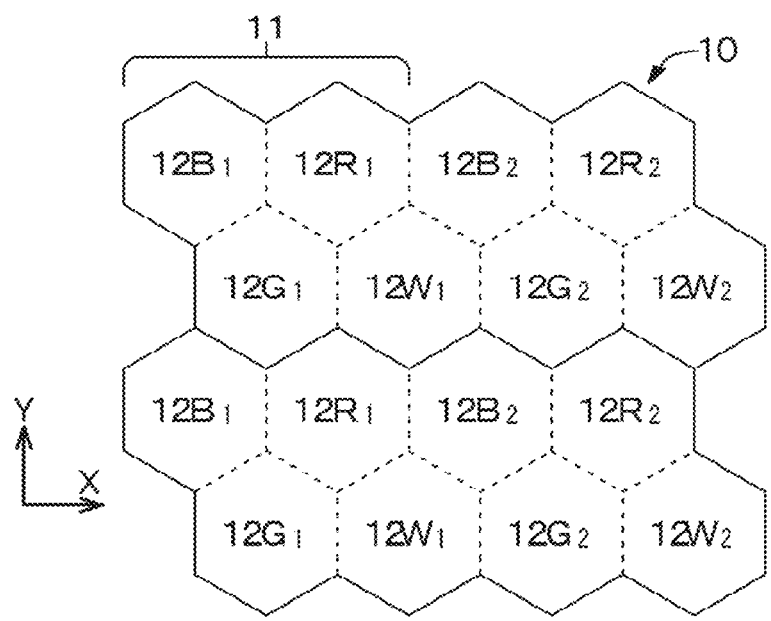

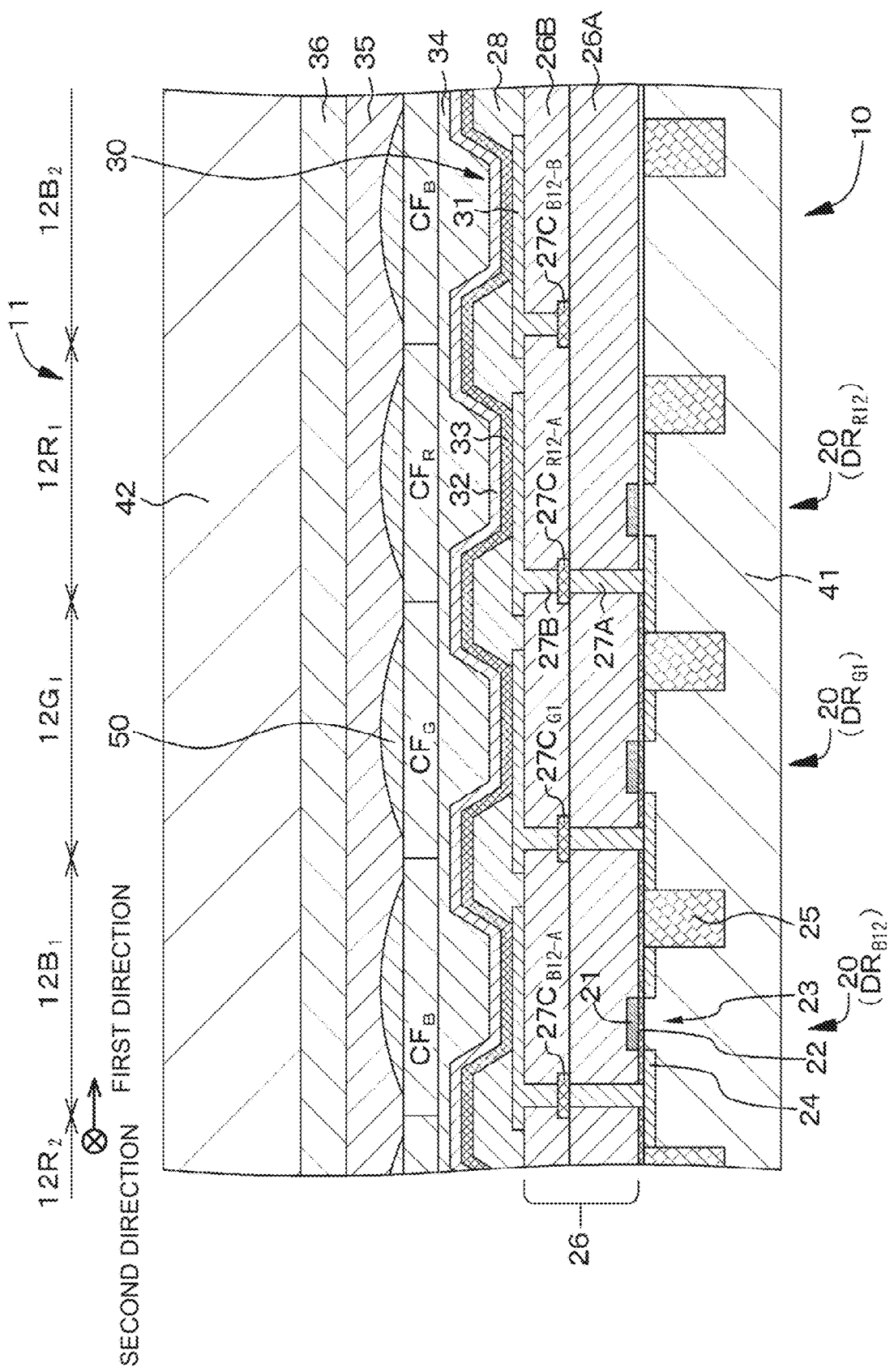

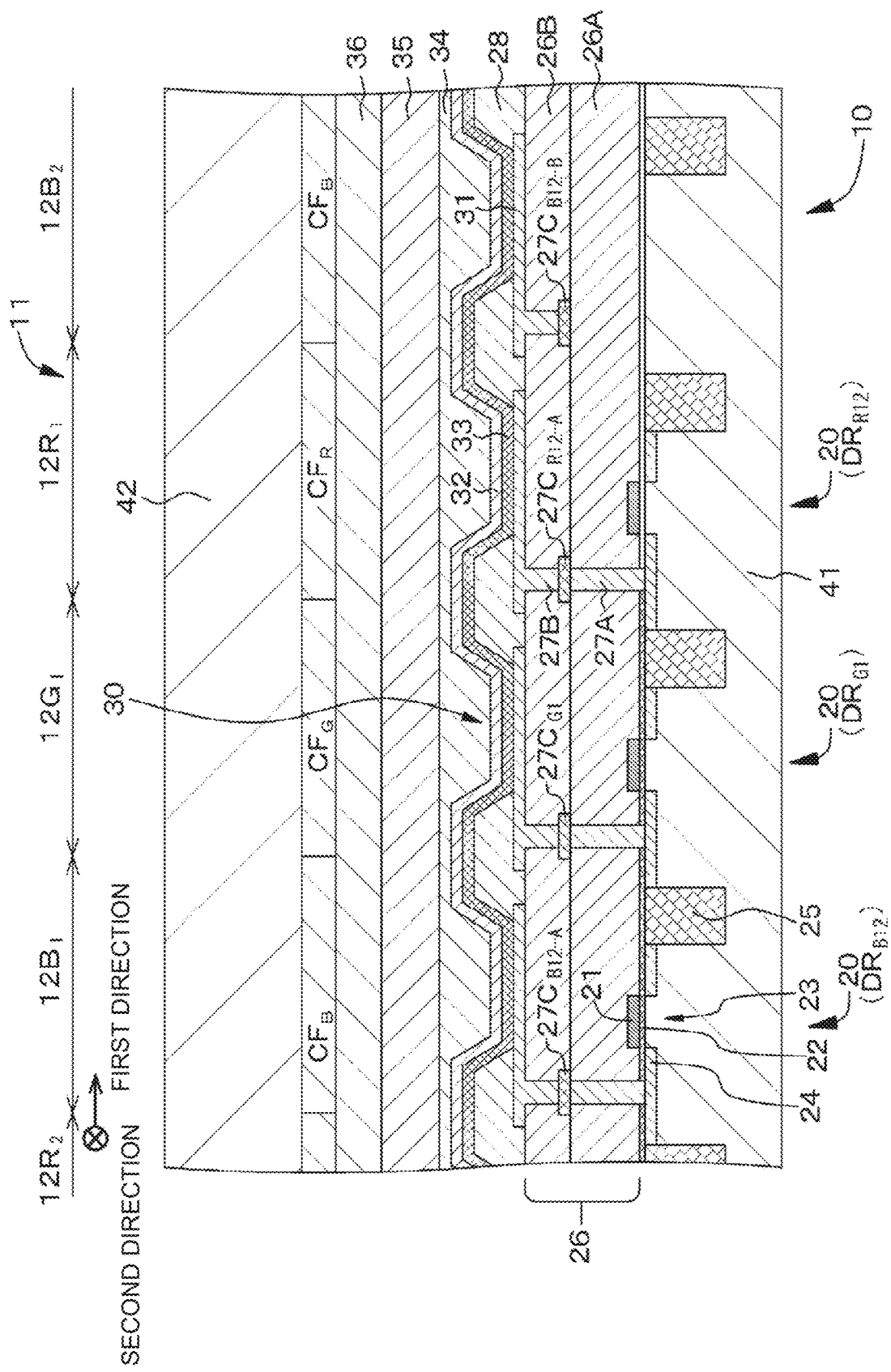

FIG.26A

| 12G | 12B | 12R | 12G | 12B | 12R | 12G | 12B | 12R | 12G | 12B | 12R |
|-----|-----|-----|-----|-----|-----|-----|-----|-----|-----|-----|-----|
| 12G | 12B | 12R | 12G | 12B | 12R | 12G | 12B | 12R | 12G | 12B | 12R |

FIG.26B

| $DR_G$ | $DR_B$ | $DR_R$ | $DR_G$ | $DR_B$ | $DR_R$ | $DR_G$ | $DR_B$ | $DR_R$ | $DR_G$ | $DR_B$ | $DR_R$ |
|--------|--------|--------|--------|--------|--------|--------|--------|--------|--------|--------|--------|
| $DR_G$ | $DR_B$ | $DR_R$ | $DR_G$ | $DR_B$ | $DR_R$ | $DR_G$ | $DR_B$ | $DR_R$ | $DR_G$ | $DR_B$ | $DR_R$ |

DISPLAY DEVICE

This is a Continuation Application of U.S. patent application Ser. No. 18/360,614, filed Jul. 27, 2023, which is is a Continuation Application of U.S. patent application Ser. No. 17/771,999, filed Apr. 26, 2022, now U.S. Pat. No. 11,776,475, issued on Oct. 3, 2023, which is a 371 National Stage Entry of International Application No.: PCT/JP2020/038902, filed on Oct. 15, 2020, which in turn claims priority from Japanese Priority Patent Application JP 2019-200562 filed on Nov. 5, 2019, the entire contents of which are incorporated herein by reference.

FIELD

The present disclosure relates to a display device.

BACKGROUND

A schematic partial cross-sectional view of an organic electroluminescence display device (hereinafter, simply abbreviated as an "organic EL display device") according to the related art is illustrated in FIG. 24. A drive circuit 20' is arranged on a first substrate 41 implemented by a silicon semiconductor substrate, and a first electrode 31 is provided on an insulating layer 26 formed on the first substrate 41. An organic layer 33 is formed on the first electrode 31 by a vapor deposition method, a printing method, or the like, and a second electrode 32, a planarization layer 35, and color filter layers CF are further formed on the organic layer 33. Such a structure is bonded to a second substrate 42 with a sealing resin layer 36 interposed therebetween. The reference numerals in FIG. 24 will be described in a first embodiment.

A light emitting element unit (one pixel) usually includes three light emitting elements (sub-pixels) of a red light emitting element 12R that emits red light, a green light emitting element 12G that emits green light, and a blue light emitting element 12B that emits blue light. In addition to this, in order to improve luminance, the light emitting element unit also includes a white light emitting element that emits white light. In addition, in order to improve definition, it is also known that the number of light emitting elements that emit a certain color light is reduced as compared with a light emitting element that emits another color light, that is, a so-called Pen Tile type arrangement (for example, see JP 2013-187187 A).

One drive circuit is provided for one light emitting element. An arrangement of light emitting elements in a light emitting element unit having a delta arrangement and a striped arrangement is illustrated in each of FIGS. 25A and 26A. In addition, one drive circuit $DC_R$, $DC_G$, or $DC_B$ provided for one light emitting element 12R, 12G, or 12B is illustrated in each of FIGS. 25B and 26B. The light emitting elements 12R, 12G, and 12B and the drive circuits $DC_R$, $DC_G$, and $DC_B$ are connected by a contact hole and a wiring layer (not illustrated). 4×2 (eight sets) light emitting element units (pixels) are illustrated in each of FIGS. 25A and 26A, and 4×2 (eight sets) drive circuits are illustrated in each of FIGS. 25B and 26B.

CITATION LIST

Patent Literature

Patent Literature 1: JP 2013-187187 A

SUMMARY

Technical Problem

In a case where a pixel pitch is reduced in order to improve the definition of the organic EL display device having such a structure, it is required to reduce both a formation pitch of the light emitting element and a formation pitch of the drive circuit. In order to reduce the formation pitch of the drive circuit, it is required to perform design shrinkage of a transistor included in the drive circuit, a capacity, a wiring, or the like. However, a relatively high voltage is required in the organic EL display device, and it is often difficult to reduce the formation pitch of the drive circuit.

Therefore, an object of the present disclosure is to provide a display device capable of improving definition with a simple configuration and structure.

Solution to Problem

To achieve the aims described above, a display device according to the present disclosure includes a plurality of light emitting element groups arranged in a first direction and a second direction different from the first direction, wherein each of the light emitting element groups includes a plurality of light emitting element units, each of the light emitting element units includes one first light emitting element that emits a first color, one second light emitting element that emits a second color, and one third light emitting element that emits a third color, each of the light emitting element groups includes first drive circuits that drive the first light emitting elements, second drive circuits that drive the second light emitting elements, and third drive circuits that drive the third light emitting elements, and in each of the light emitting element groups, the number of first drive circuits is equal to the number of first light emitting elements, the number of second drive circuits is less than the number of second light emitting elements, and the number of third drive circuits is less than the number of third light emitting elements.

BRIEF DESCRIPTION OF DRAWINGS

FIGS. 9A and 9B are a schematic partial plan view of a light emitting element group in a display device of a fifth embodiment, and a view schematically illustrating an arrangement of drive circuits, respectively.

FIG. 11 is a schematic partial cross-sectional view of a display device of a first modified example of the first embodiment.

FIG. 12 is a schematic partial cross-sectional view of a display device of a second modified example of the first embodiment.

FIGS. 26A and 26B are a schematic partial plan view of a light emitting element group in the display device according to the related art, and a view schematically illustrating an arrangement of drive circuits, respectively.

DESCRIPTION OF EMBODIMENTS

Figure 1:
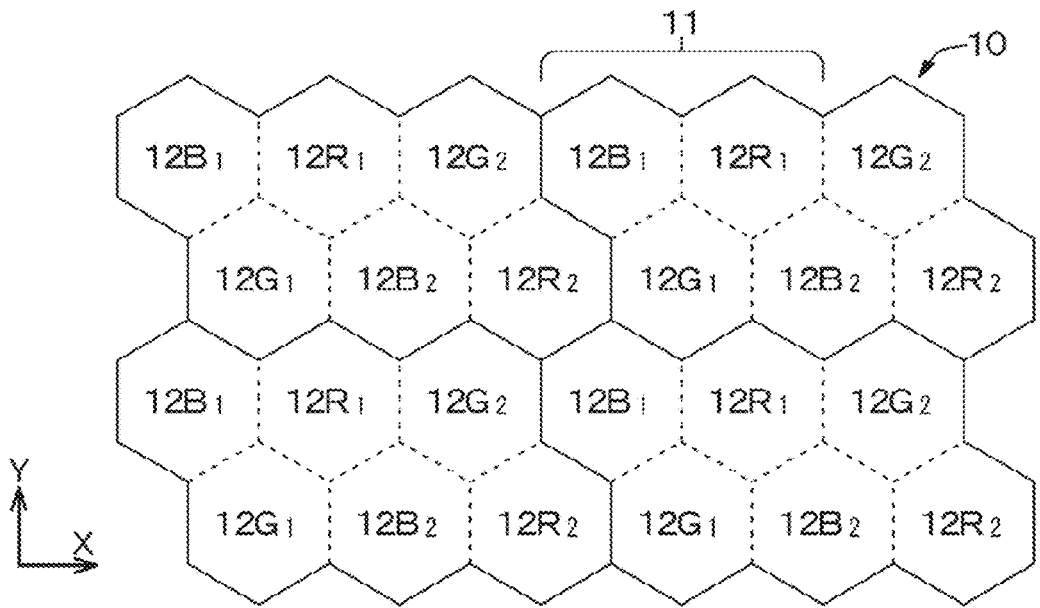
FIGS. 1A, 1B, and 1C are a schematic partial plan view of a light emitting element group in a display device of a first embodiment, a view schematically illustrating an arrangement of drive circuits, and a view schematically illustrating an arrangement of drive circuits and signal lines, respectively.

Hereinafter, the present disclosure will be described based on embodiments with reference to the drawings, but the present disclosure is not limited to the embodiments, and various numerical values or materials are exemplified in the embodiments. Note that descriptions will be given in the following order.

1. Overall Description of Display Device of Present Disclosure
2. First Embodiment (Display Device of Present Disclosure and Display Device of First Form)
3. Second Embodiment (Modification of First Embodiment and Display Device of Second Form)
4. Third Embodiment (Another Modification of First Embodiment)
5. Fourth Embodiment (Still Another Modification of First Embodiment)
6. Fifth Embodiment (Modifications of First Embodiment and Second Embodiment)
7. Others <Overall Description of Display Device of Present Disclosure>

A display device of the present disclosure can be in a form in which the display device further includes first signal lines extending in a second direction, second signal lines extending in the second direction, and third signal lines extending in the second direction, in each of light emitting element groups, light emitting element units are arranged in a first direction, first drive circuits, second drive circuits, and third drive circuits are arranged in the first direction, each of the first drive circuits is connected to each of the first signal lines, each of the second drive circuits is connected to each of the second signal lines, and each of the third drive circuits is connected to each of the third signal lines. Note that the display device of such a form is referred to as a "display device of a first form" for convenience.

Alternatively, a display device of the present disclosure can be in a form in which the display device further includes first signal lines extending in a second direction, second signal lines extending in the second direction, and third signal lines extending in the second direction, in each of light emitting element groups, light emitting element units are arranged in the second direction, first drive circuits, second drive circuits, and third drive circuits are arranged in the second direction, all of the first drive circuits are connected to one shared first signal line, and the second drive circuits and the third drive circuits are connected to one shared second signal line. Note that the display device of such a form is referred to as a "display device of a second form" for convenience.

Further, in the display device of the present disclosure having these preferred forms, in each of the light emitting element groups, $$M_1 = M_2 = M_3 = 2,$$
$$N_1 = 2, \text{ and}$$
$$N_2 = N_3 = 1,$$

in which the number of first light emitting elements is $M_1$, the number of second light emitting elements is $M_2$, the number of third light emitting elements is $M_3$, the number of first drive circuits is $N_1$, the number of second drive circuits is $N_2$, and the number of third drive circuits is $N_3$.

Here, in the display device of the first form, $$N_1 = SL_1 = 2,$$
$$N_2 = SL_2 = 1, \text{ and}$$
$$N_3 = SL_3 = 1,$$

in which the number of first signal lines is $SL_1$, the number of second signal lines is $SL_2$, and the number of third signal lines is $SL_3$.

Further, in the display device of the present disclosure having these preferred forms and configurations,
a signal obtained by calculating a gray scale mean of signals for each of two second light emitting elements can be supplied to the second drive circuit, and
a signal obtained by calculating a gray scale mean of signals for each of two third light emitting elements can be supplied to the third drive circuit.

Alternatively, in the display device of the first form, in each of the light emitting element groups, $$M_1 = M_2 = M_3 = 4,$$
$$N_1 = 4,$$
$$N_2 = 2, \text{ and}$$
$$N_3 = 1,$$

in which the number of first light emitting elements is $M_1$, the number of second light emitting elements is $M_2$, the number of third light emitting elements is $M_3$, the number of first drive circuits is $N_1$, the number of second drive circuits is $N_2$, and the number of third drive circuits is $N_3$.

Here, in the display device of the first form, $$N_1 = SL_1 = 4,$$
$$N_2 = SL_2 = 2, \text{ and}$$
$$N_3 = SL_3 = 1,$$

in which the number of first signal lines is $SL_1$, the number of second signal lines is $SL_2$, and the number of third signal lines is $SL_3$.

Further, in the display device of the present disclosure having these preferred forms and configurations,
a signal obtained by calculating a gray scale mean of signals for each of two second light emitting elements can be supplied to the second drive circuit, and
a signal obtained by calculating a gray scale mean of signals for each of four third light emitting elements can be supplied to the third drive circuit.

Further, in the display device of the present disclosure having these preferred forms and configurations, in each of the light emitting element units, an arrangement of each of the first light emitting elements, the second light emitting elements, and the third light emitting elements can be in a form of a delta arrangement or in a form of a striped arrangement.

Further, in the display device of the present disclosure having these preferred forms and configurations, a first color can be green, a second color can be red, and a third color can be blue. Alternatively, the first color can be yellow, the second color can be cyan, and the third color can be magenta. However, the present disclosure is not limited thereto.

Further, in the display device of the present disclosure having these preferred forms and configurations,
each of the light emitting element units can further include one fourth light emitting element that emits a fourth color,
each of the light emitting element groups can further include fourth drive circuits that drive the fourth light emitting elements,
in each of the light emitting element groups, the number of fourth drive circuits can be equal to or less than the number of fourth light emitting elements.

In this case, the first color can be green, the second color can be red, the third color can be blue, and the fourth color can be white. Alternatively, the first color can be yellow, the second color can be cyan, the third color can be magenta, and the fourth color can be white. However, the present disclosure is not limited thereto.

Further, in the display device of the present disclosure having these preferred forms and configurations, a size of a light emitting unit of the first light emitting element can be larger than each of a size of a light emitting unit of the second light emitting element and a size of a light emitting unit of the third light emitting element. Therefore, the amount of light emitted from the first light emitting element can be larger than each of the amount of light emitted from the second light emitting element and the amount of light emitted from the third light emitting element, or it is possible to achieve optimization of the amount of light emitted from the first light emitting element, the amount of light emitted from the second light emitting element, and the amount of light emitted from the third light emitting element, such that improvement of image quality can be achieved. Assuming that the first light emitting element emits green light, the second light emitting element emits red light, the third light emitting element emits blue light, and the fourth light emitting element emits white light, from the viewpoint of luminance, it is preferable that a size of a light emitting region of the first light emitting element or the fourth light emitting element is larger than a size of a light emitting region of the second light emitting element or the third light emitting element. In addition, from the viewpoint of the life of the light emitting element, it is preferable that the size of the light emitting region of the third light emitting element is larger than the size of the light emitting region of each of the first light emitting element or the second light emitting element and the fourth light emitting element.

Further, in the display device of the present disclosure having these preferred forms and configurations, the light emitting element can be implemented by an organic electroluminescence element.

Hereinafter, a form in which the light emitting unit included in the light emitting element includes an organic electroluminescence layer, that is, a form in which the display device of the present disclosure is implemented by an organic electroluminescence display device (organic EL display device) will be described.

The display device includes a first substrate, a second substrate, and a plurality of light emitting elements that are disposed between the first substrate and the second substrate and are two-dimensionally arranged,
  the light emitting element includes a light emitting unit,
  the light emitting unit provided on a substrate formed on the first substrate includes at least:
  a first electrode;
  a second electrode; and
  an organic layer interposed between the first electrode and the second electrode (including a light emitting layer including an organic electroluminescence layer), and
  light from the organic layer is emitted to the outside through the second substrate or is emitted to the outside through the first substrate.

That is, the display device of the present disclosure can be a top emission type (upper surface light emission type) display device (upper surface light emission type display device) that emits light from the second substrate, and can also be a bottom emission type (lower surface light emission type) display device (lower surface light emission type display device) that emits light from the first substrate.

As described above, the light emitting unit includes the first electrode, the organic layer, and the second electrode from a side of the first substrate. The first electrode can be in contact with a part of the organic layer, or the organic layer can be in contact with a part of the first electrode. Specifically, a size of the first electrode can be smaller than that of the organic layer, or the size of the first electrode is the same as that of the organic layer, but the insulating layer can be formed in a portion between the first electrode and the organic layer, or the size of the first electrode can be larger than that of the organic layer. A size of the light emitting unit is a size of a region (light emitting region) in which the first electrode is in contact with the organic layer.

The organic layer can emit white light, and in this case, the organic layer can include at least two light emitting layers that emit different color light. Specifically, the organic layer can have a laminate structure in which three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm) are laminated, and the organic layer emits white light as a whole. Alternatively, the organic layer can have a structure in which two layers of a blue light emitting layer that emits blue light and a yellow light emitting layer that emits yellow light are laminated, and the organic layer emits white light as a whole. Alternatively, the organic layer can have a structure in which two layers of a blue light emitting layer that emits blue light and an orange light emitting layer that emits orange light are laminated, and the organic layer emits white light as a whole. The organic layer may be shared by a plurality of light emitting elements or may be individually provided in each of the light emitting elements.

A red light emitting element is configured by combining such an organic layer (light emitting unit) that emits white light and a red color filter layer (or a planarization layer functions as a red color filter layer), a green light emitting element is configured by combining the organic layer (light emitting unit) that emits white light and a green color filter layer (or a planarization layer functions as a green color filter layer), and a blue light emitting element is configured by combining the organic layer (light emitting unit) that emits white light and a blue color filter layer (or a planarization layer functions as a blue color filter layer). The planarization layer will be described below. As described above, the light emitting element unit (one pixel) is configured by combining sub-pixels such as the red light emitting element, the green light emitting element, and the blue light emitting element. In some cases, as described above, the light emitting element unit (one pixel) may include the red light emitting element, the green light emitting element, the blue light emitting element, and the light emitting element (or a light emitting element that emits complementary color light) that emits white light (or the fourth color). In the form in which the organic layer includes at least two light emitting layers that emit different color light, actually, light emitting layers that emit different color light may be mixed and not clearly separated into each layer.

Alternatively, the organic layer can include one light emitting layer. In this case, the light emitting element can include, for example, the red light emitting element including the organic layer including the red light emitting layer, the green light emitting element including the organic layer including the green light emitting layer, or the blue light emitting element including the organic layer including the blue light emitting layer. In the case of the display device for displaying colors, the light emitting element unit (one pixel) includes these three types of light emitting elements (sub-pixels). Note that it is not required to form a color filter layer in principle, but a color filter layer may be provided to improve a color purity. Alternatively, one sub-pixel can have a laminate structure of the red light emitting element including the organic layer including the red light emitting layer, the green light emitting element including the organic layer including the green light emitting layer, and the blue light emitting element including the organic layer including the blue light emitting layer.

The substrate is formed on or above the first substrate. Examples of a material forming the substrate can include insulating materials such as $SiO_2$, SiN, and SiON. The substrate can be formed by a forming method suitable for a material forming the substrate, specifically, by known methods, for example, various CVD methods, various coating methods, various PVD methods including a sputtering method and a vacuum vapor deposition method, various printing methods such as a screen printing method, a plating method, an electrodeposition method, an immersion method, and a sol-gel method.

The drive circuit may be provided under or below the substrate. The drive circuit includes a transistor (specifically, for example, a MOSFET) formed on the silicon semiconductor substrate implementing the first substrate or a thin film transistor (TFT) provided on various substrates implementing the first substrate. The transistor or TFT included in the drive circuit and the first electrode can be connected to each other via a contact hole (contact plug) formed in the substrate or the like and a wiring layer. The drive circuit can have a known circuit configuration. The second electrode is connected to a drive unit via the contact hole (contact plug) formed in the substrate or the like in an outer peripheral portion (specifically, an outer peripheral portion of a pixel array unit 72 described below) of the display device.

The first electrode is provided for each light emitting element. The organic layer is provided for each light emitting element, or is provided in common with the light emitting element. The second electrode may be a common electrode in a plurality of light emitting elements. That is, the second electrode may be a so-called solid electrode. The first substrate is arranged below or under the substrate, and the second substrate is arranged above the second electrode. The light emitting element is formed on the first substrate side, and the light emitting unit is provided on the substrate.

The first substrate or the second substrate can be implemented by a silicon semiconductor substrate, a high strain point glass substrate, a soda glass ($Na_2O \cdot CaO \cdot SiO_2$) substrate, a borosilicate ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates each having a surface on which an insulating material layer is formed, a quartz substrate, a quartz substrate having a surface on which an insulating material layer is formed, and a substrate formed of an organic polymer such as polymethylmethacrylate (PMMA) or polyvinyl alcohol (PVA), polyvinyl phenol (PVP), polyether sulfone (PES), polyimide, polycarbonate, polyethylene terephthalate (PET), polyethylene naphthalate (PEN) (having a form of a polymer material such as a flexible plastic film or plastic sheet or plastic substrate formed of a polymer material). The materials forming the first substrate and the second substrate may be the same as or different from each other. However, in the case of the upper surface light emission type display device, the second substrate is required to be transparent to light from the light emitting element, and in the case of the lower surface light emission type display device, the first substrate is required to be transparent to light from the light emitting element.

In a case where the first electrode functions as an anode electrode, examples of a material forming the first electrode can include metals having a high work function such as platinum (Pt), gold (Au), silver (Ag), chromium (Cr), tungsten (W), nickel (Ni), copper (Cu), iron (Fe), cobalt (Co), and tantalum (Ta) and an alloy (for example, an Ag—Pd—Cu alloy containing silver as a main component, 0.3% by mass to 1% by mass of palladium (Pd), and 0.3% by mass to 1% by mass of copper (Cu), an Al—Nd alloy, an Al—Cu alloy, or an Al—Cu—Ni alloy). Further, in a case where a conductive material such as aluminum (Al) or an alloy containing aluminum that have a small work function value and a high light reflectance is used, an appropriate hole injection layer is provided to improve hole injection characteristics, such that the conductive material can be used for the anode electrode. An example of a thickness of the first electrode can include 0.1 μm to 1 μm. Alternatively, in a case where a light reflective layer described below is used, since the first electrode is required to be transparent to light from the light emitting element, examples of a material forming the first electrode can include various transparent conductive materials including a base layer formed of indium oxide, indium-tin oxide (ITO) (Sn-doped $In_2O_3$), (including crystalline ITO and amorphous ITO), indium-zinc oxide (IZO), indium-gallium oxide (IGO), indium-doped gallium-zinc oxide (IGZO, In—$GaZnO_4$), F-doped $In_2O_3$ (IFO), Ti-doped $In_2O_3$ (ITiO), InSn, InSnZno, tin oxide ($SnO_2$), Sb-doped $SnO_2$ (ATO), F-doped $SnO_2$ (FTO), zinc oxide (ZnO), aluminum oxide-doped zinc oxide (AZO), gallium-doped zinc oxide (GZO), B-doped ZnO, aluminum oxide and magnesium oxide-doped zinc oxide (AlMgZnO), antimon oxide, titanium oxide, Nio, spinel type oxide, oxide with $YbFe_2O_4$ structure, gallium oxide, titanium oxide, niobium oxide, or nickel oxide. Alternatively, a transparent conductive material having excellent hole injection characteristics such as indium tin oxide (ITO) or indium zinc oxide (IZO) can be laminated on a dielectric multilayer film or a high light reflective film formed of aluminum (Al) or an alloy thereof (for example, an Al—Cu—Ni alloy). On the other hand, in a case where the first electrode functions as a cathode electrode, it is desirable that the first electrode is formed of a conductive material having a small work function value and a high light reflectance, and an appropriate electron injection layer is provided for the conductive material having a high light reflectance used as the anode electrode so as to improve electron injection characteristics, such that the first electrode can be used as a cathode electrode.

In a case where the second electrode functions as a cathode electrode, as a material forming the second electrode (semi-light transmitting material or light transmitting material), it is desirable to use a conductive material having a small work function value so that emitted light can transmit and electrons can be effectively injected into the organic layer (light emitting layer), and examples thereof can include a metal and an alloy that have a small work function, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], a magnesium-calcium alloy (Mg—Ca alloy), and an alloy of aluminum (Al) and lithium (Li) (Al—Li alloy). Among them, an Mg—Ag alloy is preferable, and an example of a volume ratio of magnesium to silver can include Mg:Ag=5:1 to 30:1. Alternatively, an example of a volume ratio of magnesium to calcium can include Mg:Ca=2:1 to 10:1. As an example, a thickness of the second electrode can be 4 nm to 50 nm, preferably 4 nm to 20 nm, and more preferably 6 nm to 12 nm. Alternatively, an example of the material forming the second electrode can include at least one material selected from the group consisting of Ag—Nd—Cu, Ag—Cu, Au, and Al—Cu. Alternatively, the second electrode can have a laminate structure in which the material layer described above and a so-called transparent electrode formed of, for example, ITO or IZO (for example, a thickness of $3 \times 10^{-8}$ m to $1 \times 10^{-6}$ m) are laminated from a side of the organic layer. A bus electrode (auxiliary electrode) formed of a low resistance material such as aluminum, an aluminum alloy, silver, a silver alloy, copper, a copper alloy, gold, or a gold alloy may be provided for the second electrode to achieve a reduction in resistance of the entire second electrode. It is desirable that an average light transmittance of the second electrode is 50% to 90% and preferably 60% to 90%. On the other hand, in a case where the second electrode functions as an anode electrode, it is desirable that the second electrode is formed of a conductive material through which emitted light can transmit, if necessary, and of which a work function value is large.

Examples of a method of forming the first electrode or the second electrode can include a combination of a deposition method including an electron beam vapor deposition method, a heat filament vapor deposition method, and a vacuum vapor deposition method, a sputtering method, a chemical vapor deposition method (CVD method), an MOCVD method, an ion plating method, and an etching method; various printing methods such as a screen printing method, an ink jet printing method, and a metal mask printing method; a plating method (an electroplating method or an electroless plating method); a lift-off method; a laser ablation method; and a sol-gel method. According to various printing methods or plating methods, it is possible to form directly the first electrode and the second electrode having desired shapes (patterns). Note that after forming the organic layer, in a case where the second electrode is formed, it is preferably formed particularly based on a film forming method such as a vacuum vapor deposition method in which an energy of film forming particles is small or a film forming method such as an MOCVD method from the viewpoint of preventing occurrence of damage to the organic layer. When damage to the organic layer occurs, it is likely to generate a non-light emitting pixel (or non-light emitting sub-pixel) called a "dark spot" caused by a leakage current.

The organic layer includes a light emitting layer containing an organic light emitting material. Specifically, the organic layer can have a laminate structure of a hole transport layer, a light emitting layer, and an electron transport layer, a laminate structure of a hole transport layer and a light emitting layer also serving as an electron transport layer, a laminate structure of a hole injection layer, a hole transport layer, a light emitting layer, an electron transport layer, and an electron injection layer, or the like. Examples of a method of forming the organic layer can include various coating methods such as a physical vapor deposition method (PVD method) such as a vacuum deposition method; a printing method such as a screen printing method or an ink jet printing method; and a laser transferring method in which a laminate structure of a laser absorbing layer and an organic layer formed on a substrate for transfer is irradiated with laser, the organic layer on the laser absorbing layer is separated, and the organic layer is transferred. In a case where the organic layer is formed based on the vacuum vapor deposition method, the organic layer can be obtained, for example, by using a so-called metal mask and by depositing a material passing through an opening provided in the metal mask.

A light shielding portion may be provided between the light emitting element and the light emitting element. Specific examples of a light shielding material forming the light shielding portion can include materials capable of shielding light such as titanium (Ti), chromium (Cr), tungsten (W), tantalum (Ta), aluminum (Al), and $MoSi_2$. The light shielding portion can be formed by a vapor deposition method including an electron beam vapor deposition method, a heat filament vapor deposition method, and a vacuum vapor deposition method, a sputtering method, a CVD method, an ion plating method, or the like.

It is preferable that a protective layer is formed to cover the second electrode. In addition, the protective layer can be formed in a form in which a lens member is formed on or above the protective layer, or in a form in which color filter layers are formed on or above the protective layer and a lens member is formed on or above the color filter layers. Alternatively, the protective layer can be formed in a form in which a lens member is formed on or above the protective layer and color filter layers are formed on or above the lens member. A planarization layer can be further formed thereon. As described above, the planarization layer that functions as a color filter layer may be provided.

The lens member can be formed in a hemispherical shape or can be formed of a part of a sphere, and can be broadly formed in a shape suitable for functioning as a lens. The lens member (on-chip microlens) can be formed of, for example, a transparent resin material such as an acrylic resin, an epoxy resin, a polycarbonate resin, or a polyimide resin, or a transparent inorganic material such as $SiO_2$, and the lens member can be obtained by melt flow or etching back of a transparent resin material, can be obtained by a combination of a photolithography technique using a gray tone mask and an etching method, or can be obtained by a method of forming a transparent resin material into a lens shape based on a nano-printing method.

A light absorption layer (black matrix layer) can be formed between the color filter layer and the color filter layer, above the color filter layer and the color filter layer, or between adjacent lens members. By doing so, occurrence of color mixing between the adjacent light emitting elements can be reliably suppressed. The light absorption layer (black matrix layer) is formed of, for example, a black resin film (specifically, for example, a black polyimide resin) in which a black colorant is mixed and of which an optical density of 1 or more, or a thin film filter utilizing an interference of the thin film. The thin film filter is formed by laminating two or more thin films formed of, for example, a metal, a metal nitride, or a metal oxide, and attenuates light by utilizing the interference of the thin film. A specific example of the thin film filter can include a thin film filter obtained by alternately laminating thin films formed of Cr and chromium (III) oxide ($Cr_2O_3$).

An example of a material forming the protective layer or the planarization layer can include an acrylic resin, and examples thereof can also include $SiO_2$, SiN, SiON, SiC, amorphous silicon (α-Si), $Al_2O_3$, and $TiO_2$. The protective layer or the planarization layer can be composed of a single layer or a plurality of layers. The protective layer or the planarization layer can be formed based on known methods such as various CVD methods, various coating methods, various PVD methods including a sputtering method and a vacuum vapor deposition method, and various printing methods such as a screen printing method. In addition, as the method for forming the protective layer or the planarization layer, an atomic layer deposition method (ALD) can be further adopted. The protective layer or the planarization layer may be shared by a plurality of light emitting elements or may be individually provided in each of the light emitting elements.

The planarization layer and the second substrate are joined to each other by, for example, a resin layer (sealing resin layer). Examples of a material forming the resin layer (sealing resin layer) can include thermosetting adhesives such as an acrylic adhesive, an epoxy adhesive, a urethane adhesive, a silicone adhesive, and a cyanoacrylate adhesive, and ultraviolet curable adhesives. The resin layer (sealing resin layer) may also serve as a planarization layer.

As described above, in some cases, the planarization layer can have a function as a color filter layer. Such a planarization layer may be formed of a known color resist material. A transparent filter may be provided for the light emitting element that emits white color. By making the planarization layer also function as a color filter layer, the organic layer and the planarization layer (color filter layer) are close to each other, such that prevention of color mixing can be effectively achieved even when light emitted from the light emitting element is widened, thereby improving viewing angle characteristics. However, the color filter layers may be separately provided on or above the planarization layer or under or below the planarization layer independently of the planarization layer.

An ultraviolet absorption layer, a contamination prevention layer, a hard coat layer, or an antistatic layer may be formed on the outermost surface (specifically, for example, the outer surface of the second substrate) that emits light of the display device, or a protective member (for example, cover glass) may be arranged on the outermost surface.

An insulating layer or an interlayer insulating film is formed in the display device, and examples of an insulating material forming the insulating layer or the interlayer insulating film can include $SiO_x$ materials (materials forming a silicon oxide film) such as $SiO_2$, non-doped silicate glass (NSG), boron phosphorous silicate glass (BPSG), PSG, BSG, AsSG, SbSG, PbSG, spin-on glass (SOG), low temperature oxide (LTO, low temperature $CVD-SiO_2$), low melting point glass, and glass paste; an SiN material containing an SiON material; SiOC; SiOF; and SiCN. Alternatively, examples thereof can include inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($Zro_2$), niobium oxide ($Nb_2O_5$), tin oxide ($SnO_2$), and vanadium oxide ($VO_x$). Alternatively, examples thereof can include various resins such as a polyimide resin, an epoxy resin, and an acrylic resin, and low dielectric constant insulating materials such as SiOCH, organic SOG, and a fluororesin (for example, a material having a dielectric constant k ($=\varepsilon/\varepsilon_0$) of 3.5 or less, and specifically, for example, fluorocarbon, a cycloperfluorocarbon polymer, benzocyclobutene, a cyclic fluororesin, polytetrafluoroethylene, amorphous tetrafluoroethylene, polyaryl ether, aryl ether fluoride, polyimide fluoride, amorphous carbon, parylene (polyparaxylylene), and fullerene fluoride), and examples thereof can also include Silk (trademark of The Dow Chemical Co., a coating type low dielectric constant interlayer insulating film material) and Flare (trademark of Honeywell Electronic Materials Co., a polyallyl ether (PAE) material). These materials can be used alone or in appropriate combination thereof. In some cases, the substrate may be formed of the material described above. The insulating layer, the interlayer insulating film, and the substrate can be formed based on known methods such as various CVD methods, various coating methods, various PVD methods including a sputtering method and a vacuum vapor deposition method, and various printing methods such as a screen printing method, a plating method, an electrodeposition method, an immersion method, and a sol-gel method.

The organic EL display device preferably has a resonator structure in order to further improve light extraction efficiency. Specifically, light emitted in the light emitting layer resonates to emit a part of the light from the second electrode between a first interface composed of an interface between the first electrode and the organic layer (alternatively, a first interface composed of an interface between the light reflective layer and the interlayer insulating film in a structure in which the interlayer insulating film is provided under the first electrode and the light reflective layer is provided under the interlayer insulating film) and a second interface composed of an interface between the second electrode and the organic layer. When an optical distance from a maximum light emitting position of the light emitting layer to the first interface is $OL_1$, an optical distance from a maximum light emitting position of the light emitting layer to the second interface is $OL_2$, and $m_1$ and $m_2$ are integers, the following Equations (1-1) and (1-2) can be satisfied.

$$0.7\{-\Phi_1/(2\pi) + m_1\} \le 2 \times OL_1/\lambda \le 1.2\{-\Phi_1/(2\pi) + m_1\} \quad (1\text{-}1)$$

$$0.7\{-\Phi_2/(2\pi) + m_2\} \le 2 \times OL_2/\lambda \le 1.2\{-\Phi_2/(2\pi) + m_2\} \quad (1\text{-}2)$$

Here, $\lambda$: Maximum peak wavelength of spectrum of light generated in light emitting layer (or desired wavelength in light generated in light emitting layer), $\Phi_1$: Phase shift amount of light reflected at first interface (unit: radian), where, $-2\pi < \Phi_1 \le 0$ $\Phi_2$: Phase shift amount of light reflected at second interface (unit: radian), and where, $-2\pi < \Phi_2 \le 0$.

Here, examples of a form in which a value of $m_1$ is a value of 0 or more and a value of $m_2$ is a value of 0 or more independently of the value of $m_1$ can include a form of ($m_1$, $m_2$)=(0, 0), a form of ($m_1$, $m_2$)=(0, 1), a form of ($m_1$, $m_2$)=(1,0), and a form of ($m_1$, $m_2$)=(1,1).

A distance $L_1$ from the maximum light emitting position of the light emitting layer to the first interface refers to an actual distance (physical distance) from the maximum light emitting position of the light emitting layer to the first interface, and a distance $L_2$ from the maximum light emitting position of the light emitting layer to the second interface refers to an actual distance (physical distance) from the maximum light emitting position of the light emitting layer to the second interface. In addition, the optical distance is also called an optical path length, and generally refers to n×L when a light ray passes through a medium having a refractive index n by a distance L. The same applies to the following. Therefore, $$OL_1 = L_1 \times n_{ave}, \text{ and}$$

$$OL_2 = L_2 \times n_{ave},$$

in which an average refractive index is $n_{ave}$. Here, the average refractive index is $n_{ave}$ is obtained by summing products of a refractive index and a thickness of each of the layers implementing the organic layer (or the organic layer, the first electrode, or the interlayer insulating film) and dividing the sum by the thickness of the organic layer (or the organic layer, the first electrode, or the interlayer insulating film).

A desired wavelength $\lambda$ in the light generated in the light emitting layer (specifically, for example, a wavelength of red light, a wavelength of green light, or a wavelength of blue light) may be determined, and various parameters such as $OL_1$ and $OL_2$ in the light emitting element may be obtained based on Equations (1-1) and (1-2), thereby designing the light emitting element.

The first electrode or the light reflective layer and the second electrode absorb a part of incident light and reflect the rest. Therefore, a phase shift occurs in the reflected light. These phase shift amounts $\Phi_1$ and $\Phi_2$ can be obtained by measuring values of a real part and an imaginary part of a complex refractive index of each of the materials forming the first electrode or the light reflective layer and the second electrode using, for example, an ellipsometer, and performing calculation based on these values (for example, see "Principles of Optic", Max Born and Emil Wolf, 1974 (PERGAMON PRESS)). The refractive index of the organic layer, the interlayer insulating film, or the like, the refractive index of the first electrode, and the refractive index of the first electrode in a case where the first electrode absorbs a part of the incident light and reflects the rest can be obtained by measurement using an ellipsometer.

Examples of a material forming the light reflective layer can include aluminum, an aluminum alloy (for example, Al—Nd or Al—Cu), an Al/Ti laminate structure, an Al—Cu/Ti laminate structure, chromium (Cr), silver (Ag), and a silver alloy (for example, Ag—Cu, Ag—Pd—Cu, or Ag—Sm—Cu). The light reflective layer can be formed by, for example, a vapor deposition method including an electron beam vapor deposition method, a heat filament vapor deposition method, and a vacuum vapor deposition method; a sputtering method; a CVD method; an ion plating method; a plating method (an electroplating method or an electroless plating method); a lift-off method; a laser ablation method; and a sol-gel method. Depending on the material forming the light reflective layer, in order to control a crystal state of the light reflective layer to be formed, it is preferable to form, for example, a base layer formed of TiN.

As such, in the organic EL display device having a resonator structure, actually, the red light emitting element configured by combining the organic layer that emits white light and the red color filter layer (or the planarization layer functions as a red color filter layer) resonates red light emitted in the light emitting layer to emit reddish light (light having a peak of an optical spectrum in a red region) from the second electrode. In addition, the green light emitting element configured by combining the organic layer that emits white light and the green color filter layer (or the planarization layer functions as a green color filter layer) resonates green light emitted in the light emitting layer to emit greenish light (light having a peak of an optical spectrum in a green region) from the second electrode. Further, the blue light emitting element configured by combining the organic layer that emits white light and the blue color filter layer (or the planarization layer functions as a blue color filter layer) resonates blue light emitted in the light emitting layer to emit bluish light (light having a peak of an optical spectrum in a blue region) from the second electrode. That is, a desired wavelength λ in the light generated in the light emitting layer (specifically, a wavelength of red light, a wavelength of green light, or a wavelength of blue light) may be determined, and various parameters such as $OL_1$ and $OL_2$ in each of the red light emitting element, the green light emitting element, and the blue light emitting element may be obtained based on Equations (1-1) and (1-2), thereby designing each of the light emitting elements. For example, an organic EL element having a resonator structure in which an organic layer is used as a resonance unit is disclosed in the paragraph number [0041] of JP 2012-216495 A, and it is described that a thickness of the organic layer is preferably 80 nm or more and 500 nm or less, and more preferably 150 nm or more and 350 nm or less, so that a distance from a light emitting point (light emitting surface) to a reflective surface can be appropriately adjusted.

In the organic EL display device, it is desirable that a thickness of the hole transport layer (hole supply layer) and a thickness of the electron transport layer (electron supply layer) are approximately equal. Alternatively, the hole transport layer (hole supply layer) may be thicker than the electron transport layer (electron supply layer), such that the electron supply required for high efficiency at a low drive voltage to the light emitting layer can be sufficient. That is, the hole transport layer is arranged between the first electrode corresponding to the anode electrode and the light emitting layer, and the hole transport layer is formed at a thickness smaller than that of the electron transport layer, such that the supply of holes can be increased. Therefore, since the holes and electrons are not excessive or deficient and a carrier balance with a sufficiently large amount of carrier supply can be obtained, high light emitting efficiency can be obtained. In addition, since the holes and electrons are not excessive or deficient, the carrier balance is not easily lost, and drive deterioration is suppressed, such that light emission life can be extended.

The display device can be used, for example, as a monitor device included in a personal computer, and can be used as a television receiver, a mobile phone, a personal digital assistant (PDA), a monitor device incorporated into a game device, or a display device incorporated into a projector. Alternatively, the display device can be applied to an electronic viewfinder (EVF) or a head-mounted display (HMD), and can be applied to a display device for virtual reality (VR), mixed reality (MR), or augmented reality (AR). Alternatively, the display device can be implemented as an electronic book, an electronic paper such as an electronic newspaper, a bulletin board such as a signboard, a poster, or a black board, re-writable paper for replacement for paper for printers, a display unit of a home appliance, a card display unit of a point card or the like, or an image display device of an electronic advertisement or an electronic POP. The display device of the present disclosure can be used as a light emitting device to implement various lighting devices including a backlight device for a liquid crystal display device or a planar light source device.

First Embodiment

Figure 2:
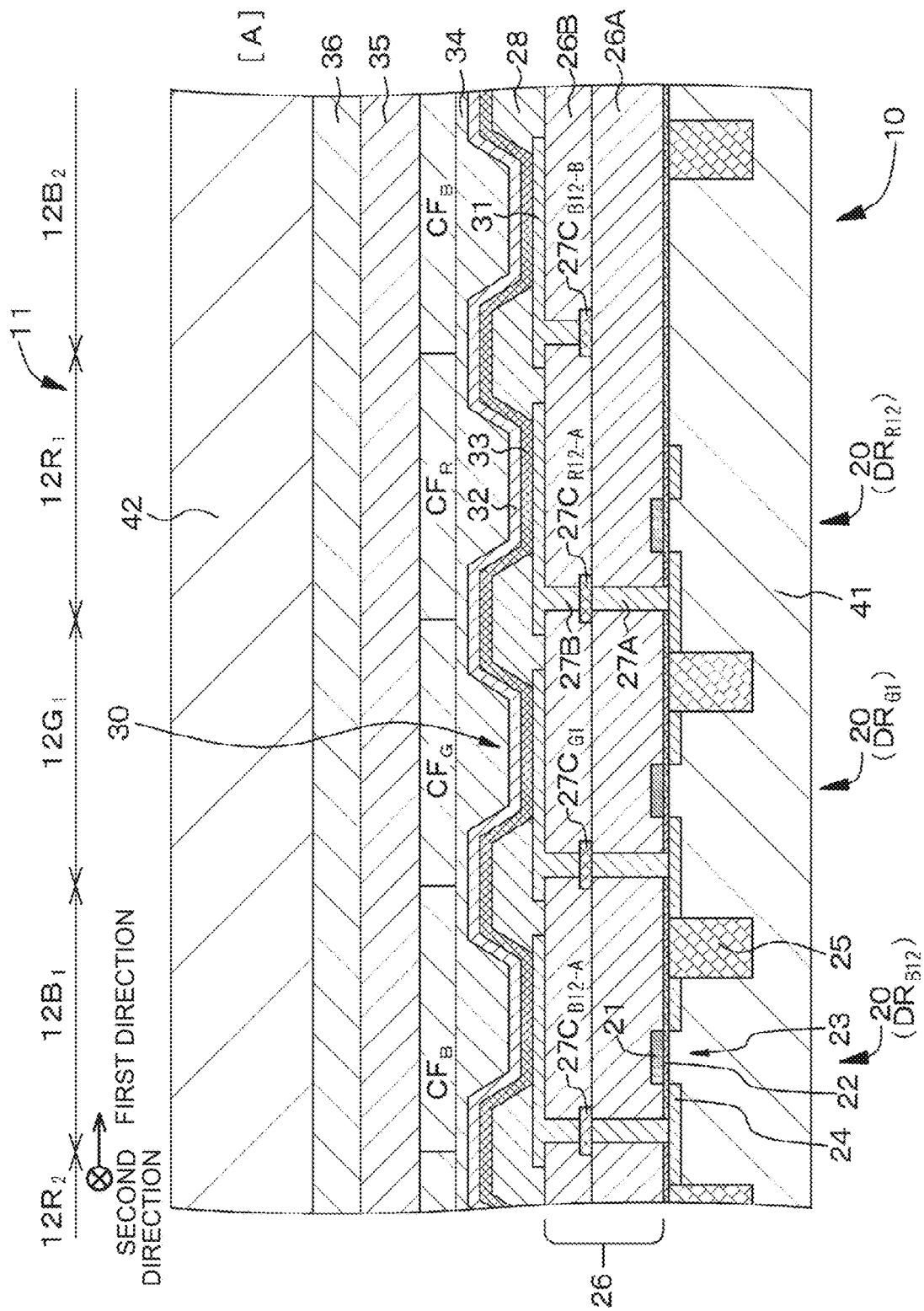
FIG. 2 is a schematic partial cross-sectional view of the display device of the first embodiment.
Figure 3:
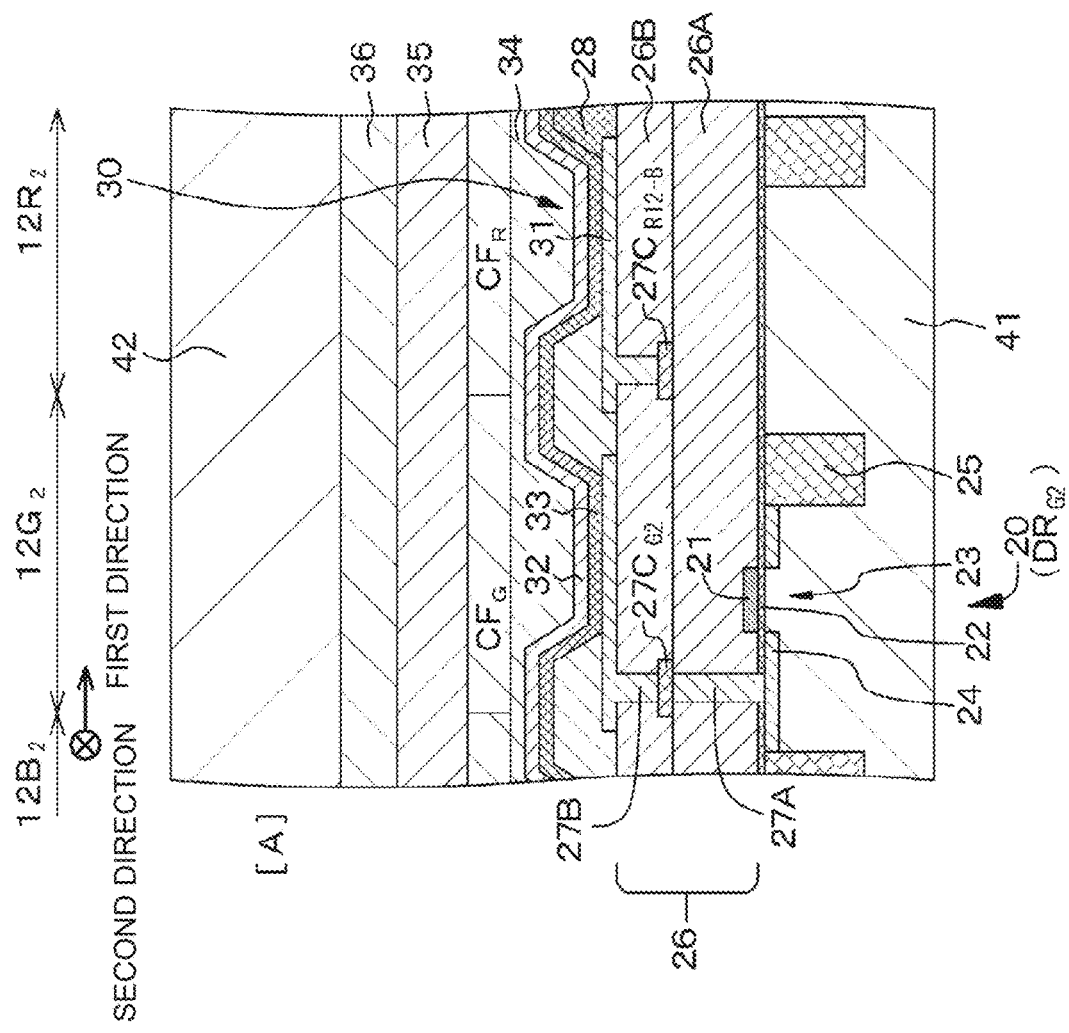
FIG. 3 is a schematic partial cross-sectional view of the display device of the first embodiment connected to a portion indicated by [A] of the display device illustrated in FIG. 2.

A first embodiment relates to a display device of the present disclosure and a display device of a first form. A schematic partial plan view of a light emitting element group in the display device of the first embodiment is illustrated in FIG. 1A, an arrangement of drive circuits is schematically illustrated in FIG. 1B, an arrangement of drive circuits and signal lines is schematically illustrated in FIG. 1C, a schematic partial cross-sectional view of the display device of the first embodiment is illustrated in FIG. 2, and a schematic partial cross-sectional view of the display device of the first embodiment connected to a portion indicated by [A] of the display device illustrated in FIG. 2 is illustrated in FIG. 3. Four (four sets) light emitting element units are illustrated in FIG. 1A, and four (four sets) drive circuits are illustrated in FIGS. 1B and 1C.

Figure 4A:
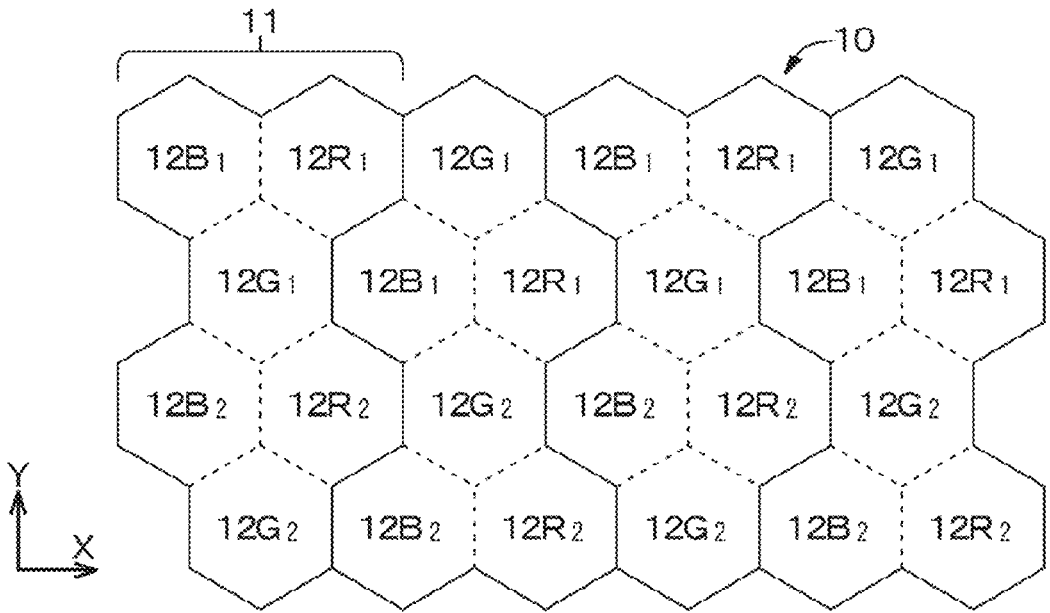
FIG. 4A is a schematic partial plan view of a light emitting element group in a display device of a second embodiment.
Figure 4B:
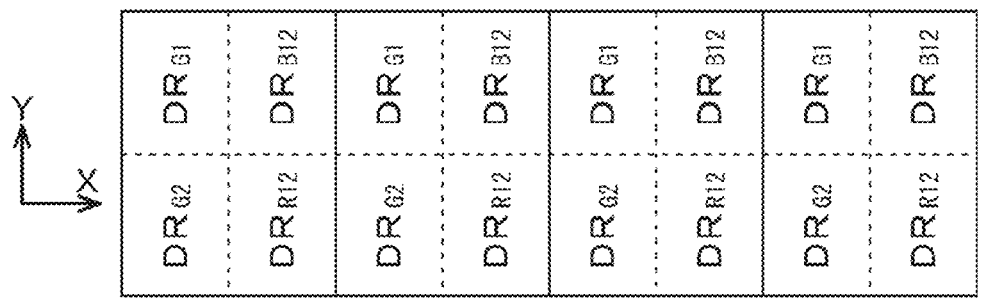
FIGS. 4B and 4C are views schematically illustrating an arrangement of drive circuits.
Figure 4C:
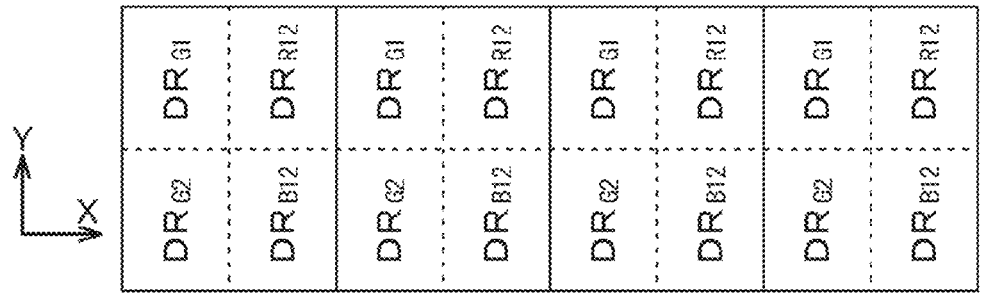
Figure 5:
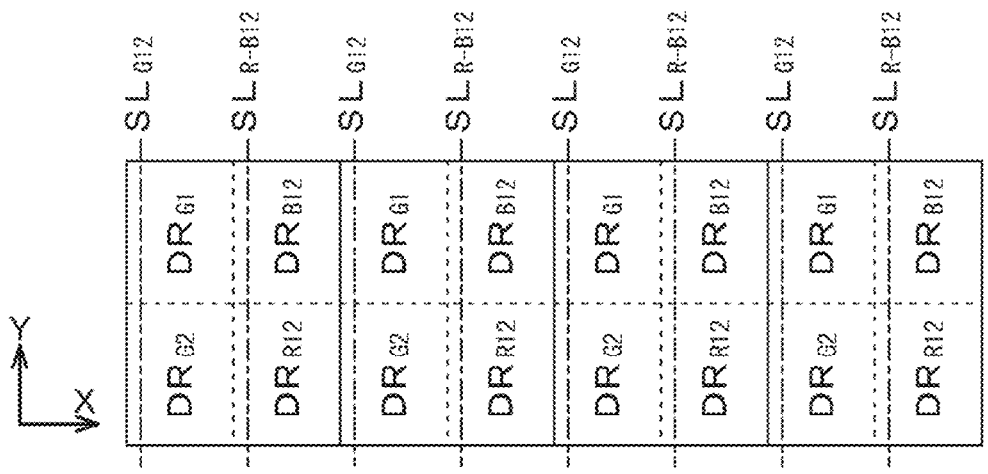
FIG. 5 is a view schematically illustrating an arrangement of drive circuits and signal lines in the display device of the second embodiment.
Figure 6A:
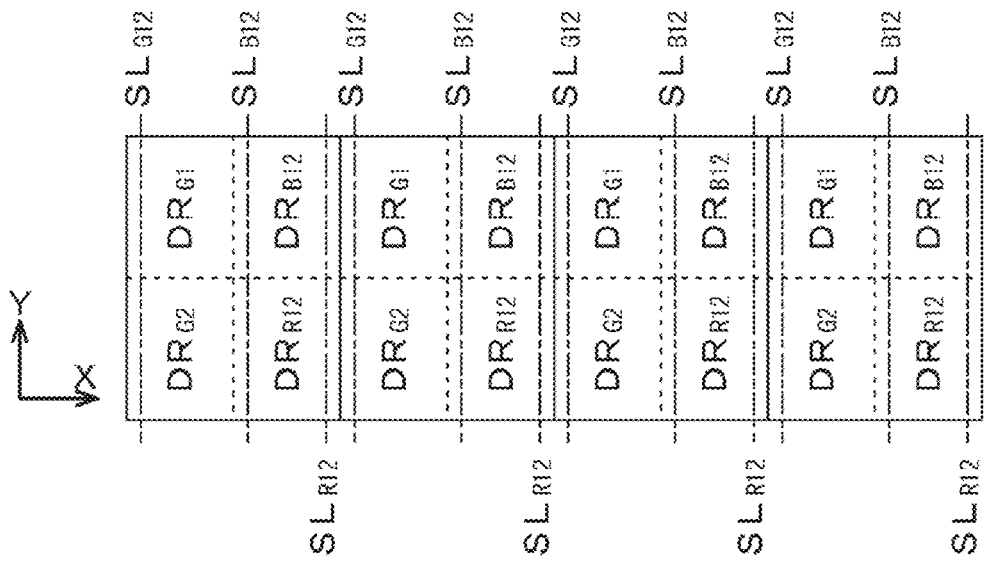
FIGS. 6A and 6B are views schematically illustrating an arrangement of drive circuits and signal lines in the display device of the second embodiment.
Figure 6B:
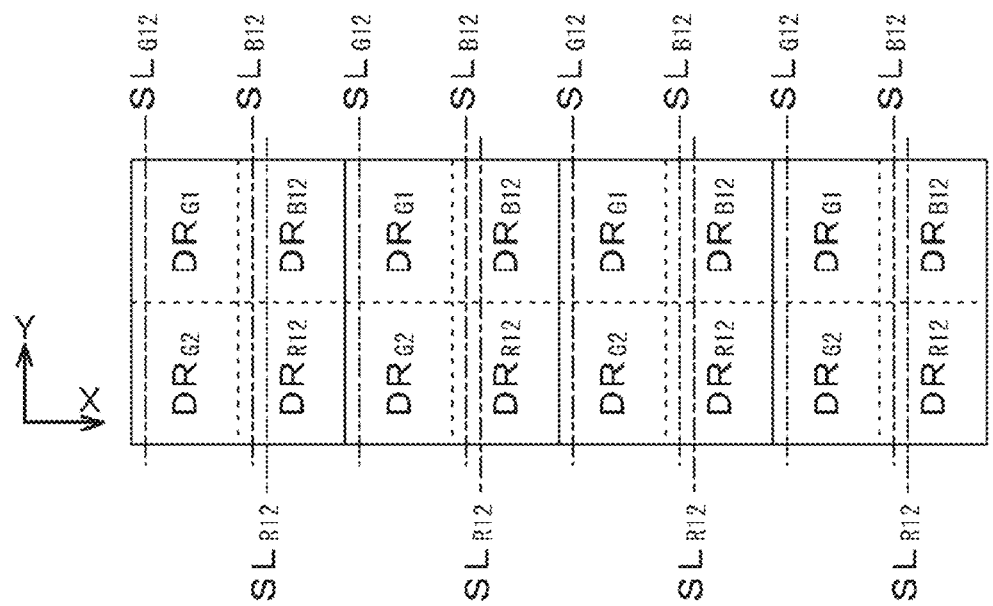
Figure 7A:
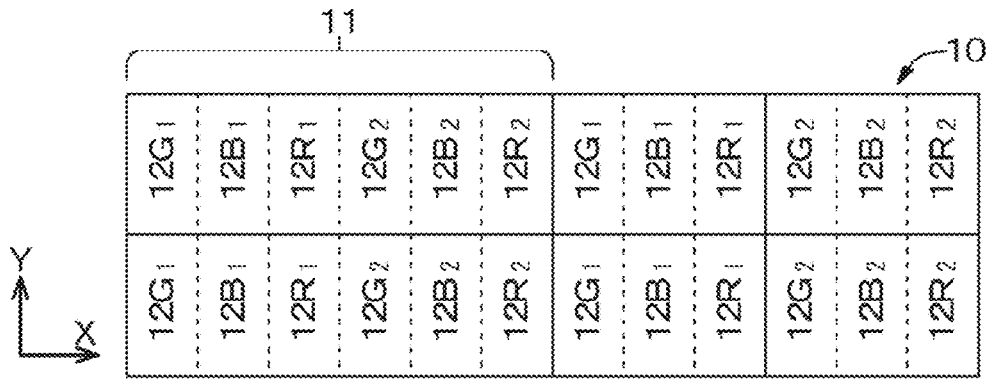
FIG. 7A is a schematic partial plan view of a light emitting element group in a display device of a third embodiment.
Figure 7B:
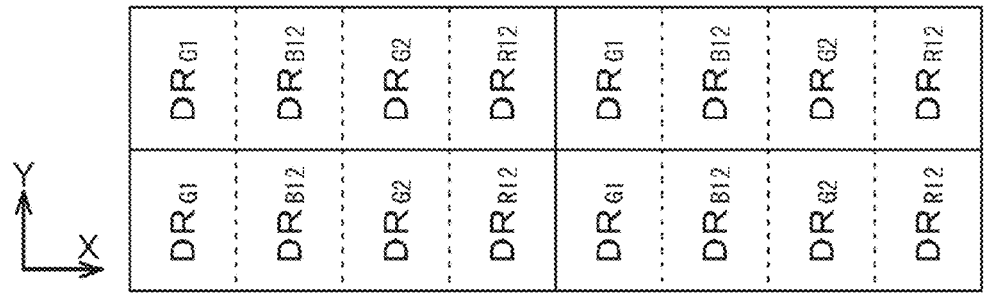
FIGS. 7B, 7C, and 7D are views schematically illustrating an arrangement of drive circuits.
Figure 7C:
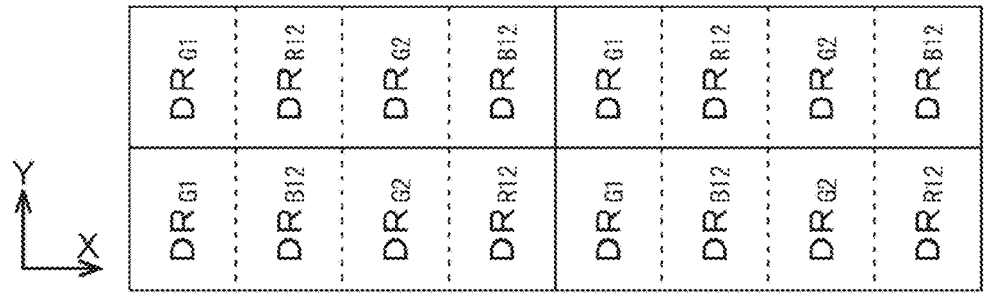
Figure 7D:
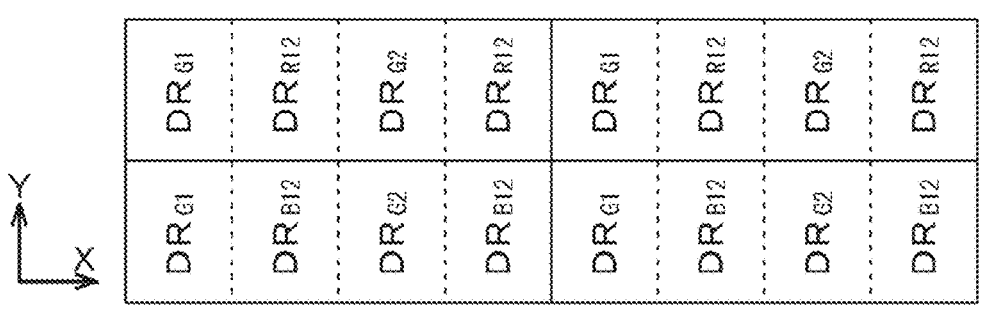
Figure 8A:
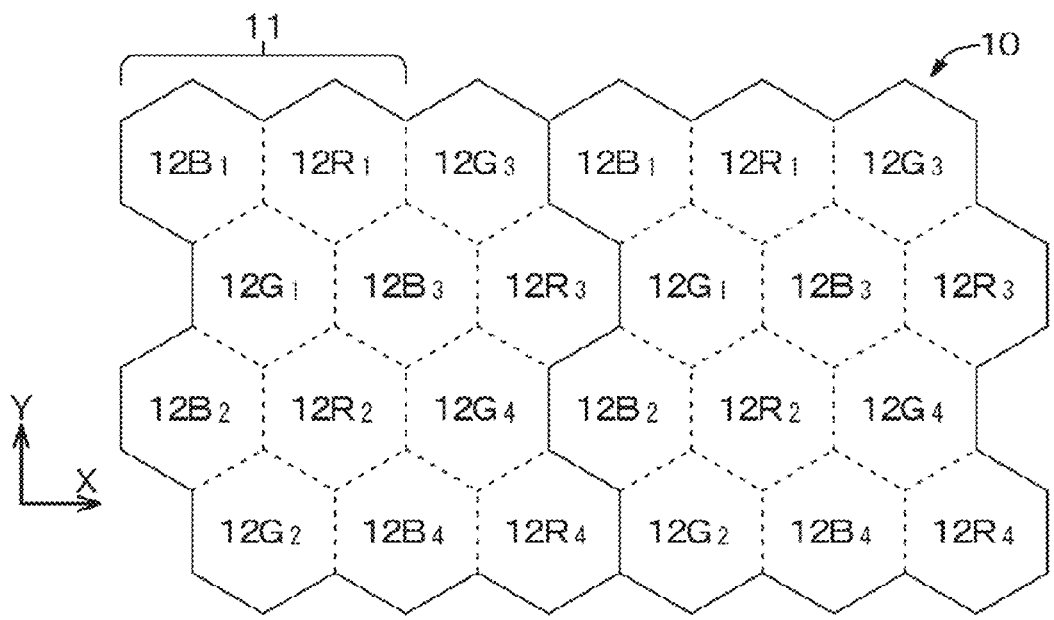
FIGS. 8A and 8B are a schematic partial plan view of a light emitting element group in a display device of a fourth embodiment, and a view schematically illustrating an arrangement of drive circuits, respectively.
Figure 8B:
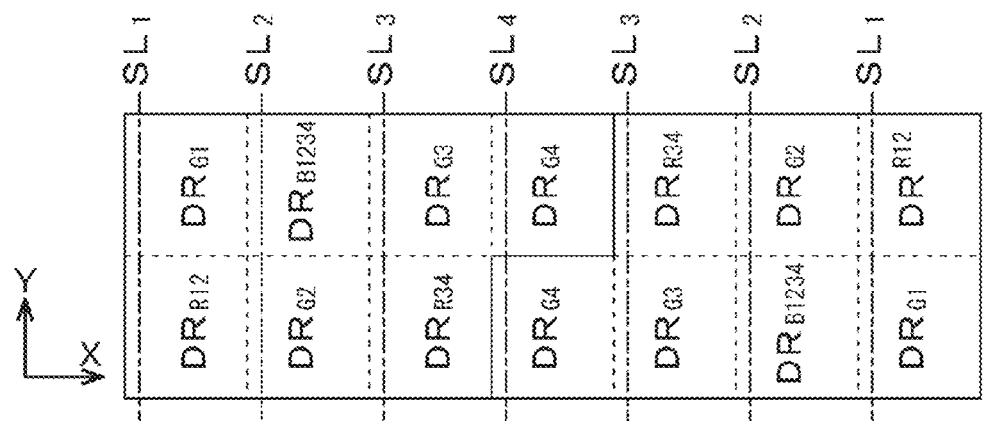
Figure 10A:
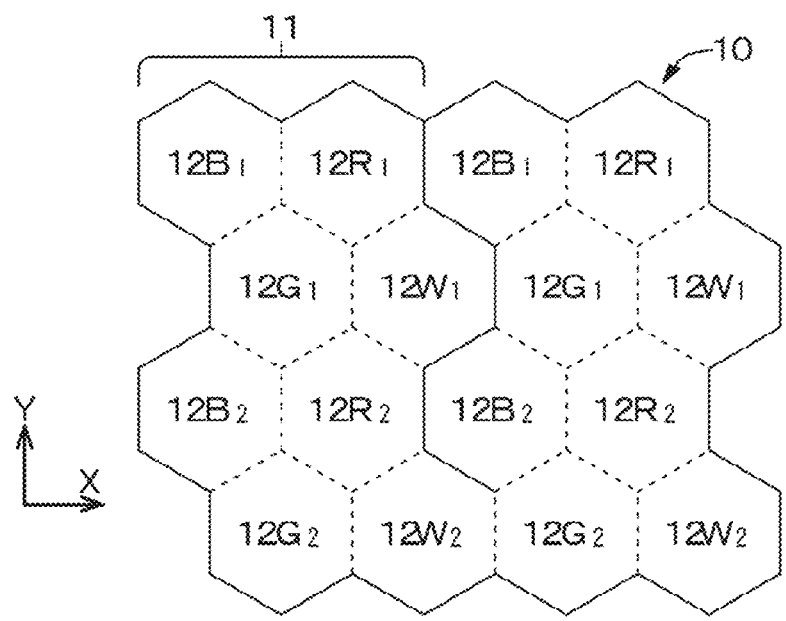
FIGS. 10A and 10B are a schematic partial plan view of a light emitting element group in a display device of a modified example of the fifth embodiment, and a view schematically illustrating an arrangement of drive circuits, respectively.
Figure 10B:
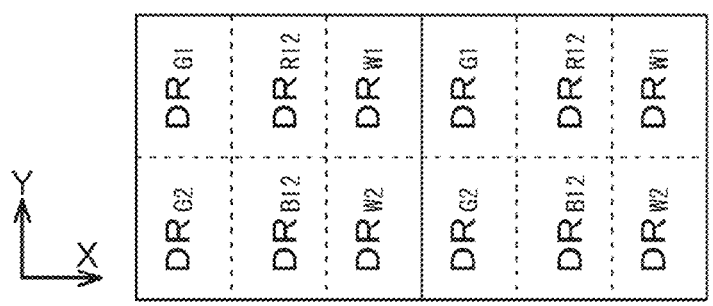

Here, four (four sets) light emitting element units are illustrated in FIGS. 1A and 4A, and four sets of drive circuits are illustrated in FIGS. 1B, 1C, 4B, 4C, 5, 6A, 6B, 7A, 7B, 7C, and 7D. In addition, two (two sets) light emitting element units are illustrated in FIGS. 8A, 9A, and 10A, and two sets of drive circuits are illustrated in FIGS. 8B, 9B, and 10B. In addition, in the drawings, for convenience, a first direction is indicated by "X" and a second direction is indicated by "Y". In the schematic partial plan view of the light emitting element group, one light emitting element group is surrounded by a solid line, and the light emitting element is surrounded by a dotted line. Further, a signal line is indicated by a dash-single dotted line.

Note that in the following description, light emitting elements such as a light emitting element $12G_1$ and a light emitting element $12G_2$ that emit green light may be collectively referred to as a "light emitting element 12G", light emitting elements such as a light emitting element $12R_1$ and a light emitting element $12R_2$ that emit red light may be collectively referred to as a "light emitting element 12R", light emitting elements such as a light emitting element $12B_1$ and a light emitting element $12R_2$ that emit blue light may be collectively referred to as a "light emitting element 12B", light emitting elements such as a light emitting element $12W_1$ and a light emitting element $12W_2$ that emit white light may be collectively referred to as a "light emitting element 12W", and the light emitting element 12G, the light emitting element 12R, the light emitting element 12B, and the light emitting element 12W may be collectively referred to as a "light emitting element 12".

The display device of the first embodiment includes a plurality of light emitting element groups 10 arranged in a first direction and a second direction different from the first direction, each of the light emitting element groups 10 includes a plurality of light emitting element units 11, each of the light emitting element units 11 includes one first light emitting element 12G that emits a first color, one second light emitting element 12R that emits a second color, and one third light emitting element 12B that emits a third color, each of the light emitting element groups 10 includes first drive circuits that drive the first light emitting elements 12G, second drive circuits that drive the second light emitting elements 12R, and third drive circuits that drive the third light emitting elements 12B, and in each of the light emitting element groups 10, the number of first drive circuits is equal to the number of first light emitting elements 12G, the number of second drive circuits is less than the number of second light emitting elements 12R, and the number of third drive circuits is less than the number of third light emitting elements 12B.

The display device of the first embodiment further includes first signal lines extending in the second direction, second signal lines extending in the second direction, and third signal lines extending in the second direction, in each of the light emitting element groups 10, the light emitting element units 11 are arranged in the first direction, the first drive circuits, the second drive circuits, and the third drive circuits are arranged in the first direction, each of the first drive circuits is connected to each of the first signal lines, each of the second drive circuits is connected to each of the second signal lines, and each of the third drive circuits is connected to each of the third signal lines.

Specifically, in the display device of the first embodiment, in each of the light emitting element groups 10, $$M_1 = M_2 = M_3 = 2,$$
$$N_1 = 2, \text{ and}$$
$$N_2 = N_3 = 1,$$

in which the number of first light emitting elements 12G is $M_1$, the number of second light emitting elements 12R is $M_2$, the number of third light emitting elements 12B is $M_3$, the number of first drive circuits is $N_1$, the number of second drive circuits is $N_2$, and the number of third drive circuits is $N_3$. In the first embodiment, the light emitting element group 10 includes two light emitting element units 11. That is, a first light emitting element unit $11_1$ includes a light emitting element $12G_1$, a light emitting element $12R_1$, and a light emitting element $12B_1$, and a second light emitting element unit $11_2$ includes a light emitting element $12G_2$, a light emitting element $12R_2$, and a light emitting element $12B_2$.

Here, $$N_1 = SL_1 = 2,$$
$$N_2 = SL_2 = 1, \text{ and}$$
$$N_3 = SL_3 = 1,$$

in which the number of first signal lines is $SL_1$, the number of second signal lines is $SL_2$, and the number of third signal lines is $SL_3$.

Here, two first light emitting elements 12G are represented by the reference numerals $12G_1$ and $12G_2$, two second light emitting elements 12R are represented by the reference numerals $12R_1$ and $12R_2$, and two third light emitting elements 12B are represented by the reference numerals $12B_1$ and $12B_2$.

In addition, two first drive circuits are represented by the reference numerals $DR_{G1}$ and $DR_{G2}$, one second drive circuit is represented by the reference numeral $DR_{R12}$, and one third drive circuit is represented by the reference numeral $DR_{B12}$.

Further, two first signal lines are represented by the reference numerals $SL_{G1}$ and $SL_{G2}$, one second signal line is represented by the reference numeral $SL_{R12}$, and one third signal line is represented by the reference numeral $SL_{B12}$.

More specifically, the first drive circuit $DR_{G1}$ is connected to the first signal line $SL_{G1}$, the first drive circuit $DR_{G2}$ is connected to the first signal line $SL_{G2}$, one second drive circuit $DR_{R12}$ is connected to the second signal line $SL_{R12}$, and one third drive circuit $DR_{B12}$ is connected to the third signal line $SL_{B12}$.

A signal $DT_{R12}$ obtained by calculating a gray scale mean of signals for each of two second light emitting elements $12R_1$ and $12R_2$ is supplied to the second drive circuit $DR_{R12}$, and a signal $DT_{B12}$ obtained by calculating a gray scale mean of signals for each of two third light emitting elements $12B_1$ and $12B_2$ is supplied to the third drive circuit $DR_{B12}$.

Specifically, a data signal $DT_{G1}$ that controls luminance of the first light emitting element $12G_1$ is sent from a horizontal selector described below to the first drive circuit $DR_{G1}$ via the first signal line $SL_{G1}$, and the luminance of the first light emitting element $12G_1$ is controlled, and a data signal $DT_{G2}$ that controls luminance of the first light emitting element $12G_2$ is sent from the horizontal selector to the first drive circuit $DR_{G2}$ via the first signal line $SL_{G2}$, and the luminance of the first light emitting element $12G_2$ is controlled.

In addition, in the horizontal selector, a gray scale mean $T_{R12}$ of a data signal that controls luminance of the second light emitting element $12R_1$ and a data signal that controls luminance of the second light emitting element $12R_2$ is obtained, the signal (data signal) $DT_{R12}$ is sent to the second drive circuit $DR_{R12}$ via the second signal line $SL_{R12}$ based on the gray scale mean $T_{R12}$ that controls the luminance of each of the second light emitting elements $12R_1$ and $12R_2$, and the luminance of each of the second light emitting elements $12R_1$ and $12R_2$ is controlled. Further, in the horizontal selector, a gray scale mean $T_{B12}$ of a data signal that controls luminance of the third light emitting element $12B_1$ and a data signal that controls luminance of the third light emitting element $12B_2$ is obtained, the signal (data signal) $DT_{B12}$ is sent to the third drive circuit $DR_{B12}$ via the third signal line $SL_{B12}$ based on the gray scale mean $T_{B12}$ that controls the luminance of each of the third light emitting elements $12B_1$ and $12B_2$, and the luminance of each of the third light emitting elements $12B_1$ and $12B_2$ is controlled.

Figure 23:
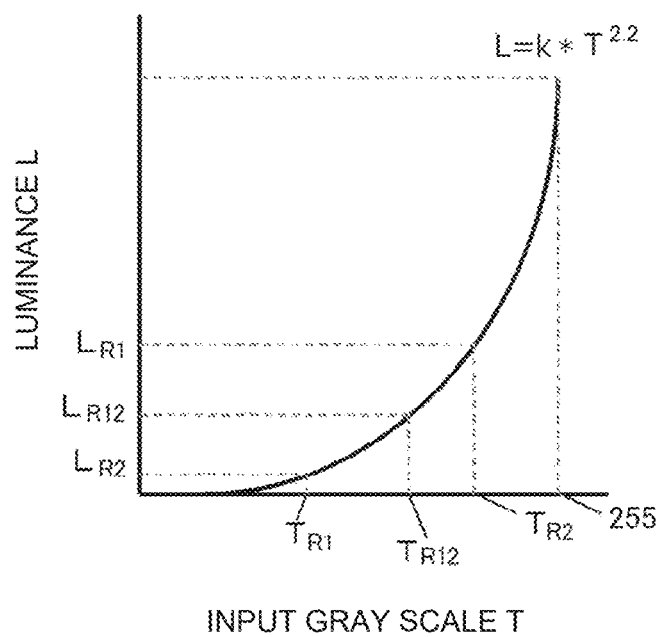
FIG. 23 is a view for describing a gray scale mean.
Figure 24:
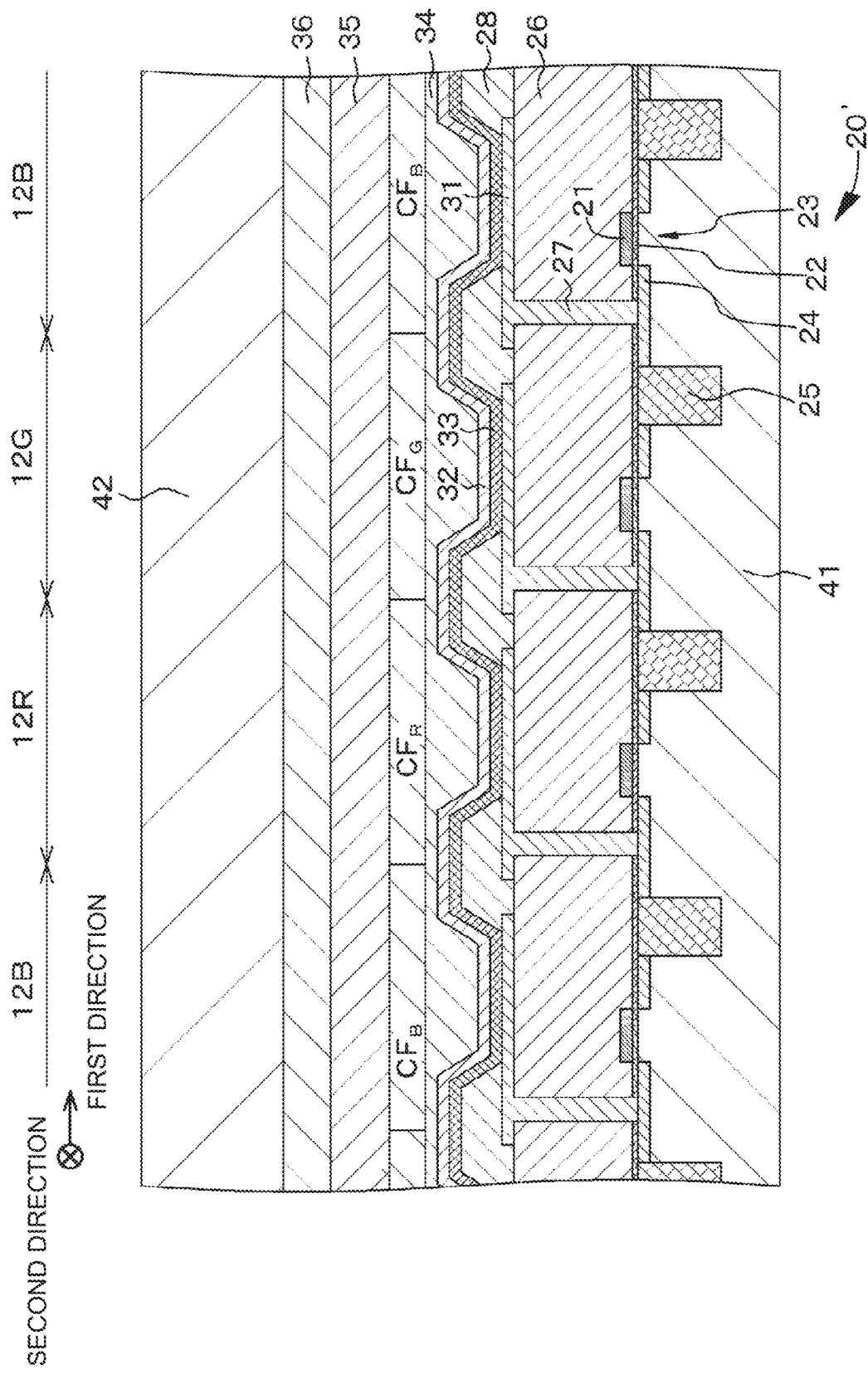
FIG. 24 is a schematic partial cross-sectional view of a display device according to the related art.
Figures 25A, 25B:
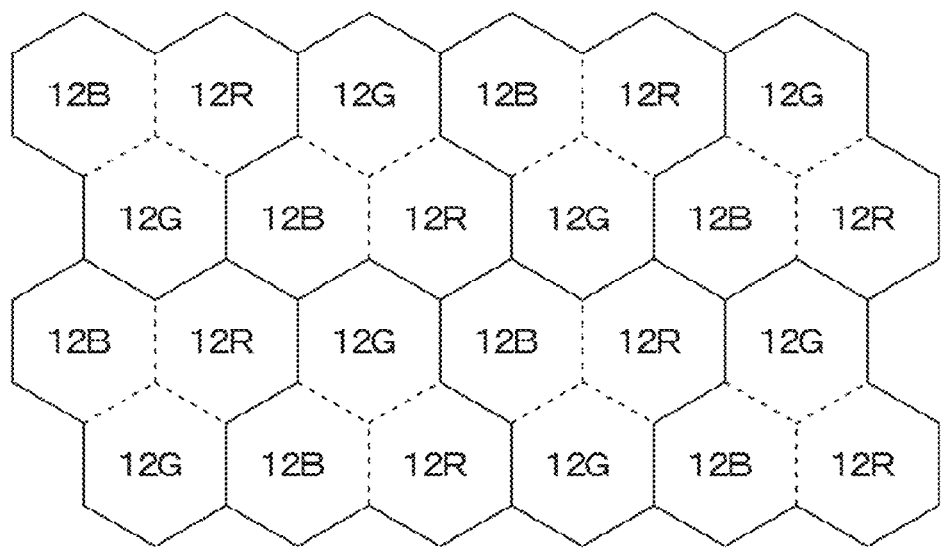
FIGS. 25A and 25B are a schematic partial plan view of a light emitting element group in the display device according to the related art, and a view schematically illustrating an arrangement of drive circuits, respectively.

As illustrated in a schematic view of FIG. 23, in general, for example, $$L = k \times T^{2.2},$$

in which k is a constant between an input gray scale T and luminance L. "2.2" is a gamma value. Accordingly, for example, in a case where luminance in a data signal having "100" gray scales and luminance in a data signal having "200" gray scales are averaged, the horizontal selector does not output a data signal having (100+200)/2=150 gray scales, but is required to send the gray scale mean to the second light emitting elements $12R_1$ and $12R_2$ and the third light emitting elements $12B_1$ and $12B_2$ as a data signal so that an average luminance is obtained. That is, for example, an average luminance of solid images to be displayed in the second light emitting elements $12R_1$ and $12R_2$ is $[(L_{R1}+L_{R2})/2]$, in which the luminance of the solid image to be displayed in the second light emitting element $12R_1$ is $L_{R1}$ and the luminance of the solid image to be displayed in the second light emitting element $12R_2$ is $L_{R2}$. Therefore, the horizontal selector may generate a gray scale mean $T_{R12}$ that satisfies $[(L_{R1}+L_{R2})/2]=k \times T_{R12}^{2.2}$ and further a data signal $DT_{R12}$ based on the gray scale mean $T_{R12}$, and the gray scale mean $T_{R12}$ and the data signal $DT_{R12}$ may thus be sent to the second light emitting elements $12R_1$ and $12R_2$ via the second signal line $SL_{R12}$. The same applies to the third light emitting elements $12B_1$ and $12B_2$.

In the display device of the first embodiment, in each of the light emitting element units 11, the arrangement of the first light emitting elements 12G, the second light emitting elements 12R, and the third light emitting elements 12B is a delta arrangement.

In addition, in the light emitting element of the first embodiment, although not limited, the first color is green, the second color is red, and the third color is blue. The light emitting element 12 is implemented by an organic electroluminescence element (organic EL element), and the display device is implemented by an organic electroluminescence display device (organic EL display device) and is an active matrix display device.

Specifically, the display device of the first embodiment or a display device of each of second to fifth embodiments described below includes:

a first substrate 41 and a second substrate 42; and
a plurality of light emitting elements 12 (12R, 12G, and 12B) that are disposed between the first substrate 41 and the second substrate 42 and are two-dimensionally arranged,
the light emitting element 12 (12R, 12G, or 12B) includes a light emitting unit 30,
the light emitting unit 30 provided on a substrate 26 formed on the first substrate 41 includes at least:
a first electrode 31;
a second electrode 32; and
an organic layer interposed between the first electrode 31 and the second electrode 32 (including a light emitting layer including an organic electroluminescence layer) 33, and
light from the organic layer 33 is emitted to the outside through the second substrate 42.

More specifically, the light emitting unit 30 included in each of the light emitting elements 12 (12R, 12G, and 12B) is provided on the substrate 26 formed on the first substrate 41, and
the light emitting unit 30 includes at least:
a first electrode 31;
an organic layer (organic electroluminescence layer) 33 formed on the first electrode 31; and
a second electrode 32 formed on the organic layer 33.

A protective layer 34 formed of an acrylic resin is formed on the second electrode 32 so as to cover the second electrode 32. On a top surface or above the protective layer 34 (specifically, on the protective layer 34 in the first embodiment or in each of second to fifth embodiments described below), color filter layers CF formed of known materials are formed by a known method, and a planarization layer 35 is formed on the color filter layers CF. Note that an outer shape of each of the light emitting unit 30 and the color filter layer CF is, for example, circular, but is not limited to such a shape.

The planarization layer 35 formed on the color filter layers CF ($CF_R$, $CF_G$, and $CF_B$) is bonded to the second substrate 42 with a sealing resin layer 36 interposed therebetween. Examples of a material forming the sealing resin layer 36 can include thermosetting adhesives such as an acrylic adhesive, an epoxy adhesive, a urethane adhesive, a silicone adhesive, and a cyanoacrylate adhesive, and ultraviolet curable adhesives. The color filter layer CF is an on-chip color filter layer (OCCF) formed on the first substrate side. Therefore, a distance between the organic layer 33 and the color filter layer CF can be shortened, and color mixing caused by light that is emitted from the organic layer 33 and is incident on the adjacent color filter layers CF with another color can be suppressed. In some cases, the planarization layer 35 may be omitted, and the color filter layers CF may be bonded to the second substrate 42 with the sealing resin layer 36 interposed therebetween.

In the light emitting element 12 implemented by the organic EL element of each of the first to fifth embodiments, the organic layer 33 has a laminate structure of a red light emitting layer, a green light emitting layer, and a blue light emitting layer. As described above, one light emitting element unit (one pixel) includes three light emitting elements of the red light emitting element 12R, the green light emitting element 12G, and the blue light emitting element 12B. The organic layer 33 included in the light emitting element 12 emits white light, and each of the light emitting elements 12R, 12G, and 12B is configured by combining the organic layer 33 that emits white light and the color filter layers $CF_R$, $CF_G$, and $CF_B$. The red color filter layer $CF_R$ is included in the red light emitting element 12R for displaying a red color, the green color filter layer $CF_G$ is included in the green light emitting element 12G for displaying a green color, and the blue color filter layer $CF_B$ is included in the blue light emitting element 12B for displaying a blue color. The red light emitting element 12R, the green light emitting element 12G, and the blue light emitting element 12B have substantially the same configurations and structures except for the positions of the color filter layers and the light emitting layer. The number of pixels is, for example, 1,920×

1,080, and one light emitting element (display element) includes one sub-pixel, and the light emitting element (specifically, the organic EL element) is three times the number of pixels.

The drive circuit is provided below the substrate 26 formed of $SiO_2$ and formed based on a CVD method. The drive circuit can have a known circuit configuration. The drive circuit includes a transistor (specifically, a MOSFET) formed on the silicon semiconductor substrate corresponding to the first substrate 41. A transistor 20 including a MOSFET includes a gate insulating layer 22 formed on the first substrate 41, a gate electrode 21 formed on the gate insulating layer 22, a source/drain region 24 formed on the first substrate 41, a channel formation region 23 formed between the source/drain regions 24, and an element separation region 25 surrounding the channel formation region 23 and the source/drain region 24. The substrate 26 includes a lower interlayer insulating layer 26A and an upper interlayer insulating layer 26B.

In the first light emitting element $12G_1$, the transistor 20 (first drive circuit $DR_{G1}$) and the first electrode 31 are electrically connected to each other with a contact plug 27A provided in the lower interlayer insulating layer 26A, a pad portion $27C_{G1}$ provided on the lower interlayer insulating layer 26A, and a contact plug 27B interposed therebetween. In addition, in the first light emitting element $12G_2$, the transistor 20 (first drive circuit $DR_{G2}$) and the first electrode 31 are electrically connected to each other with the contact plug 27A provided in the lower interlayer insulating layer 26A, a pad portion $27C_{G2}$ provided on the lower interlayer insulating layer 26A, and the contact plug 27B interposed therebetween.

In the second light emitting element $12R_1$, the transistor 20 (second drive circuit $DR_{R12}$) and the first electrode 31 are electrically connected to each other with the contact plug 27A provided in the lower interlayer insulating layer 26A, a pad portion $27C_{B12-A}$ provided on the lower interlayer insulating layer 26A, and the contact plug 27B interposed therebetween. In addition, in the second light emitting element $12R_2$, the transistor 20 (second drive circuit $DR_{R12}$) and the first electrode 31 are electrically connected to each other with the contact plug 27A provided in the lower interlayer insulating layer 26A, the pad portion $27C_{B12-A}$ provided on the lower interlayer insulating layer 26A, a wiring layer (not illustrated) provided on the lower interlayer insulating layer 26A, a pad portion $27C_{B12-B}$ provided on the lower interlayer insulating layer 26A, and the contact plug 27B interposed therebetween.

In the third light emitting element $12B_1$, the transistor 20 (third drive circuit $DR_{B12}$) and the first electrode 31 are electrically connected to each other with the contact plug 27A provided in the lower interlayer insulating layer 26A, the pad portion $27C_{B12-A}$ provided on the lower interlayer insulating layer 26A, and the contact plug 27B interposed therebetween. In addition, in the third light emitting element $12B_2$, the transistor 20 (third drive circuit $DR_{B12}$) and the first electrode 31 are electrically connected to each other with the contact plug 27A provided in the lower interlayer insulating layer 26A, the pad portion $27C_{B12-A}$ provided on the lower interlayer insulating layer 26A, a wiring layer (not illustrated) provided on the lower interlayer insulating layer 26A, the pad portion $27C_{B12-B}$ provided on the lower interlayer insulating layer 26A, and the contact plug 27B interposed therebetween.

Note that in the drawings, one transistor 20 for one drive circuit is illustrated.

The second electrode 32 is connected to a drive unit via the contact hole (contact plug) (not illustrated) formed in the substrate 26 in an outer peripheral portion (specifically, an outer peripheral portion of a pixel array unit 72 described below) of the display device. In the outer peripheral portion of the display device, an auxiliary electrode connected to the second electrode 32 may be provided below the second electrode 32, and the auxiliary electrode may be connected to the drive circuit.

The first electrode 31 functions as an anode electrode, and the second electrode 32 functions as a cathode electrode. The first electrode 31 has a laminate structure of a light reflecting material layer, specifically, for example, an Al—Nd alloy layer, an Al—Cu alloy layer, an Al—Ti alloy layer, and an ITO layer, and the second electrode 32 is formed of a transparent conductive material such as ITO. The first electrode 31 is formed on the substrate 26 based on a combination of a vacuum vapor deposition method and an etching method. In addition, the second electrode 32 is formed particularly by a film formation method such as a vacuum vapor deposition method in which an energy of film forming particles is small, and is not patterned. The organic layer 33 is also not patterned. However, the present disclosure is not limited thereto, and the organic layer 33 may be patterned. That is, the organic layer 33 is painted separately for each sub-pixel, the organic layer 33 of the red light emitting element includes an organic layer that emits red light, the organic layer 33 of the green light emitting element includes an organic layer that emits green light, and the organic layer 33 of the blue light emitting element includes an organic layer that emits blue light.

In the first embodiment, the organic layer 33 has a laminate structure of a hole injection layer (HIL), a hole transport layer (HTL), a light emitting layer, an electron transport layer (ETL), and an electron injection layer (EIL). The light emitting layer includes at least two light emitting layers that emit different color light, and as described above, the light emitted from the organic layer 33 is white light. Specifically, as described above, the organic layer has a structure in which three layers of a red light emitting layer that emits red light, a green light emitting layer that emits green light, and a blue light emitting layer that emits blue light are laminated. The organic layer can have a structure in which two layers of a blue light emitting layer that emits blue light and a yellow light emitting layer that emits yellow light are laminated, and can have a structure in which two layers of a blue light emitting layer that emits blue light and an orange light emitting layer that emits orange light are laminated.

The hole injection layer is a layer that enhances hole injection efficiency and also functions as a buffer layer that prevents a leakage, and a thickness of the hole injection layer is, for example, about 2 nm to 10 nm. The hole injection layer is formed of, for example, a hexaazatriphenylene derivative represented by the following Formula (A) or (B). Note that when an end surface of the hole injection layer is in contact with the second electrode, it is a main cause of a luminance variation between pixels, resulting in deterioration of display image quality.

(A)

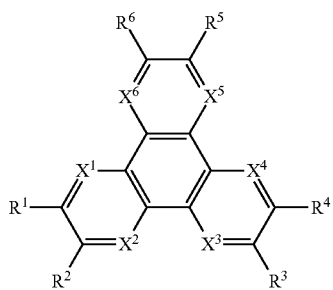

Here, $R^1$ to $R^6$ may be each independently a substituent selected from hydrogen, halogen, a hydroxy group, an amino group, an aryl amino group, a substituted or unsubstituted carbonyl group having 20 or fewer carbon atoms, a substituted or unsubstituted carbonyl ester group having 20 or fewer carbon atoms, a substituted or unsubstituted alkyl group having 20 or fewer carbon atoms, a substituted or unsubstituted alkenyl group having 20 or fewer carbon atoms, a substituted or unsubstituted alkoxy group having 20 or fewer carbon atoms, a substituted or unsubstituted aryl group having 30 or fewer carbon atoms, a substituted or unsubstituted heterocyclic group having 30 or fewer carbon atoms, a nitrile group, a cyano group, a nitro group, and a silyl group, and adjacent $R^m$'s (m=1 to 6) may be bonded to each other via a cyclic structure. In addition, $X^1$ to $X^6$ are each independently a carbon or nitrogen atom.

(B)

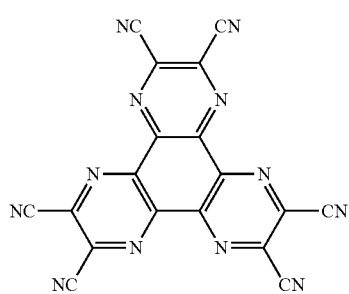

The hole transport layer is a layer that enhances hole transport efficiency to the light emitting layer. In the light emitting layer, when an electric field is applied, the electrons and the holes recombine, and thus, light is generated. The electron transport layer is a layer that enhances electron transport efficiency to the light emitting layer, and the electron injection layer is a layer that enhances electron injection efficiency to the light emitting layer.

The hole transport layer is formed of, for example, 4,4',4''-tris(3-methylphenylphenylamino)triphenylamine (m-MTDATA) having a thickness of about 40 nm or α-naphthylphenyldiamine (αNPD).

The light emitting layer is a light emitting layer that generates white light by color mixing, and for example, as described above, the light emitting layer is formed by laminating the red light emitting layer, the green light emitting layer, and the blue light emitting layer.

In the red light emitting layer, when an electric field is applied, some holes injected from the first electrode 31 and some electrons injected from the second electrode 32 recombine, and thus, red light is generated. Such a red light emitting layer contains, for example, at least one material of a red light emitting material, a hole transporting material, an electron transporting material, and a both charge transporting material. The red light emitting material may be a fluorescent material or a phosphorescent material. The red light emitting layer having a thickness of about 5 nm is formed, for example, by mixing 30% by mass of 2,6-bis[(4'-methoxydiphenylamino)styryl]-1,5-dicyanonaphthalene (BSN) with 4,4-bis(2,2-diphenylvinyl) biphenyl (DPVBi).

In the green light emitting layer, when an electric field is applied, some holes injected from the first electrode 31 and some electrons injected from the second electrode 32 recombine, and thus, green light is generated. Such a green light emitting layer contains, for example, at least one material of a green light emitting material, a hole transporting material, an electron transporting material, and a both charge transporting material. The green light emitting material may be a fluorescent material or a phosphorescent material. The green light emitting layer having a thickness of about 10 nm is formed, for example, by mixing 5% by mass of coumarin 6 with DPVBi.

In the blue light emitting layer, when an electric field is applied, some holes injected from the first electrode 31 and some electrons injected from the second electrode 32 recombine, and thus, blue light is generated. Such a blue light emitting layer contains, for example, at least one material of a blue light emitting material, a hole transporting material, an electron transporting material, and a both charge transporting material. The blue light emitting material may be a fluorescent material or a phosphorescent material. The blue light emitting layer having a thickness of about 30 nm is formed, for example, by mixing 2.5% by mass of 4,4'-bis[2-{4-(N,N-diphenylamino)phenyl}vinyl]biphenyl (DPAVBi) with DPVBi.

The electron transport layer having a thickness of about 20 nm is formed of, for example, 8-hydroxyquinoline aluminum (Alq3). The electron injection layer having a thickness of about 0.3 nm is formed of, for example, LiF, $Li_2O$, or the like.

However, the materials forming the respective layers are examples, and the present disclosure is not limited to these materials. When the light emitting layer is formed of a phosphorescent material, the luminance can be improved by about 2.5 times to 3 times as compared with a case where the light emitting layer is formed of a fluorescent material. In addition, the light emitting layer can be formed of a material of thermally activated delayed fluorescence (TADF). In addition, for example, the light emitting layer may include a blue light emitting layer and a yellow light emitting layer, or may include a blue light emitting layer and an orange light emitting layer.

The light emitting element 12 has a resonator structure having the organic layer 33 as a resonance unit. In order to appropriately adjust a distance from the light emitting surface to the reflective surface (specifically, a distance from the light emitting surface to the first electrode 31 and the second electrode 32), a thickness of the organic layer 33 is preferably $8 \times 10^{-8}$ m or more and $5 \times 10^{-7}$ m or less and more preferably $1.5 \times 10^{-7}$ m or more and $3.5 \times 10^{-7}$ m or less. In the organic EL display device having a resonator structure, actually, the red light emitting element 12R resonates the red light emitted in the light emitting layer to emit reddish light (light having a peak of an optical spectrum in a red region) from the second electrode 32. In addition, the green light emitting element 12G resonates the green light emitted in the light emitting layer to emit greenish light (light having a peak of an optical spectrum in a green region) from the second electrode 32. Further, the blue light emitting element 12B resonates the blue light emitted in the light emitting layer to emit bluish light (light having a peak of an optical spectrum in a blue region) from the second electrode 32.

Hereinafter, the outline of a method for manufacturing the light emitting element 12 of the first embodiment illustrated in each of FIGS. 1 and 2 will be described.

[Step-100]

First, the drive circuit is formed on the silicon semiconductor substrate (first substrate 41) based a known MOSFET manufacturing process.

[Step-110]

Next, the lower interlayer insulating layer 26A is formed on the entire surface based on a CVD method. Then, a connection hole is formed in the portion of the lower interlayer insulating layer 26A disposed above one source/drain region 24 of the transistor 20 based on a photolithography technique and an etching technique, a metal layer is formed on the lower interlayer insulating layer 26A having the connection hole based on, for example, a sputtering method, and further, the metal layer is patterned based on the photolithography technique and the etching technique, such that the contact hole (contact plug) 27A and the pad portion 27C can be formed, and a wiring (not illustrated) connecting the pad portion 27C and the pad portion can be formed.

[Step-120]

Then, the upper interlayer insulating layer 26B is formed on the entire surface, a connection hole is formed in the portion of the upper interlayer insulating layer 26B disposed above a desired pad portion 27C based on the photolithography technique and the etching technique, a metal layer is formed on the upper interlayer insulating layer 26B having the connection hole based on, for example, the sputtering method, and then, the metal layer is patterned based on the photolithography technique and the etching technique, such that the first electrode 31 can be formed on a part of the substrate 26. The first electrode 31 is separated for each light emitting element. At the same time, the contact hole (contact plug) 27B for electrically connecting the first electrode 31 and the transistor 20 can be formed in the connection hole.

[Step-130]

Next, after an insulating layer 28 is formed on the entire surface based on, for example, a CVD method, the insulating layer 28 is left on the substrate 26 between the first electrode 31 and the first electrode 31 based on the photolithography technique and the etching technique.

[Step-140]

Thereafter, the organic layer 33 is formed on the first electrode 31 and the insulating layer 28 by, for example, a PVD method such as a vacuum vapor deposition method or a sputtering method, a coating method such as a spin coating method or a die coating method, or the like. In some cases, the organic layer 33 may be patterned into a desired shape.

[Step-150]

Next, the second electrode 32 is formed on the entire surface based on, for example, a vacuum vapor deposition method or the like. In some cases, the second electrode 32 may be patterned into a desired shape. In this way, the organic layer 33 and the second electrode 32 can be formed on the first electrode 31.

[Step-160]

Thereafter, after the protective layer 34 is formed on the entire surface based on a coating method, a top surface of the protective layer 34 is subjected to a planarization treatment. Since the protective layer 34 can be formed based on the coating method, restriction on the processing process can be small, a material selection range can be wide, and a material having a high refractive index can be used. Thereafter, the color filter layers CF ($CF_R$, $CF_G$, and $CF_B$) are formed on the protective layer 34 by a known method.

[Step-170]

Then, the planarization layer 35 is formed on the color filter layers CF. Thereafter, the planarization layer 35 and the second substrate 42 are bonded to each other by the sealing resin layer 36 formed of an acrylic adhesive. Therefore, the light emitting element (organic EL element) 12 and the display device of the first embodiment illustrated in each of FIGS. 1 and 2 can be obtained. As such, a so-called OCCF type in which the color filter layers CF are provided on the first substrate side instead of providing the color filter layers CF on the second substrate side, such that a distance between the organic layer 33 and the color filter layer CF can be shortened.

In the display device of the first embodiment, the second drive circuit and the third drive circuit for driving the second light emitting element and the third light emitting element are thinned out. Therefore, it is possible to achieve a reduction in total number of drive circuits with respect to a total number of light emitting elements. That is, a large number of light emitting elements can be arranged without reducing a formation pitch of the drive circuit, and the definition of the light emitting element can be improved. Alternatively, a density of the drive circuits can be reduced. Therefore, a manufacturing yield of the display device can be improved, the image quality can be improved, and a manufacturing cost can be reduced. Furthermore, since the configuration and structure of the light emitting element group can be the same as the configuration and structure of the display device according to the related art, the design, manufacture, and the like of the display device are not required to be significantly changed from those of the display device according to the related art, and the light emitting element group can be applied regardless of the disposition and arrangement of the light emitting element groups. In addition, it is possible to combine the light emitting element group and the drive circuit with a high degree of freedom. Note that the green color has visibility higher than that of the red color or the blue color. Therefore, in one light emitting element group, even when two green light emitting elements are independently driven, two red light emitting elements are driven based on the averaged data signal, and two blue light emitting elements are driven based on the averaged data signal, there is no particular problem with the image quality of the image displayed on the display device.

Figure 20:
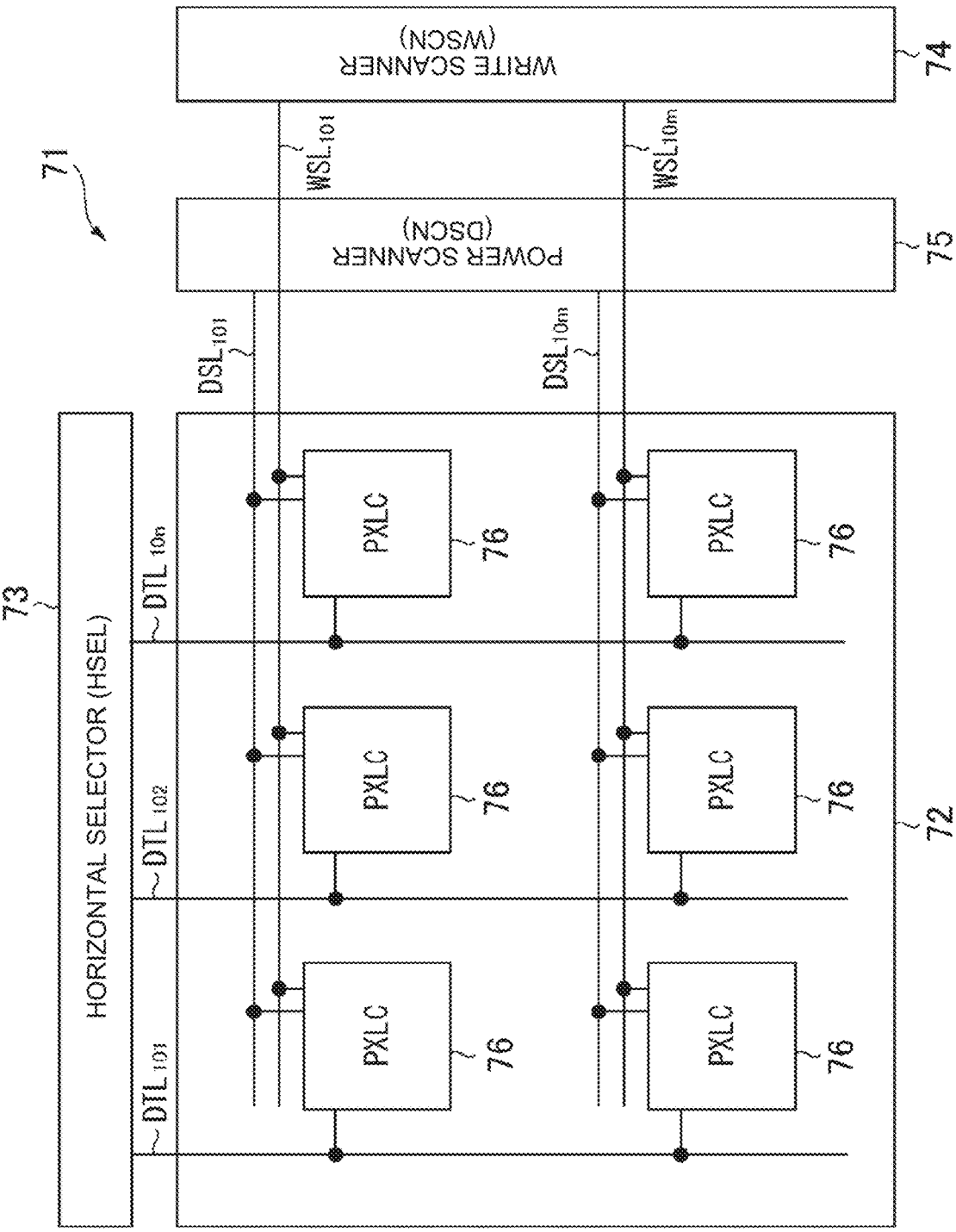
FIG. 20 is a block diagram illustrating the entire circuit configuration of the display device of the present disclosure.
Figure 21:
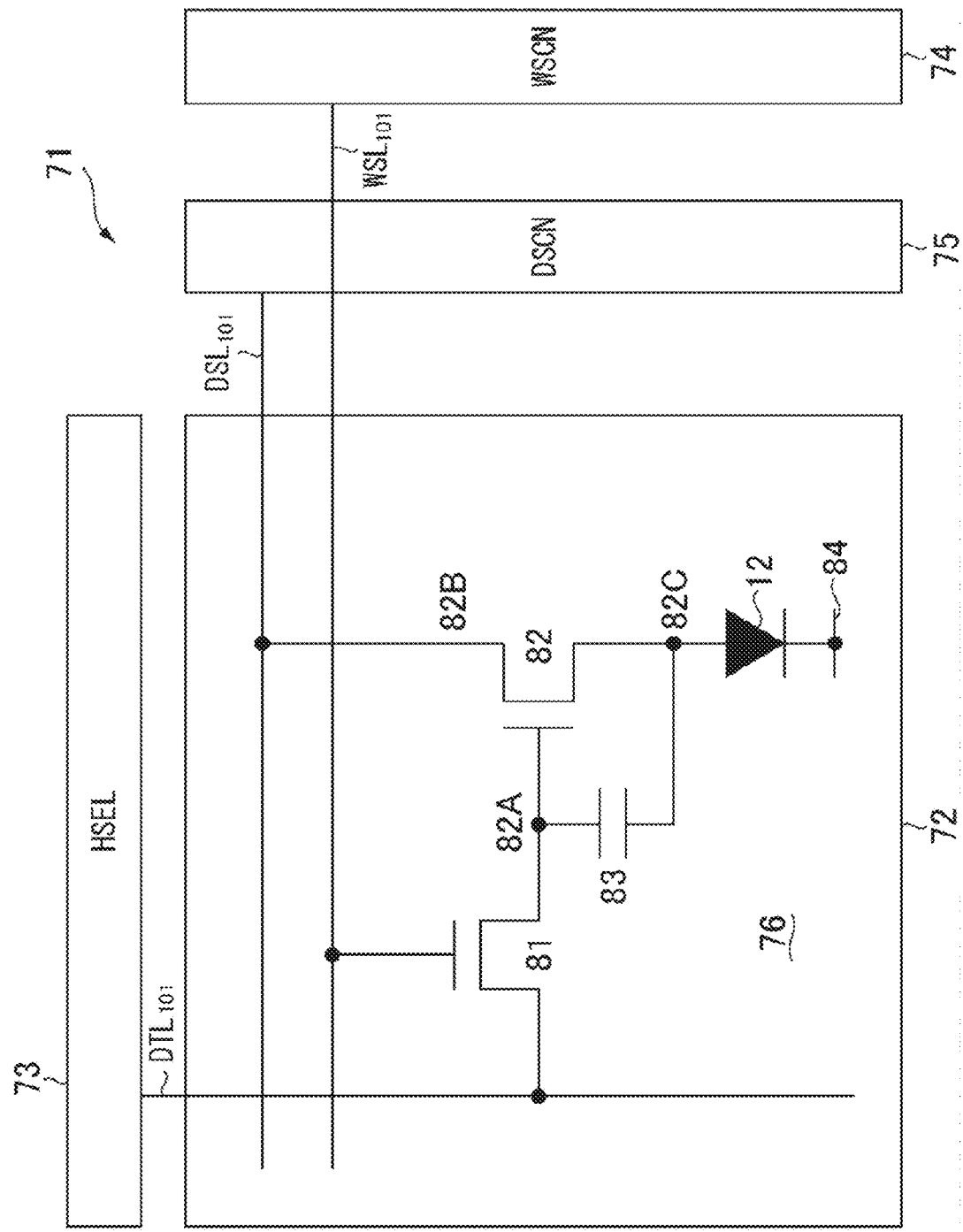
FIG. 21 is an equivalent circuit diagram of a light emitting element and a drive circuit included in the display device illustrated in FIG. 20.
Figure 22:
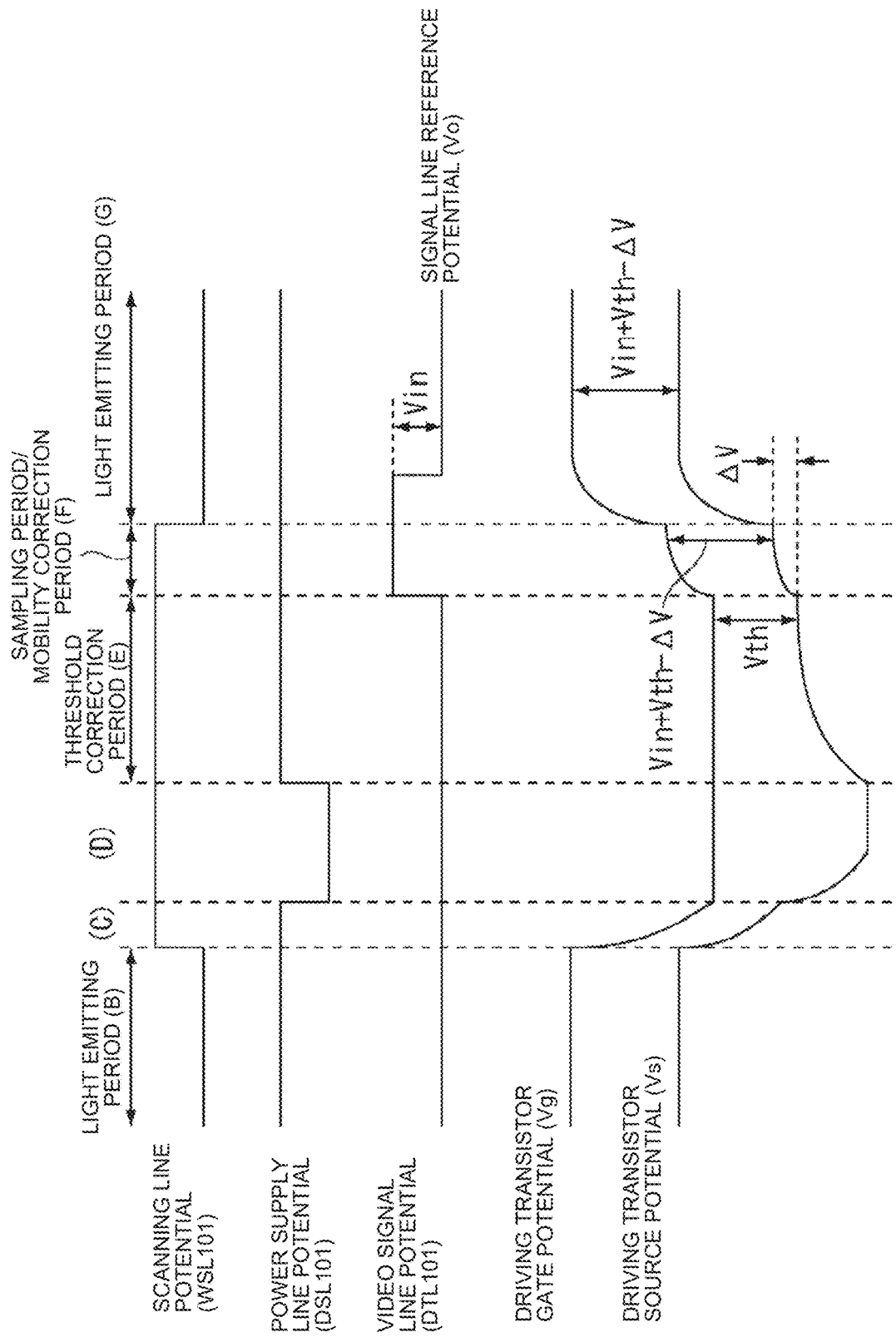
FIG. 22 is a timing chart used for describing an operation of the light emitting element and the drive circuit illustrated in FIG. 21.

Hereinafter, the drive unit will be described. A block diagram illustrating the entire circuit configuration of the display device in each of the first to sixth embodiments is illustrated in FIG. 20, an equivalent circuit diagram of the light emitting element and the drive circuit included in the display device illustrated in FIG. 20 is illustrated in FIG. 21, and a timing chart used for describing an operation of a sub-pixel 76 illustrated in FIG. 21 is illustrated in FIG. 22.

A display device 71 includes a pixel array unit 72 and drive units (73, 74, and 75) that drive the pixel array unit 72.

The pixel array unit 72 includes:
scanning lines $WSL_{101}$ and $WSL_{10m}$ extending in a first direction;
signal lines (SL) $DTL_{101}$ to $DTL_{10n}$ extending in a second direction;
sub-pixels (PXLC) 76 arranged in a region in which the scanning lines and the signal lines intersect with each other; and power lines $DSL_{101}$ and $DSL_{10m}$ arranged corresponding to the sub-pixels 76 arranged in the first direction.

Each of the drive units (73, 74, and 75) includes:

a write scanner (main scanner WSCN) 74 that sequentially supplies a control signal to each of the scanning lines $WSL_{101}$ and $WSL_{10m}$ and performs line-sequential scanning of the sub-pixels 76 by a line unit;

a power scanner (DSCN) 75 that supplies a voltage that switches between a first potential and a second potential for each of the power lines $DSL_{101}$ and $DSL_{10m}$ in accordance with the line-sequential scanning; and a horizontal selector (signal selector HSEL) 73 that supplies a signal potential (data signal) and a reference potential as image signals to the signal lines $DTL_{101}$ to $DTL_{10n}$ extending in the second direction in accordance with the line-sequential scanning.

The sub-pixel 76 includes a light emitting element 12 represented by an organic EL element, a sampling transistor 81, a driving transistor 82, and a storage capacitor 83.

A gate portion of the sampling transistor 81 is connected to the scanning line $WSL_{101}$, one source/drain region is connected to the signal line $DTL_{101}$, and the other source/drain region is connected to a gate portion 82A of the driving transistor 82. One source/drain region 82C of the driving transistor 82 is connected to the light emitting element 12, and the other source/drain region 82B is connected to the power line $DSL_{101}$. The second electrode 32 of the light emitting element 12 is connected to a ground wiring 84. The ground wiring 84 is commonly wired to all the sub-pixels 76. One end of the storage capacitor 83 is connected to one source/drain region 82C of the driving transistor 82, and the other end is connected to the gate portion 82A of the driving transistor 82.

The sampling transistor 81 conducts in response to a control signal supplied from the scanning line $WSL_{101}$, samples a signal potential supplied from the signal line $DTL_{101}$, and stores the signal potential in the storage capacitor 83. The driving transistor 82 receives a current supplied from the power line $DSL_{101}$ at the first potential, and allows the drive current to flow to the light emitting element 12 according to the signal potential stored in the storage capacitor 83. The power scanner (DSCN) 75 switches the power line $DSL_{101}$ between the first potential and the second potential while the horizontal selector (HSEL) 73 supplies the reference potential to the signal line $DTL_{101}$ after the sampling transistor 81 conducts, such that a voltage corresponding to a threshold voltage $V_{th}$ of the driving transistor 82 is stored in the storage capacitor 83. By such a threshold voltage correction function, the display device 71 can cancel the influence of the threshold voltage of the driving transistor 82 that varies for each of the sub-pixels.

The sub-pixel 76 illustrated in FIG. 21 has a mobility correction function in addition to the threshold voltage correction function described above. That is, the horizontal selector (HSEL) 73 switches the signal line $DTL_{101}$ from the reference potential to the signal potential at a first timing after the sampling transistor 81 conducts, and the write scanner (WSCN) 74 releases the application of the control signal to the scanning line $WSL_{101}$ at a second timing after the first timing to allow the sampling transistor 81 to be in a non-conduction state and appropriately set a period between the first timing and the second timing, such that when the signal potential is stored in the storage capacitor 83, a correction for a mobility u of the driving transistor 82 is applied to the signal potential. In this case, the drive unit (73, 74, or 75) can adjust a relative phase difference between the image signal supplied by the horizontal selector 73 and the control signal supplied by the write scanner 74 to optimize the period between the first timing and the second timing (mobility correction period). In addition, the horizontal selector 73 applies a gradient to the rise of the image signal that switches from the reference potential to the signal potential, such that the mobility correction period between the first timing and the second timing can be automatically followed to the signal potential.

Further, the sub-pixel 76 has a bootstrap function. That is, the write scanner (WSCN) 74 releases the application of the control signal to the scanning line $WSL_{101}$ at the stage where the signal potential is stored in the storage capacitor 83 to allow the sampling transistor 81 to be in a non-conduction state and electrically separate the gate portion 82A of the driving transistor 82 from the signal line $DTL_{101}$, such that a gate potential $V_g$ can be in association with a variation of a source potential $V_s$ of the driving transistor 82, and a gate-source voltage $V_{gs}$ can be constantly maintained.

FIG. 22 is a timing chart used for describing an operation of the sub-pixel 76 illustrated in FIG. 21. A change in potential of the scanning line ($WSL_{101}$), a change in potential of the power line ($DSL_{101}$), and a change in potential of the signal line ($DTL_{101}$) are illustrated together with the time axis. In addition, changes in gate potential $V_g$ and source potential $V_s$ of the driving transistor 82 are illustrated together with these changes in potentials.

In the timing chart, the period is conveniently divided as illustrated in (B) to (G) according to the transition of the operation of the sub-pixel 76. In the light emitting period (B), the light emitting element 12 is in a light emitting state. After the light emitting period (B), a new field of the line-sequence scanning is entered, and first, in the first period (C), the gate potential $V_g$ of the driving transistor 82 is initialized. Proceeding to the next period (D), the source potential $V_s$ of the driving transistor 82 is also initialized. The gate potential $V_g$ and the source potential $V_s$ of the driving transistor 82 are initialized, such that preparation of a threshold voltage correction operation is completed. Subsequently, the threshold voltage correction operation is actually performed during the threshold voltage correction period (E), and a voltage corresponding to the threshold voltage $V_{th}$ is stored between the gate portion 82A and one source/drain region 82C of the driving transistor 82. Actually, the voltage corresponding to the threshold voltage $V_{th}$ is written to the storage capacitor 83 connected between the gate portion 82A and one source/drain region 82C of the driving transistor 82. Thereafter, proceeding to the sampling period/mobility correction period (F), a signal potential $V_{in}$ of the image signal is written to the storage capacitor 83 in the form of being added to the threshold voltage $V_{th}$, and a voltage $\Delta V$ for mobility correction is subtracted from the voltage stored in the storage capacitor 83. Thereafter, proceeding to the light emitting period (G), and the light emitting element emits light with luminance corresponding to the signal potential $V_{in}$. In this case, since the signal potential $V_{in}$ is adjusted by the voltage corresponding to the threshold voltage $V_{th}$ and the voltage $\Delta V$ for mobility correction, the light emission luminance of the light emitting element 12 is not affected by variations in the threshold voltage $V_{th}$ and the mobility μ of the driving transistor 82. Note that the bootstrap operation is performed at the beginning of the light emitting period (G), and the gate potential $V_g$ and the source potential $V_s$ of the driving transistor 82 are increased while the gate-source voltage $V_{gs}$ (=$V_{in}+V_{th}-\Delta V$) of the driving transistor 82 is constantly maintained.

Although the example in which the drive circuit includes two transistors has been described above, the drive circuit can include a known circuit configuration in which three transistors, four transistors, five transistors, six transistors, and the like are included. In addition, in each of the drive circuits of the first light emitting element, the second light emitting element, and the third light emitting element, various transistors, the constants and specifications of the storage capacitors may be the same as each other or may be changed for each light emitting element.

Second Embodiment

The second embodiment relates to a modification of the first embodiment and a display device of a second form. A schematic partial plan view of a light emitting element group in the display device of the second embodiment is illustrated in FIG. 4A, a schematic view of an arrangement of drive circuits is illustrated in each of FIGS. 4B and 4C, and a schematic view of an arrangement of drive circuits and signal lines is illustrated in each of FIGS. 5, 6A, and 6B. Note that arrangements of second drive circuits and third drive circuits in a second direction are different in FIGS. 4B and 4C.

The display device of the second embodiment further includes first signal lines extending in a second direction, second signal lines extending in the second direction, and third signal lines extending in the second direction, and
    in each of light emitting element groups 10, light emitting element units 11 are arranged in the second direction, first drive circuits $DR_{G1}$ and $DR_{G2}$, second drive circuits $DR_{R12}$, and third drive circuits $DR_{B12}$ are arranged in the second direction,
    all of the first drive circuits $DR_{G1}$ and $DR_{G2}$ are connected to one shared first signal line $SL_{G12}$, and
    the second drive circuits $DR_{R12}$ and the third drive circuits $DR_{B12}$ are connected to one shared second signal line $SL_{R-B12}$.

In general, for an observer observing the display device, visibility in a horizontal direction of the display device is high. In the display device of the second embodiment, second light emitting elements and third light emitting elements are arranged in a horizontal direction (the first direction in the illustrated example) in the same manner as that of the display device according to the related art, and two light emitting elements display images with the same luminance in a vertical direction (the second direction in the illustrated example). On the other hand, in the display device of the first embodiment, the second light emitting elements and the third light emitting elements are arranged in the vertical direction (the second direction in the illustrated example) in the same manner as that of the display device according to the related art, and two light emitting elements display images with the same luminance in the horizontal direction (the first direction in the illustrated example). Therefore, the display device of the second embodiment can display a higher quality image for the observer than the display device of the first embodiment. However, regarding the signal line, the display device of the first embodiment can be simplified as compared with the display device of the second embodiment. Therefore, in consideration of these characteristics, it may be determined whether to adopt the display device of the first embodiment or the display device of the second embodiment.

A modified example of the arrangement of the drive circuits and the signal lines in the display device of the second embodiment is schematically illustrated in each of FIGS. 6A and 6B. In the example illustrated in FIG. 5, the second drive circuit $DR_{R12}$ and the third drive circuit $DR_{B12}$ are connected to one shared second signal line $SL_{R-B12}$. On the other hand, in the example illustrated in each of FIGS. 6A and 6B, the second drive circuit $DR_{R12}$ is connected to one second signal line $SL_{R12}$, and the third drive circuit $DR_{B12}$ is connected to one third signal line $SL_{B12}$. The arrangement relationships of the second signal lines $SL_{R12}$ and the third signal lines $SL_{B12}$ are different in FIGS. 6A and 6B.

Since the configuration and structure of the display device of the second embodiment can be the same as the configuration and structure of the display device of the first embodiment except for the above points, a detailed description will be omitted.

Third Embodiment

A third embodiment is a modification of the first embodiment. A schematic partial plan view of a light emitting element group in a display device of the third embodiment is illustrated in FIG. 7A, and an arrangement of drive circuits are schematically illustrated in each of FIGS. 7B, 7C, and 7D. In a display device of a first form of the third embodiment, in each of light emitting element units, an arrangement of first light emitting elements $12G_1$ and $12G_2$, second light emitting elements $12R_1$ and $12R_2$, and third light emitting elements $12B_1$ and $12B_2$ is a striped arrangement. An arrangement of drive circuits $DR_{G1}$, $DR_{G2}$, $DR_{R12}$, and $DR_{B12}$ illustrated in FIG. 7B is the same as in the display device of the first embodiment illustrated in FIG. 1B, and an arrangement of the drive circuits $DR_{G1}$, $DR_{G2}$, $DR_{R12}$, and $DR_{B12}$ illustrated in each of FIGS. 7C and 7D is substantially the same as in the display device of the second embodiment illustrated in each of FIGS. 4B and 4C.

Since the configuration and structure of the display device of the third embodiment can be the same as the configuration and structure of the display device of the first embodiment except for the above points, a detailed description will be omitted.

Fourth Embodiment

A fourth embodiment is a modification of each of the first to third embodiments. A schematic partial plan view of a light emitting element group 10 in a display device of the fourth embodiment is illustrated in FIG. 8A, and an arrangement of drive circuits is schematically illustrated in FIG. 8B. In the display device of a first form of the fourth embodiment, in each of the light emitting element groups 10, $$M_1 = M_2 = M_3 = 4,$$
$$N_1 = 4,$$
$$N_2 = 2, \text{ and}$$
$$N_3 = 1,$$

in which the number of first light emitting elements 12G is $M_1$, the number of second light emitting elements 12R is $M_2$, the number of third light emitting elements 12B is $M_3$, the number of first drive circuits is $N_1$, the number of second drive circuits is $N_2$, and the number of third drive circuits is $N_3$. Here, $$N_1 = SL_1 = 4,$$
$$N_2 = SL_2 = 2, \text{ and}$$
$$N_3 = SL_3 = 1,$$

in which the number of first signal lines is $SL_1$, the number of second signal lines is $SL_2$, and the number of third signal lines is $SL_3$.

That is, the light emitting element group (one pixel) of the fourth embodiment includes four light emitting element units (sub-pixels). Specifically,
a first light emitting element unit $11_1$ includes light emitting elements $12G_1$, $12R_1$, and $12B_1$,
a second light emitting element unit $11_2$ includes light emitting elements $12G_2$, $12R_2$, and $12B_2$,
a third light emitting element unit $11_3$ includes light emitting elements $12G_3$, $12R_3$, and $12B_3$, and
a fourth light emitting element unit $11_4$ includes light emitting elements $12G_4$, $12R_4$, and $12B_4$.

Even in the display device of the fourth embodiment, in each of the light emitting element units 11, the arrangement of the first light emitting elements 12G, the second light emitting elements 12R, and the third light emitting elements 12B is a delta arrangement.

The display device of the fourth embodiment includes first signal lines $SL_1$ extending in a second direction, second signal lines $SL_2$ extending in the second direction, and third signal lines $SL_3$ extending in the second direction,
in each of light emitting element groups 10, light emitting element units 11 are arranged in a first direction,
first drive circuits $DR_{G1}$, $DR_{G2}$, $DR_{G3}$, and $DR_{G4}$, and second drive circuits $DR_{R12}$ and $DR_{R34}$, and third drive circuits $DR_{B1234}$ are arranged in the first direction,
the first drive circuit $DR_{G1}$ is connected to the first signal line $SL_1$,
the first drive circuit $DR_{G2}$ is connected to the first signal line $SL_2$,
the first drive circuit $DR_{G3}$ is connected to the first signal line $SL_3$,
the first drive circuit $DR_{G4}$ is connected to the first signal line $SL_4$,
the second drive circuit $DR_{R12}$ is connected to the second signal line (shared with the first signal line $SL_1$),
the second drive circuit $DR_{R34}$ is connected to the second signal line (shared with the first signal line $SL_3$), and
the third drive circuit $DR_{B1234}$ is connected to the third signal line (shared with the first signal line $SL_2$).

Note that the first signal line $SL_{G4}$ is shared with the first signal line $SL_{G4}$ to which the first drive circuit $DR_{G4}$ included in the adjacent light emitting element group is connected.

A signal obtained by calculating a gray scale mean of signals for each of two second light emitting elements $12R_1$ and $12R_2$ is supplied to the second drive circuit $DR_{R12}$,
a signal obtained by calculating a gray scale mean of signals for each of two second light emitting elements $12R_3$ and $12R_4$ is supplied to the second drive circuit $DR_{R34}$, and
a signal obtained by calculating a gray scale mean of signals for each of four third light emitting elements $12B_1$, $12B_2$, $12B_3$, and $12B_4$ is supplied to the third drive circuit $DR_{B1234}$.

Specifically,
from a horizontal selector,
a data signal that controls luminance of the first light emitting element $12G_1$ is sent to the first drive circuit $DR_{G1}$ via the first signal line $SL_1$, and the luminance of the first light emitting element $12G_1$ is controlled,
a data signal that controls luminance of the first light emitting element $12G_2$ is sent to the first drive circuit $DR_{G2}$ via the first signal line $SL_2$, and the luminance of the first light emitting element $12G_2$ is controlled,
a data signal that controls luminance of the first light emitting element $12G_3$ is sent to the first drive circuit $DR_{G3}$ via the first signal line $SL_3$, and the luminance of the first light emitting element $12G_3$ is controlled, and
a data signal that controls luminance of the first light emitting element $12G_4$ is sent to the first drive circuit $DR_{G4}$ via the first signal line $SL_4$, and the luminance of the first light emitting element $12G_4$ is controlled.

In addition, in the horizontal selector,
a data signal $DT_{R1}$ that controls luminance of the second light emitting element $12R_1$ and a data signal $DT_{R2}$ that controls luminance of the second light emitting element $12R_2$ are obtained based on a gray scale mean $T_{R12}$ in the same manner as described above, the data signal $DT_{R1}$ and the data signal $DT_{R2}$ are sent to the second drive circuit $DR_{R12}$ via the second signal line, and the luminance of each of the second light emitting elements $12R_1$ and $12R_2$ are controlled, and
a data signal $DT_{R3}$ that controls luminance of the second light emitting element $12R_3$ and a data signal $DT_{R4}$ that controls luminance of the second light emitting element $12R_4$ are obtained based on a gray scale mean $T_{R34}$ in the same manner as described above, the data signal $DT_{R3}$ and the data signal $DT_{R4}$ are sent to the second drive circuit $DR_{R34}$ via the second signal line, and the luminance of each of the second light emitting elements $12R_3$ and $12R_4$ are controlled.

Further, in the horizontal selector, the data signal $DT_{B1}$ that controls luminance of the third light emitting element $12B_1$, the data signal $DT_{B2}$ that controls luminance of the third light emitting element $12B_2$, the data signal $DT_{B3}$ that controls luminance of the third light emitting element $12B_3$, and the data signal $DT_{B4}$ that controls luminance of the third light emitting element $12B_4$ are obtained based on a gray scale mean $T_{B1234}$ in the same manner as described above, these data signals are sent to the third drive circuit $DR_{B1234}$ via the third signal line, and the luminance of each of the third light emitting elements $12B_1$, $12B_2$, $12B_3$, and $12B_4$ are controlled.

Since the configuration and structure of the display device of the fourth embodiment can be the same as the configuration and structure of the display device of the first embodiment except for the above points, a detailed description will be omitted. Note that the arrangement of the light emitting elements can be a striped arrangement, and the display device can be the display device of the second form.

Fifth Embodiment

A fifth embodiment is also a modification of each of the first to third embodiments. A schematic partial plan view of a light emitting element group in a display device of a first form of the fifth embodiment is illustrated in FIG. 9A, and an arrangement of drive circuits is schematically illustrated in FIG. 9B.

In a display device of the fifth embodiment (the display device of the first form), each of light emitting element units 11 further includes one fourth light emitting element $12W_1$ and $12W_2$ that emits a fourth color, each of light emitting element groups 10 further includes fourth drive circuits $DR_{W1}$ and $DR_{W2}$ that drive the fourth light emitting elements $12W_1$ and $12W_2$, and in each of the light emitting element groups 10, the number of fourth drive circuits $DR_{W1}$ and $DR_{W2}$ is equal to or less than the number of fourth light emitting elements $12W_1$ and $12W_2$. Specifically, they are equal to each other in the fifth embodiment. The first color can be green, the second color can be red, the third color can be blue, and the fourth color can be white.

A schematic partial plan view of the light emitting element group in the display device of a modified example of the fifth embodiment (the display device of the second form) is illustrated in FIG. 10A, and an arrangement of drive circuits is schematically illustrated in FIG. 10B.

Since the configuration and structure of the display device of the fifth embodiment can be the same as the configuration and structure of the display device of the first or second embodiment except for the above points, a detailed description will be omitted. Note that the arrangement of the light emitting elements can be a striped arrangement, and the display device can be the display device of the second form.

Sixth Embodiment

Figure 15:
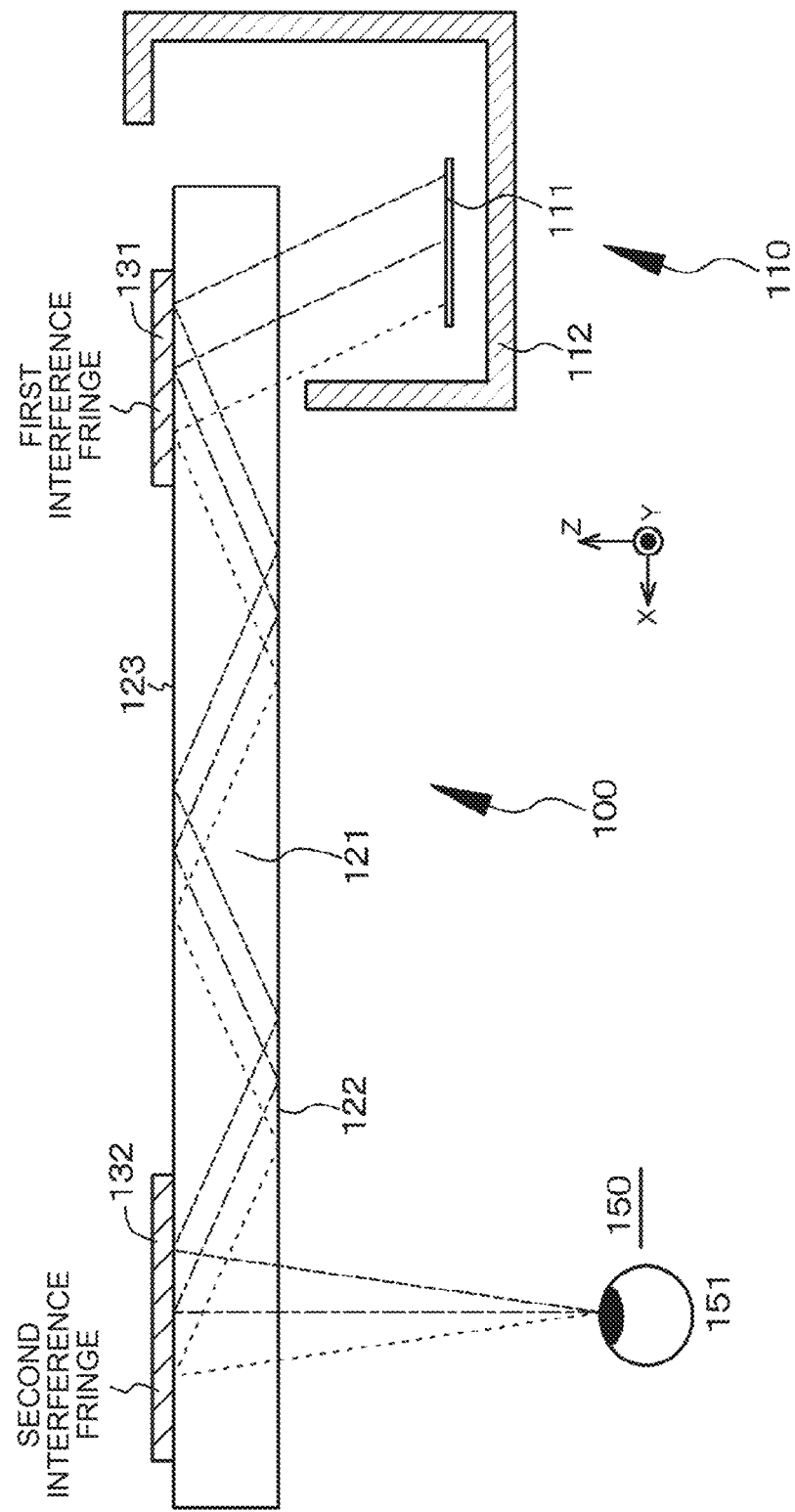
FIG. 15 is a conceptual view of an image display device implementing a head-mounted display of a sixth embodiment.
Figure 16:
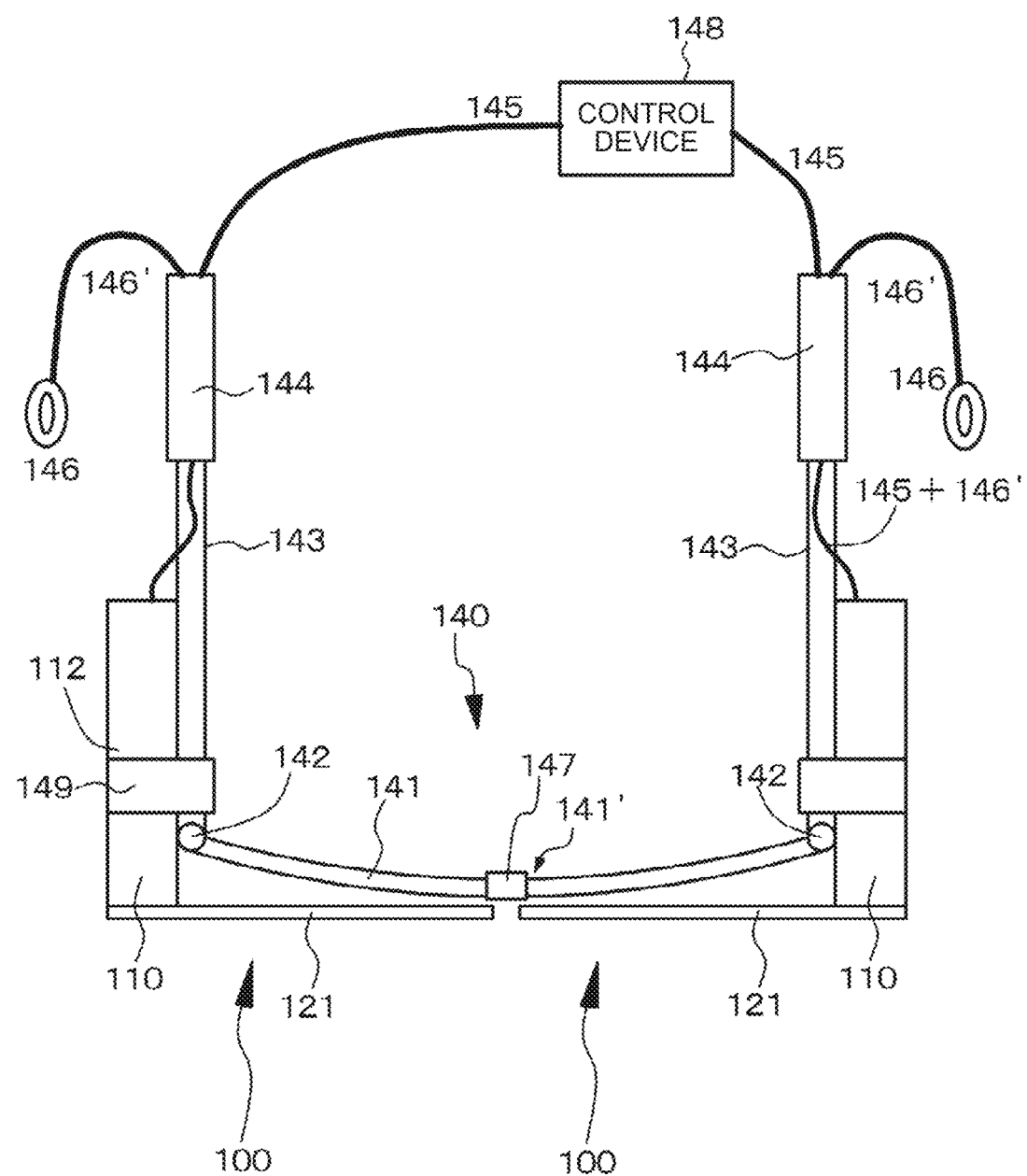
FIG. 16 is a schematic view of the head-mounted display of the sixth embodiment when viewed from above.
Figure 17:
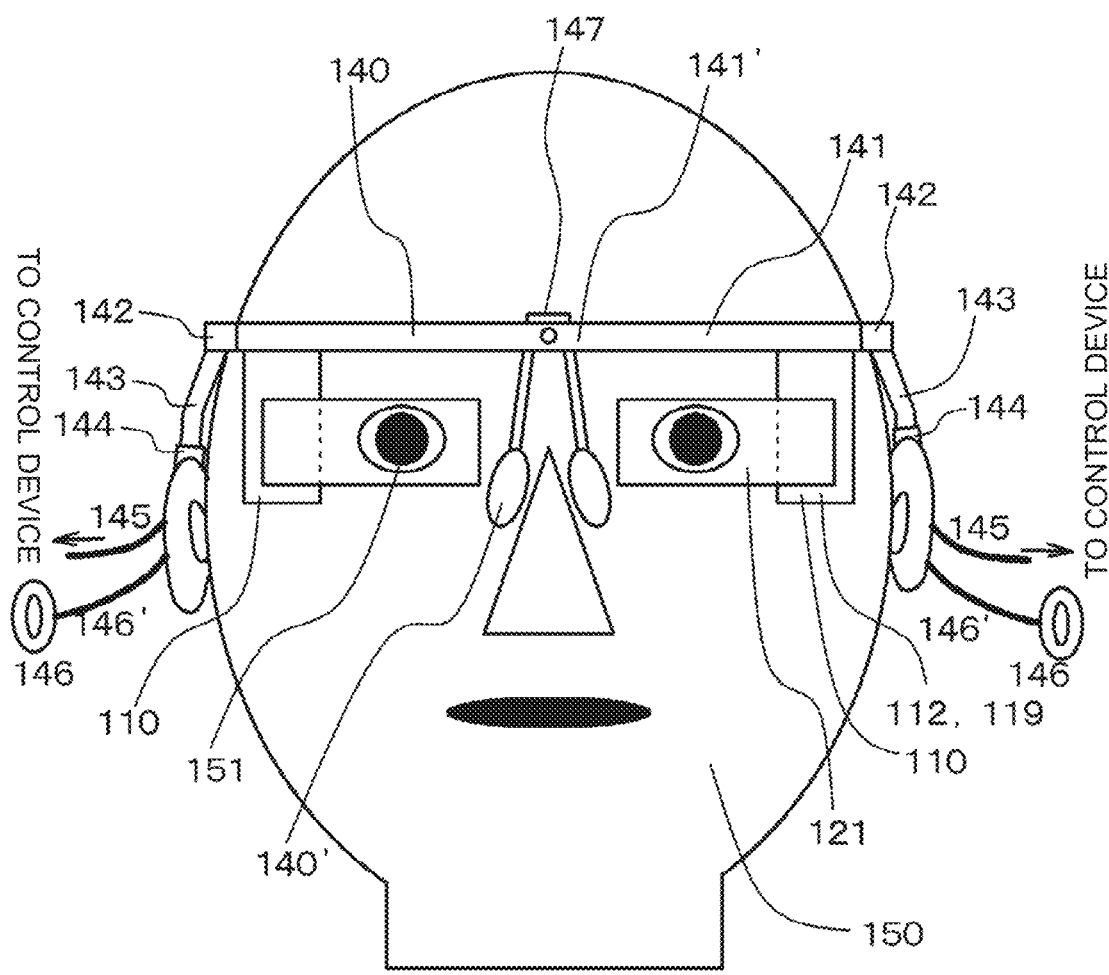
FIG. 17 is a schematic view of the head-mounted display of the sixth embodiment when viewed from the front.
Figure 18A:
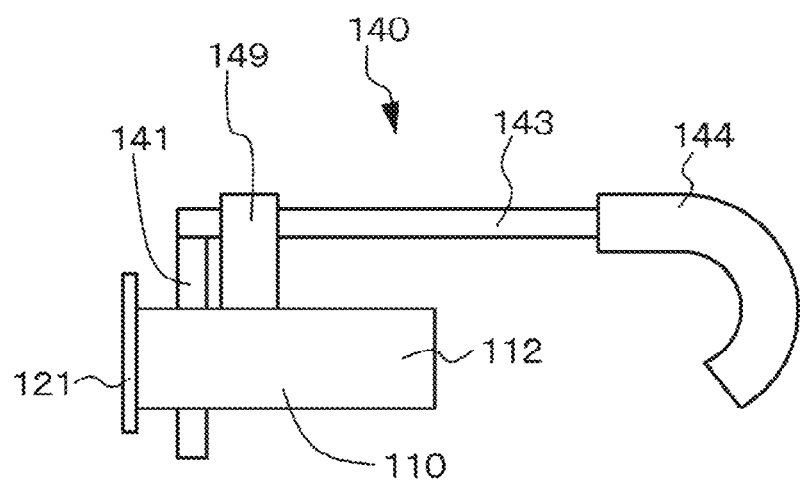
FIGS. 18A and 18B are a schematic view of the head-mounted display of the sixth embodiment when viewed from the side, and a schematic cross-sectional view obtained by enlarging a part of a reflective volume hologram diffraction grating in the head-mounted display of the fifth embodiment.
Figure 18B:
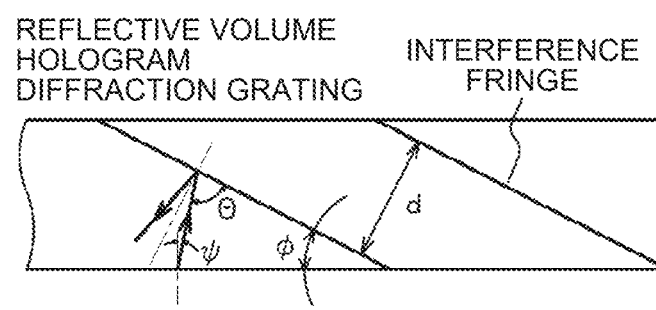

In a sixth embodiment, the display device described in each of the first to fifth embodiments is applied to a head-mounted display (HMD). A conceptual view of an image display device implementing the head-mounted display of the sixth embodiment is illustrated in FIG. 15, a schematic view of the head-mounted display of the sixth embodiment when viewed from above is illustrated in FIG. 16, a schematic view of the head-mounted display of the sixth embodiment when viewed from the front is illustrated in FIG. 17, and a schematic view of the head-mounted display of the sixth embodiment when viewed from the side is illustrated in FIG. 18A. In addition, a schematic cross-sectional view obtained by enlarging a part of a reflective volume hologram diffraction grating in the display device of the sixth embodiment is illustrated in FIG. 18B.

An image display device 100 of the sixth embodiment includes:

an image forming device 110 implemented by a display device 111 described in each of the first to fifth embodiments;

a light guide plate 121;

first deflection means 131 attached to the light guide plate 121; and second deflection means 132 attached to the light guide plate 121. The light from the image forming device 110 is deflected (or reflected) by the first deflection means 131, propagates inside the light guide plate 121 by total reflection, is deflected in the second deflection means 132, and is emitted toward a pupil 151 of an observer 150.

A system including the light guide plate 121 and the second deflection means 132 is a semi-transparent type (see-through type) system.

The head-mounted display of the sixth embodiment includes:

(A) a frame 140 (for example, a spectacle type frame 140) mounted on a head of an observer 150; and (B) the image display device 100 attached to the frame 140. Note that the head-mounted display of the sixth embodiment is specifically a binocular type display including two image display devices, and may be a monocular type display including one image display device. The image display device 100 may be fixedly attached to the frame 140, and may be detachably attached to the frame 140. The head-mounted display is, for example, a direct-drawing head-mounted display that draws an image directly on the pupil 151 of the observer 150.

The light guide plate 121 has a first surface 122 on which light from the image forming device 110 is incident and a second surface 123 facing the first surface 122. That is, the light guide plate 121 formed of optical glass or a plastic material has two parallel surfaces (the first surface 122 and the second surface 123) extending in parallel with a light propagation direction (x direction) by total reflection inside the light guide plate 121. The first surface 122 and the second surface 123 face each other. The first deflection means 131 is arranged on the second surface 123 of the light guide plate 121 (specifically, bonded together), and the second deflection means 132 is arranged on the second surface 123 of the light guide plate 121 (specifically, bonded together).

The first deflection means (first diffraction grating member) 131 is composed of a hologram diffraction grating, specifically, a reflective volume hologram diffraction grating, and the second deflection means (second diffraction grating member) 132 is also composed of a hologram diffraction grating, specifically, a reflective volume hologram diffraction grating. A first interference fringe is formed inside the hologram diffraction grating constituting the first deflection means 131, and a second interference fringe is formed inside the hologram diffraction grating constituting the second deflection means 132.

The first deflection means 131 diffracts and reflects light so that parallel light incident on the light guide plate 121 from the second surface 123 is totally reflected inside the light guide plate 121. The second deflection means 132 diffracts and reflects light propagated inside the light guide plate 121 by total reflection, and guides the light to the pupil 151 of the observer 150. The second deflection means 132 has a virtual image forming region in the light guide plate 121. The axes of the first deflection means 131 and the second deflection means 132 are parallel to an x direction, and the normal lines of the first deflection means 131 and the second deflection means 132 are parallel to a z direction. An interference fringe corresponding to one type of wavelength band (or wavelength) is formed on each of the reflective volume hologram diffraction gratings formed of a photopolymer material, and is prepared by a method according to the related art. Pitches of the interference fringes formed in the reflective volume hologram diffraction gratings are constant, and the interference fringes are linear and parallel in a y direction.

A schematic partial cross-sectional view obtained by enlarging a part of the reflective volume hologram diffraction grating is illustrated in FIG. 18B. An interference fringe having an inclination angle (slant angle) $\Phi$ is formed in the reflective volume hologram diffraction grating. Here, the inclination angle $\Phi$ refers to an angle formed by a surface of the reflective volume hologram diffraction grating and the interference fringe. The interference fringes are formed from the inside of the reflective volume hologram diffraction grating to the surface. The interference fringe satisfies the Bragg condition. Here, the Bragg condition refers to a condition satisfying the following Equation (A). In Equation (A), m represents a positive integer, λ represents a wavelength, d represents a pitch of a lattice plane (an interval in a normal line direction of a virtual plane including the interference fringe), and Θ represents a margin of an angle incident on the interference fringe. In addition, a relationship between Θ, the inclination angle Φ, and an incident angle Ψ when the light enters the diffraction grating member at the incident angle Ψ is represented by Equation (B).

$$m \cdot \lambda = 2 \cdot d \cdot \sin(\Theta) \quad (A)$$

$$\Theta = 90° - (\Phi + \Psi) \quad (B)$$

In the sixth embodiment, the display device 111 including the image forming device 110 is implemented by the display device of the first embodiment, but the present disclosure is not limited thereto. The entire image forming device 110 is housed in a housing 112. Note that an optical system through which an image transmitted from the display device 111 passes may be arranged in order to control a display dimension, a display position, and the like of the image transmitted from the display device 111. Any optical system is arranged depending on specifications required for the head-mounted display or the image forming device 110. For the head-mounted display or the image forming device in which the image is transmitted to both eyes from one display device 111, the display device of each of the first to fifth embodiments may be adopted.

The frame 140 has a front portion 141 arranged in front of the observer 150, two temple portions 143 rotatably attached to both ends of the front portion 141 via hinges 142, and ear bend portions (also referred to as tip cells, earmuffs, or ear pads) 144 mounted on a tip end of each of the temple portions 143. In addition, nose pads 140' are attached. That is, an assembly of the frame 140 and the nose pads 140' has basically substantially the same structure as that of common spectacles. Further, each housing 112 is attached to the temple portion 143 by an attachment member 149. The frame 140 is formed of a metal or plastic. Note that each housing 112 may be detachably attached to the temple portion 143 by the attachment member 149. In addition, for the observer who owns and wears spectacles, each housing 112 may be detachably attached to the temple portion 143 of the frame 140 of the spectacles owned by the observer by the attachment member 149. Each housing 112 may be attached to the outside of the temple portion 143 or may be attached to the inside of the temple portion 143. Alternatively, the light guide plate 121 may be fitted into a rim provided on the front portion 141.

Further, a wiring (a signal line, a power line, or the like) 145 extending from one image forming device 110 is connected to a control device (a control circuit or control means) 148 via the temple portion 143 and the inside of the ear bend portion 144 while being extended from a tip end of the ear bend portion 144 to the outside. Further, each of the image forming devices 110 includes a headphone portion 146, and a headphone portion wiring 146' extending from each of the image forming devices 110 extends toward the headphone portion 146 from the tip end of the ear bend portion 144 via the temple portion 143 and the inside of the ear bend portion 144. More specifically, the headphone portion wiring 146' extends toward the headphone portion 146 from the tip end of the ear bend portion 144 to wrap around the rear side of an auricle (pinna). With such a configuration, the head-mounted display can be neatly provided without giving an impression that the headphone portion 146 or the headphone portion wiring 146' is complicatedly arranged.

As described above, the wiring (the signal line, the power line, or the like) 145 is connected to the control device (the control circuit) 148, and the control device 148 performs processing for displaying an image. The control device 148 can include a known circuit.

A camera 147 including a solid-state image sensor that includes a CCD or CMOS sensor and lenses (not illustrated) is attached to the central portion 141' of the front portion 141 by an appropriate attachment member (not illustrated), if necessary. A signal from the camera 147 is sent to the control device (the control circuit) 148 via a wiring (not illustrated) extending from the camera 147.

In the image display device of the sixth embodiment, the light emitted from the display device 111 at a certain moment (for example, corresponding to the size of one pixel or one sub-pixel) is regarded as parallel light. The light reaches the pupil 151 (specifically, the crystalline lens) of the observer 150, and the light that has passed through the crystalline lens is finally focused on the retina of the pupil 151 of the observer 150.

Alternatively, the head-mounted display can be, for example, a retinal projection display based on Maxwell view, specifically, a retinal projection head-mounted display, that displays an image by directly projecting an image (luminous flux) on the retina of the observer.

Although the present disclosure has been described above based on the preferred embodiments, the present disclosure is not limited to these embodiments. The configurations and structures of the display device (organic EL display device) and the light emitting element (organic EL element) described in the embodiments are examples and can be appropriately changed, and the manufacturing method of the display device is also an example and can be appropriately changed. An example of the display device can include a liquid crystal display device in addition to the organic EL display device. In the embodiments, the drive circuit includes the MOSFET, but the drive circuit can also include a TFT. The first electrode or the second electrode may have a single layer structure or a multi-layer structure.

The size of the light emitting unit of the first light emitting element 12G may be larger than each of the size of the light emitting unit of the second light emitting element 12R and the size of the light emitting unit of the third light emitting element 12B. That is, the size of the light emitting region of the first light emitting element 12G may be larger than each of the size of the light emitting region of the second light emitting element 12R and the size of the light emitting region of the third light emitting element 12B.

Each of the light emitting elements can include the red light emitting element 12R in which the organic layer generates red light, the green light emitting element 12G in which the organic layer generates green light, and the blue light emitting element 12B in which the organic layer generates blue light, and these three types of light emitting elements can be combined into a light emitting element unit (one pixel). Note that in this case, the color filter layer may be omitted, and the color filter layer may be provided to improve the color purity.

As illustrated in FIG. 11 illustrating a schematic partial cross-sectional view of a display device of a first modified example of the first embodiment, a lens member (on-chip microlens) 50 through which light emitted from a light emitting unit 30 passes may be provided in a portion of a protective layer 34 above the light emitting unit 30.

In addition, as illustrated in FIG. 12 illustrating a schematic partial cross-sectional view of a display device of a second modified example of the first embodiment, color filter layers CF ($CF_R$, $CF_G$, and $CF_B$) may be provided on an inner surface of a second substrate 42 facing a first substrate 41. The color filter layers CF are bonded to a planarization layer 35 by a sealing resin layer 36 formed of an acrylic adhesive. The planarization layer 35 may be omitted, and the color filter layers CF and the protective layer 34 may be bonded to each other by the sealing resin layer 36.

Figure 13:
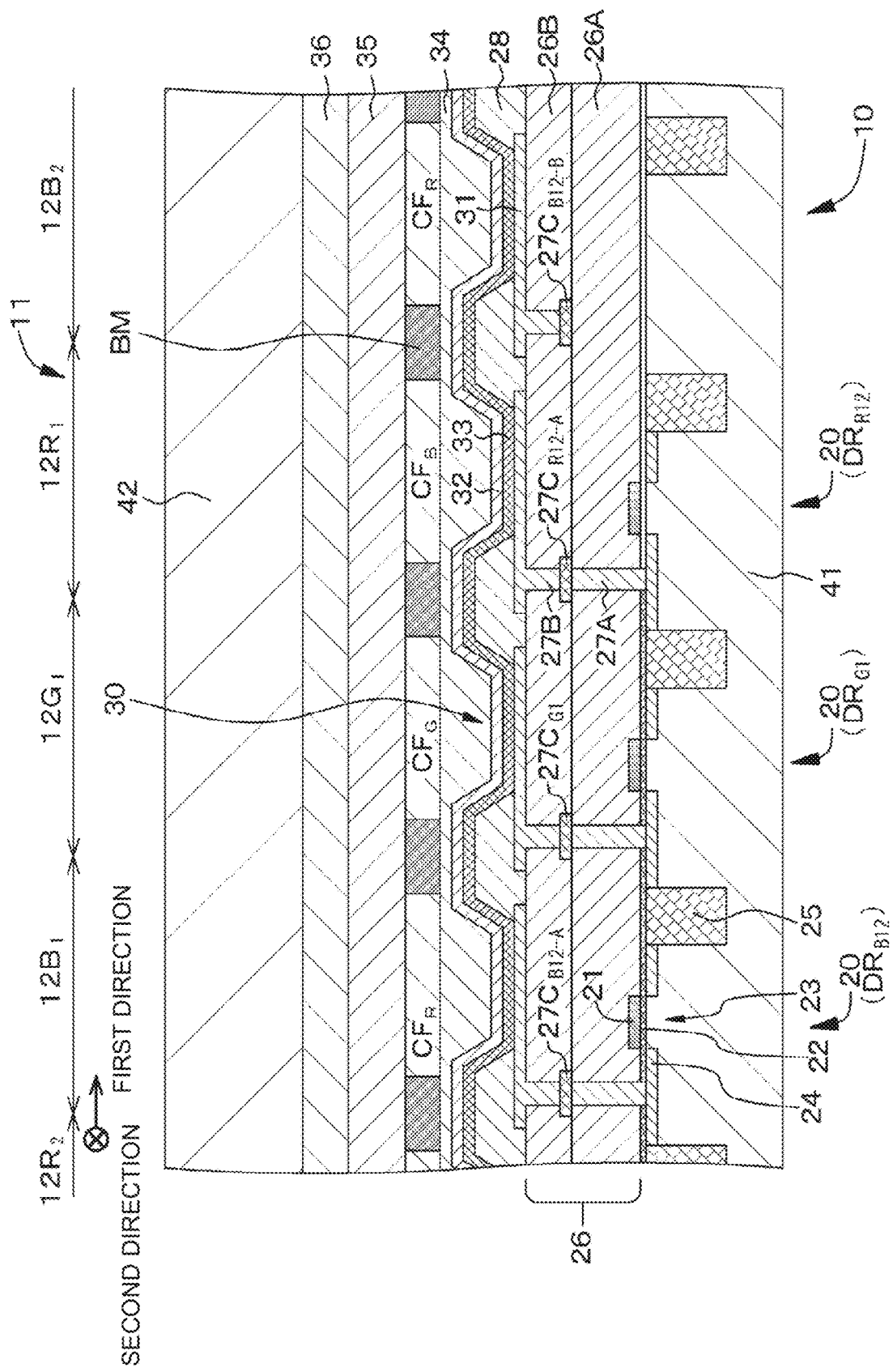
FIG. 13 is a schematic partial cross-sectional view of a display device of a third modified example of the first embodiment.

Further, as illustrated in FIG. 13 illustrating a schematic partial cross-sectional view of a display device of a third modified example of the first embodiment, a light absorption layer (black matrix layer) BM can be formed between adjacent color filter layers CF of a light emitting element. The black matrix layer BM is formed of, for example, a black resin film (specifically, for example, a black polyimide resin) obtained by mixing a black colorant and having an optical density of 1 or more.

Figure 14:
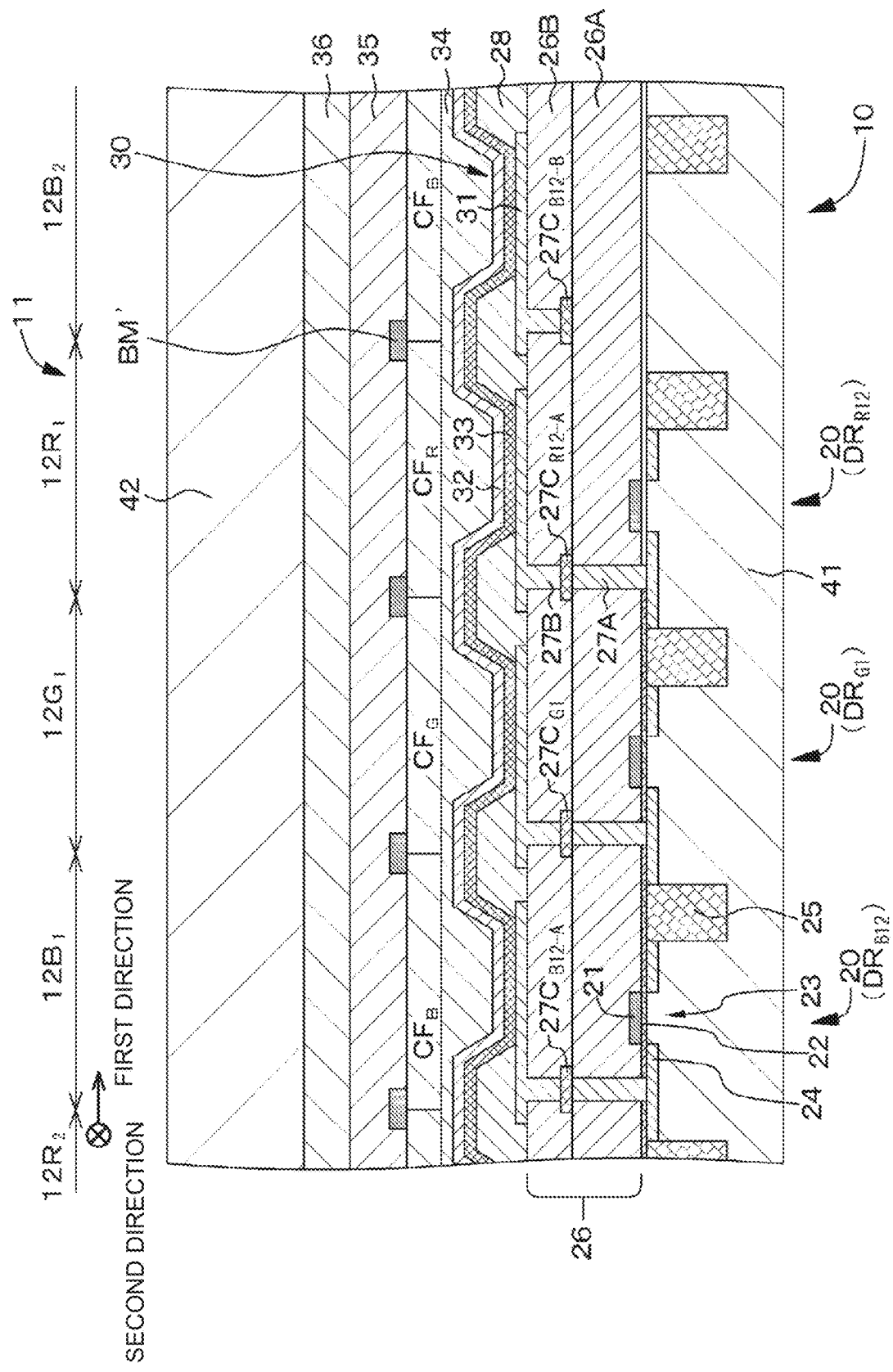
FIG. 14 is a schematic partial cross-sectional view of a display device of a fourth modified example of the first embodiment.

In addition, as illustrated in FIG. 14 illustrating a schematic partial cross-sectional view of a display device of a fourth modified example of the first embodiment, a light absorption layer (black matrix layer) BM' can be formed above and between adjacent color filter layers CF of a light emitting element. In addition, these third and fourth modified examples can be combined, and these various modified examples or the combination of the modified examples can be applied to another embodiment.

The planarization layer can have a function as a color filter layer. That is, the planarization layer having such a function may be formed of a known color resist material. By making the planarization layer also function as a color filter layer, the organic layer and the planarization layer can be closely arranged, such that prevention of color mixing can be effectively achieved even when light emitted from the light emitting element is widened, thereby improving viewing angle characteristics.

A light shielding portion may be provided between the light emitting element and the light emitting element in order to prevent light emitted from the light emitting element from entering the light emitting element adjacent to a certain light emitting element and thus to prevent optical crosstalk from being generated. That is, a groove may be formed between the light emitting element and the light emitting element, and the groove may be embedded with a light shielding material to form a light shielding portion. When such a light shielding portion is provided, a proportion in which light emitted from a certain light emitting element invades the adjacent light emitting element can be reduced, and a phenomenon in which color mixing occurs and a chromaticity of the entire pixels deviates from a desired chromaticity can be suppressed. Since the color mixing can be prevented, the color purity when the pixel emits single color light is increased, and a chromaticity point becomes deeper. Therefore, a color gamut becomes wider, and a range of color expression of the display device becomes wider. In addition, the color filter layer is arranged for each pixel in order to improve the color purity, and depending on the configuration of the light emitting element, it is possible to make the color filter layer thinner or to omit the color filter layer, or it is possible to extract light absorbed by the color filter layer. As a result, the light emitting efficiency is improved. Alternatively, light shielding properties may be imparted to the light absorption layer (black matrix layer).

A light guide portion (a light reflective portion or a reflector portion) that controls a traveling direction of the light emitted from the light emitting unit may be included. Specifically, the light guide portion may be formed of a material that reflects the light emitted from the light emitting unit, and examples of the material can include a metal material, an alloy material, a dielectric material (an insulating material) having a refractive index smaller than a refractive index of a medium through which light emitted from the light emitting unit passes, and a multi-layer configuration of the dielectric material. Specifically, examples of the metal material or the alloy material can include an aluminum (Al) layer, an aluminum alloy layer (for example, an Al—Nd layer), a chromium (Cr) layer, a silver (Ag) layer, and a silver alloy layer (for example, an Ag—Cu layer, an Ag—Pd—Cu layer, or an Ag—Sm—Cu layer), and the light guide unit can be formed by, for example, a vapor deposition method including an electron beam vapor deposition method, a heat filament vapor deposition method, and a vacuum vapor deposition method; a sputtering method; a CVD method; an ion plating method; a plating method (an electroplating method or an electroless plating method); a lift-off method; a laser ablation method; and a sol-gel method. An example of a shape of the light reflective portion of the light guide portion can include a cylindrical side surface.

Figure 19A:
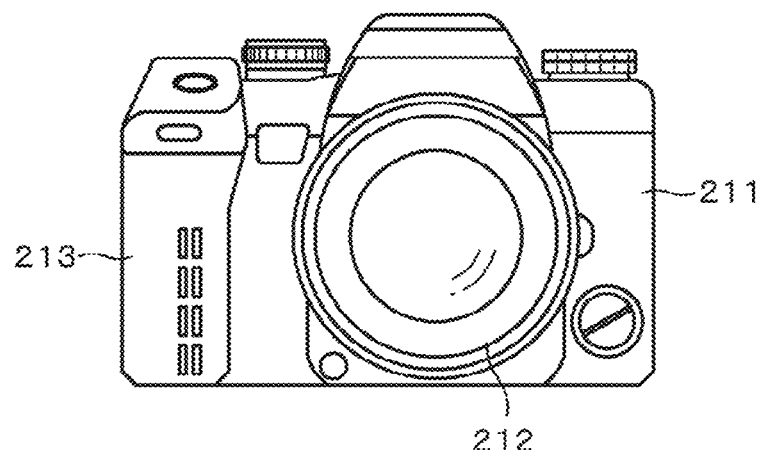
FIGS. 19A and 19B illustrate examples in which the display device of the present disclosure is applied to an interchangeable single lens reflex digital still camera, in which a front view of the digital still camera is illustrated in FIG. 19A and a rear view of the digital still camera is illustrated in FIG. 19B.
Figure 19B:
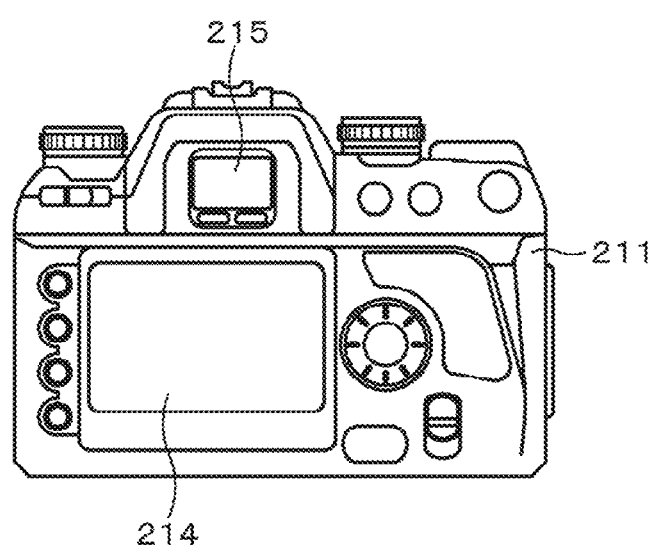

The display device of the present disclosure can be applied to an interchangeable single lens reflex digital still camera. A front view of the digital still camera is illustrated in FIG. 19A, and a rear view of the digital still camera is illustrated in FIG. 19B. The interchangeable single lens reflex digital still camera includes, for example, an interchangeable imaging lens unit (interchangeable lens) 212 provided on a front right side of a camera main body (camera body) 211 and a grip portion 213 provided on a front left side and held by a photographer. A monitor 214 is provided substantially in the center of a rear surface of the camera main body 211. An electronic viewfinder (eyepiece window) 215 is provided above the monitor 214. By looking into the electronic viewfinder 215, the photographer can visually recognize an optical image of a subject guided from the imaging lens unit 212 and determine a composition. In the interchangeable single lens reflex digital still camera having such a configuration, the display device of the present disclosure can be used as the electronic viewfinder 215.

In a case where a resonator structure is provided, a light reflective layer 37 may be formed below a first electrode 31 (on a first substrate 41 side). That is, in a case where the light reflective layer 37 is provided on a substrate 26 and the first electrode 31 is provided on an interlayer insulating film 38 that covers the light reflective layer 37, the first electrode 31, the light reflective layer 37, and the interlayer insulating film 38 may be formed of the materials described above. The light reflective layer 37 may be or may not be connected to a contact hole (contact plug) 27.

Figure 29A:
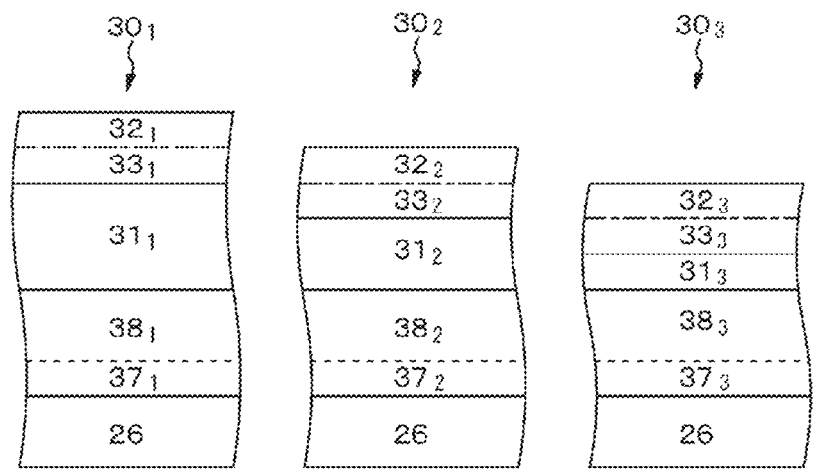
FIGS. 29A and 29B are conceptual views of light emitting elements having resonator structures of a fifth example and a sixth example.
Figure 29B:
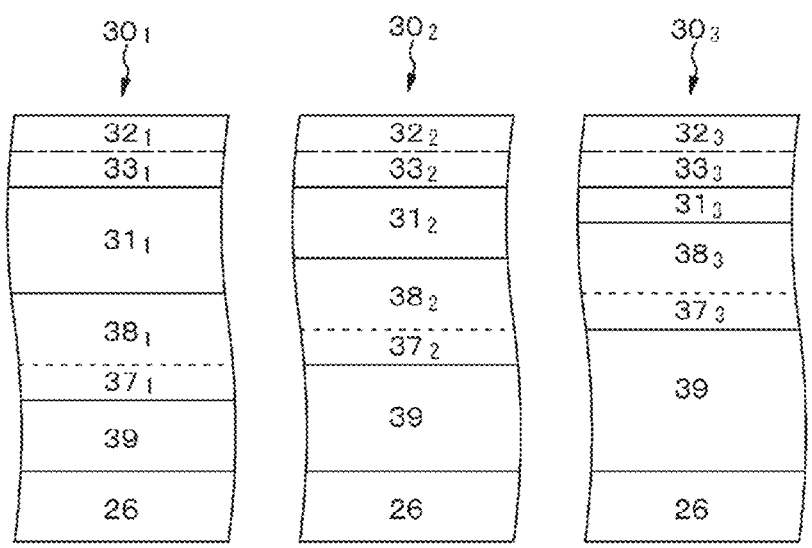
Figure 30A:
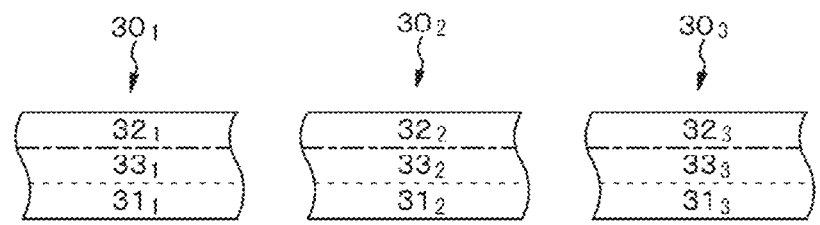
FIG. 30A is a conceptual view of a light emitting element having a resonator structure of a seventh example.
Figure 30B:
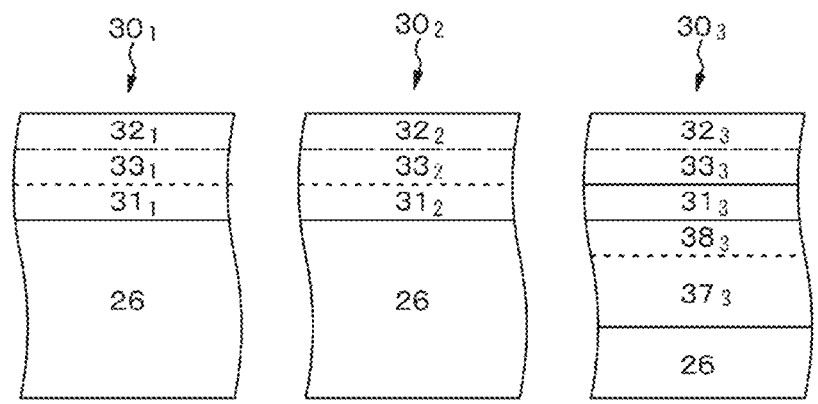
FIGS. 30B and 30C are conceptual views of light emitting elements having resonator structures of an eighth example.
Figure 30C:
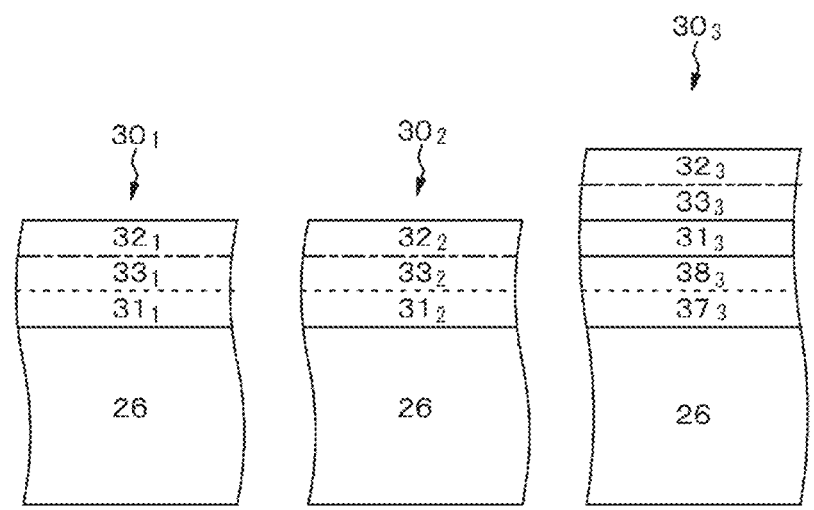

Hereinafter, a resonator structure will be described based on first to eighth examples with reference to FIG. 27A (the first example), FIG. 27B (the second example), FIG. 28A (the third example), FIG. 28B (the fourth example), FIG. 29A (the fifth example), FIG. 29B (the sixth example), FIG. 30A (the seventh example), and FIGS. 30B and 30C (the eighth example). Here, in the first to fourth examples and the seventh example, a first electrode and a second electrode have the same thicknesses in each of light emitting units. On the other hand, in the fifth and sixth examples, the first electrode has a different thickness in each of the light emitting units, and the second electrode has the same thickness in each of the light emitting units. In addition, in the eighth example, the first electrode may have a difference thickness or the same thickness in each of the light emitting units, and the second electrode has the same thickness in each of the light emitting units.

Note that in the following description, a light emitting unit including a first light emitting element $12_1$, a second light emitting element $12_2$, or a third light emitting element $12_3$ is represented by the reference numeral $30_1$, $30_2$, or $30_3$, a first electrode is represented by the reference numeral $31_1$, $31_2$, or $31_3$, a second electrode is represented by the reference numeral $32_1$, $32_2$, or $32_3$, an organic layer is represented by the reference numeral $33_1$, $33_2$, or $33_3$, a light reflective layer is represented by the reference numeral $37_1$, $37_2$, or $37_3$, and an interlayer insulating film is represented by the reference numeral $38_1$, $38_2$, $38_3$, $38_1'$, $38_2'$, or $38_3'$. In the following description, materials to be used are exemplified, and can be appropriately changed.

In the illustrated examples, resonator lengths of the first light emitting element $12_1$, the second light emitting element $12_2$, and the third light emitting element $12_3$ derived from Equations (1-1) and (1-2) are shortened in the order of the first light emitting element $12_1$, the second light emitting element $12_2$, and the third light emitting element $12_3$, but are not limited thereto. An optimum resonator length may be determined by appropriately setting values of $m_1$ and $m_2$.

Figure 27A:
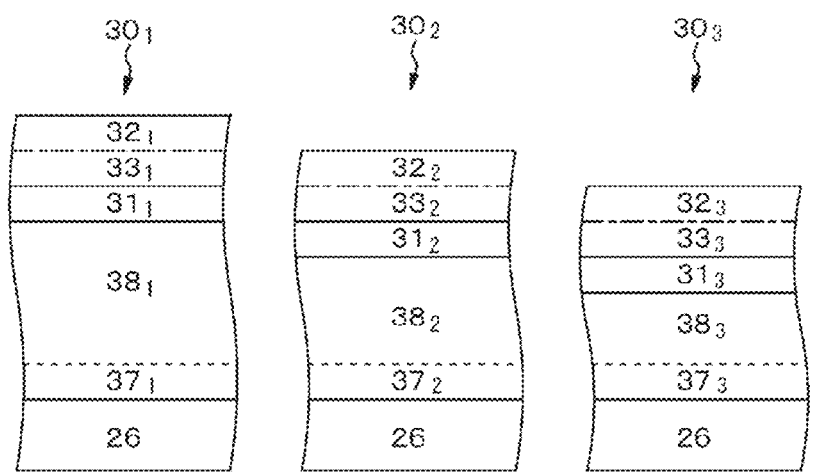
FIGS. 27A and 27B are conceptual views of light emitting elements having resonator structures of a first example and a second example.
Figure 27B:
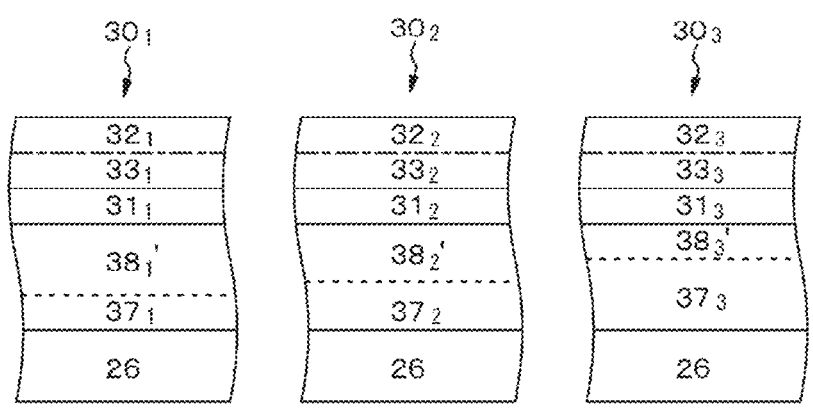
Figure 28A:
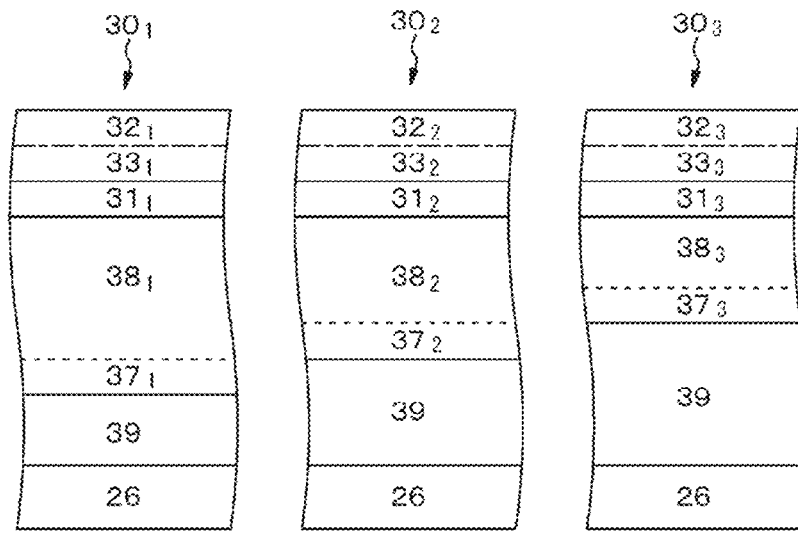
FIGS. 28A and 28B are conceptual views of light emitting elements having resonator structures of a third example and a fourth example.
Figure 28B:
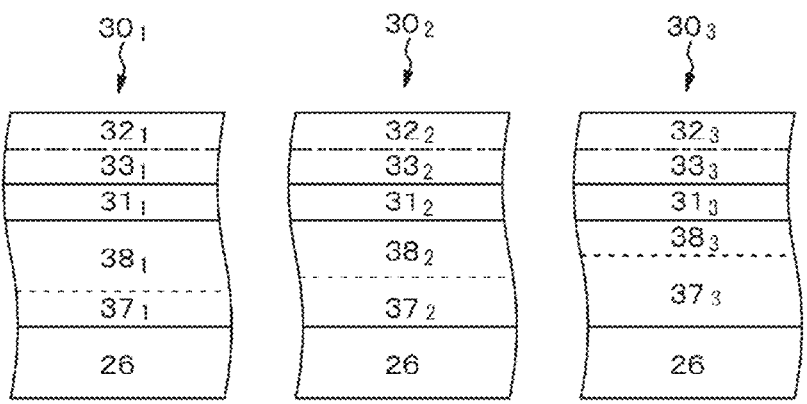

A conceptual view of the light emitting element having the resonator structure of the first example is illustrated in FIG. 27A, a conceptual view of the light emitting element having the resonator structure of the second example is illustrated in FIG. 27B, a conceptual view of the light emitting element having the resonator structure of the third example is illustrated in FIG. 28A, and a conceptual view of the light emitting element having the resonator structure of the fourth example is illustrated in FIG. 28B. In some of the first to sixth examples and the eighth example, each of the interlayer insulating films 38 and 38' are formed under the first electrode 31 of the light emitting unit 30, and the light reflective layer 37 is formed under each of the interlayer insulating films 38 and 38'. In the first to fourth examples, thicknesses of the interlayer insulating films 38 and 38' are different in the light emitting units $30_1$, $30_2$, and $30_3$. A thickness of each of the interlayer insulating films $38_1$, $38_2$, $38_3$, $38_1'$, $38_2'$, or $38_3'$ is appropriately set, such that an optical distance in which an optimum resonance is generated according to a light emission wavelength of the light emitting unit 30 can be set.

In the first example, levels of first interfaces (in the drawings, indicated by a dotted line) are the same as each other in the light emitting units $30_1$, $30_2$, and $30_3$, and levels of second interfaces (in the drawings, indicated by a dash-single dotted line) are different from each other in the light emitting units $30_1$, $30_2$, and $30_3$. In addition, in the second example, the levels of the first interfaces are different from each other in the light emitting units $30_1$, $30_2$, and $30_3$, and the levels of the second interfaces are the same as each other in the light emitting units $30_1$, $30_2$, and $30_3$.

In the second example, each of the interlayer insulating films $38_1'$, $38_2'$, and $38_3'$ is implemented by an oxide film in which a surface of the light reflective layer 37 is oxidized. The interlayer insulating film 38' implemented by an oxide film is formed of, for example, aluminum oxide, tantalum oxide, titanium oxide, magnesium oxide, zirconium oxide, or the like depending on a material forming the light reflective layer 37. The surface of the light reflective layer 37 can be oxidized by, for example, the following method. That is, the first substrate 41 on which the light reflective layer 37 is formed is immersed in an electrolytic solution filled in a container. In addition, a cathode is arranged so as to face the light reflective layer 37. The light reflective layer 37 is used as an anode, and the light reflective layer 37 is anodized. A thickness of the oxide film by the anodization is proportional to a potential difference between the light reflective layer 37 as the anode and the cathode. Therefore, the anodization is performed in a state where a voltage corresponding to each of the light emitting units $30_1$, $30_2$, and $30_3$ is applied to each of the light reflective layers $37_1$, $37_2$, and $37_3$. As a result, the interlayer insulating films $38_1'$, $38_2'$, and $38_3'$ implemented by the oxide films having different thicknesses can be collectively formed on the surface of the light reflective layer 37. Thicknesses of the light reflective layers $37_1$, $37_2$, and $37_3$ and thicknesses of the interlayer insulating films $38_1'$, $38_2'$, and $38_3'$ are different depending on the light emitting units $30_1$, $30_2$, and $30_3$.

In the third example, a base film 39 is disposed under the light reflective layer 37, and the base films 39 have different thicknesses in the light emitting units $30_1$, $30_2$, and $30_3$. That is, in the illustrated example, the thicknesses of the base films 39 are thicker in the order of the light emitting unit $30_1$, the light emitting unit $30_2$, and the light emitting unit $30_3$.

In the fourth example, the thicknesses of the light reflective layers $37_1$, $37_2$, and $37_3$ at the time of film formation are different in the light emitting units $30_1$, $30_2$, and $30_3$. In the third and fourth examples, the levels of the second interfaces are the same as each other in the light emitting units $30_1$, $30_2$, and $30_3$, and the levels of the first interfaces are different from each other in the light emitting units $30_1$, $30_2$, and $30_3$.

In the fifth and sixth examples, thicknesses of the first electrodes $31_1$, $31_2$, and $31_3$ are different in the light emitting units $30_1$, $30_2$, and $30_3$. The light reflective layer 37 has the same thickness in each of the light emitting units 30.

In the fifth example, the levels of the first interfaces are the same as each other in the light emitting units $30_1$, $30_2$, and $30_3$, and the levels of the second interfaces are different from each other in the light emitting units $30_1$, $30_2$, and $30_3$.

In the sixth example, the base film 39 is disposed under the light reflective layer 37, and the base films 39 have different thicknesses in the light emitting units $30_1$, $30_2$, and $30_3$. That is, in the illustrated example, the thicknesses of the base films 39 are thicker in the order of the light emitting unit $30_1$, the light emitting unit $30_2$, and the light emitting unit $30_3$. In the sixth example, the levels of the second interfaces are the same as each other in the light emitting units $30_1$, $30_2$, and $30_3$, and the levels of the first interfaces are different from each other in the light emitting units $30_1$, $30_2$, and $30_3$.

In the seventh example, each of the first electrodes $31_1$, $31_2$, and $31_3$ also serves as a light reflective layer, and optical constants (specifically, phase shift amounts) of materials forming the first electrodes $31_1$, $31_2$, and $31_3$ are different depending on the light emitting units $30_1$, $30_2$, and $30_3$. For example, the first electrode $31_1$ of the light emitting unit $30_1$ may be formed of copper (Cu), and the first electrode $31_2$ of the light emitting unit $30_2$ and the first electrode $31_3$ of the light emitting unit $30_3$ may be formed of aluminum (Al).

In addition, in the eighth example, each of the first electrodes $31_1$ and $31_2$ also serves as a light reflective layer, and optical constants (specifically, phase shift amounts) of materials forming the first electrodes $31_1$ and $31_2$ are different depending on the light emitting units $30_1$ and $30_2$. For example, the first electrode $31_1$ of the light emitting unit $30_1$ may be formed of copper (Cu), and the first electrode $31_2$ of the light emitting unit $30_2$ and the first electrode $31_3$ of the light emitting unit $30_3$ may be formed of aluminum (Al). In the eighth example, for example, the seventh example is applied to the light emitting units $30_1$ and $30_2$, and the first example is applied to the light emitting unit $30_3$. The thicknesses of the first electrodes $31_1$, $31_2$, and $31_3$ may be different from or the same as each other.

Note that the present disclosure can also have the following configuration.

(A01)

A display device comprising a plurality of light emitting element groups arranged in a first direction and a second direction different from the first direction, wherein
- each of the light emitting element groups includes a plurality of light emitting element units,
- each of the light emitting element units includes one first light emitting element that emits a first color, one second light emitting element that emits a second color, and one third light emitting element that emits a third color,
- each of the light emitting element groups includes first drive circuits that drive the first light emitting elements, second drive circuits that drive the second light emitting elements, and third drive circuits that drive the third light emitting elements, and
- in each of the light emitting element groups, the number of first drive circuits is equal to the number of first light emitting elements, the number of second drive circuits is less than the number of second light emitting elements, and the number of third drive circuits is less than the number of third light emitting elements.

(A02)

The display device according to (A01), further comprising:
- first signal lines extending in the second direction; second signal lines extending in the second direction; and third signal lines extending in the second direction, wherein
- in each of the light emitting element groups, the light emitting element units are arranged in the first direction,
- the first drive circuits, the second drive circuits, and the third drive circuits are arranged in the first direction,
- each of the first drive circuits is connected to each of the first signal lines,
- each of the second drive circuits is connected to each of the second signal lines, and
- each of the third drive circuits is connected to each of the third signal lines.

(A03)

The display device according to (A01), further comprising:
- first signal lines extending in the second direction; second signal lines extending in the second direction; and third signal lines extending in the second direction, wherein
- in each of the light emitting element groups, the light emitting element units are arranged in the second direction,
- the first drive circuits, the second drive circuits, and the third drive circuits are arranged in the second direction,
- all of the first drive circuits are connected to one shared first signal line, and
- the second drive circuits and the third drive circuits are connected to one shared second signal line.

(A04)

The display device according to any one of (A01) to (A03), wherein
in each of the light emitting element groups, $$M_1 = M_2 = M_3 = 2,$$
$$N_1 = 2, \text{ and}$$
$$N_2 = N_3 = 1,$$

in which the number of first light emitting elements is $M_1$, the number of second light emitting elements is $M_2$, the number of third light emitting elements is $M_3$, the number of first drive circuits is Ni, the number of second drive circuits is $N_2$, and the number of third drive circuits is $N_3$.

(A05)

The display device according to (A04), wherein
- a signal obtained by calculating a gray scale mean of signals for each of two second light emitting elements is supplied to the second drive circuit, and
- a signal obtained by calculating a gray scale mean of signals for each of two third light emitting elements is supplied to the third drive circuit.

(A06)

The display device according to (A02), wherein
in each of the light emitting element groups, $$M_1 = M_2 = M_3 = 4,$$
$$N_1 = 4,$$
$$N_2 = 2, \text{ and}$$
$$N_3 = 1,$$

in which the number of first light emitting elements is $M_1$, the number of second light emitting elements is $M_2$, the number of third light emitting elements is $M_3$, the number of first drive circuits is $N_1$, the number of second drive circuits is $N_2$, and the number of third drive circuits is $N_3$.

(A07)

The display device according to (A06), wherein
- a signal obtained by calculating a gray scale mean of signals for each of two second light emitting elements is supplied to the second drive circuit, and
- a signal obtained by calculating a gray scale mean of signals for each of four third light emitting elements is supplied to the third drive circuit.

(A08)

The display device according to any one of (A01) to (A07), wherein in each of the light emitting element units, an arrangement of the first light emitting elements, the second light emitting elements, and the third light emitting elements is a delta arrangement.

(A09)

The display device according to any one of (A01) to (A07), wherein in each of the light emitting element units, an arrangement of the first light emitting elements, the second light emitting elements, and the third light emitting elements is a striped arrangement.

(A10)

The display device according to any one of (A01) to (A09), wherein the first color is green, the second color is red, and the third color is blue.

(A11)

The display device according to any one of (A01) to (A10), wherein each of the light emitting element units further includes one fourth light emitting element that emits a fourth color, each of the light emitting element groups further includes fourth drive circuits that drive the fourth light emitting elements, and in each of the light emitting element groups, the number of fourth drive circuits is equal to or less than the number of fourth light emitting elements.

(A12)

The display device according to (A11), wherein the first color is green, the second color is red, the third color is blue, and the fourth color is white.

(A13)

The display device according to any one of (A01) to (A12), wherein a size of a light emitting unit of the first light emitting element is larger than each of a size of a light emitting unit of the second light emitting element and a size of a light emitting unit of the third light emitting element.

(A14)

The display device according to any one of (A01) to (A13), wherein the light emitting element is implemented by an organic electroluminescence element.

REFERENCE SIGNS LIST

10 LIGHT EMITTING ELEMENT GROUP
11, $11_1$, $11_2$, $11_3$, $11_4$ LIGHT EMITTING ELEMENT UNIT
12 LIGHT EMITTING ELEMENT
12G, $12G_1$, $12G_2$, $12G_3$, $12G_4$ FIRST LIGHT EMITTING ELEMENT
12R, $12R_1$, $12R_2$, $12R_3$, $12R_4$ SECOND LIGHT EMITTING ELEMENT
12B, $12B_1$, $12R_2$, $12B_3$, $12B_4$ THIRD LIGHT EMITTING ELEMENT
12W, $12W_1$, $12W_2$ FOURTH LIGHT EMITTING ELEMENT
$DR_{G1}$, $DR_{G2}$, $DR_{G3}$, $DR_{G4}$ FIRST DRIVE CIRCUIT
$DR_{R121}$, $DR_{R34}$ SECOND DRIVE CIRCUIT
$DR_{B12}$, $DR_{B34}$ THIRD DRIVE CIRCUIT
$DR_{W1}$, $DR_{W2}$ FOURTH DRIVE CIRCUIT
$SL_{G1}$, $SL_{G2}$ FIRST SIGNAL LINE
$SL_{R12}$, $SL_2$ SECOND SIGNAL LINE
$SL_{B12}$, $SL_3$ THIRD SIGNAL LINE
$SL_1$, $SL_2$, $SL_3$, $SL_4$ FIRST SIGNAL LINE
$SL_{G12}$, $SL_{R-B12}$ SHARED SIGNAL LINE
$DT_{G1}$, $DT_{G2}$, $DT_{R12}$, $DT_{B12}$ DATA SIGNAL
$T_{R12}$, $T_{B12}$ GRAY SCALE MEAN
20 TRANSISTOR
22 GATE INSULATING LAYER
21 GATE ELECTRODE
24 SOURCE/DRAIN REGION
23 CHANNEL FORMATION REGION
24 SOURCE/DRAIN REGION
25 ELEMENT SEPARATION REGION
26 SUBSTRATE
26A LOWER INTERLAYER INSULATING LAYER
26B UPPER INTERLAYER INSULATING LAYER
27A, 27B CONTACT PLUG
$27C_{G1}$, $27C_{G2}$, $27C_{B12-A}$, $27C_{B12-A}$, $27C_{B12-B}$, $27C_{B12-A}$, $27C_{B12-A}$, $27C_{B12-B}$ PAD PORTION
28 INSULATING LAYER
30 LIGHT EMITTING UNIT
31 FIRST ELECTRODE
32 SECOND ELECTRODE
33 ORGANIC LAYER (INCLUDING LIGHT EMITTING LAYER INCLUDING ORGANIC ELECTROLUMINESCENCE LAYER)
34 PROTECTIVE LAYER
CF, $CF_R$, $CF_G$, $CF_B$ COLOR FILTER LAYER
35 PLANARIZATION LAYER
36 SEALING RESIN LAYER
37 LIGHT REFLECTIVE LAYER
38 INTERLAYER INSULATING FILM
39 BASE LAYER
41 FIRST SUBSTRATE
42 SECOND SUBSTRATE
50 LENS MEMBER (ON-CHIP MICROLENS)
BM, BM' LIGHT ABSORPTION LAYER (BLACK MATRIX LAYER)
100 IMAGE DISPLAY DEVICE
110 IMAGE FORMING DEVICE
111 DISPLAY DEVICE
112 HOUSING
121 LIGHT GUIDE PLATE
122 FIRST SURFACE OF LIGHT GUIDE PLATE
123 SECOND SURFACE OF LIGHT GUIDE PLATE
131 FIRST DEFLECTION MEANS
132 SECOND DEFLECTION MEANS
140 FRAME
140' NOSE PAD
141 FRONT PORTION
141' CENTRAL PORTION OF FRONT PORTION
142 HINGE
143 TEMPLE PORTION
144 EAR BEND PORTION (TIP CELL, EARMUFFS, OR EAR PAD)
145 WIRING (SIGNAL LINE, POWER LINE, OR THE LIKE)
146 HEADPHONE PORTION
146' WIRING FOR HEADPHONE PORTION
147 CAMERA
148 CONTROL DEVICE (CONTROL CIRCUIT OR CONTROL MEANS)
149 ATTACHMENT MEMBER
150 OBSERVER
151 PUPIL
211 CAMERA MAIN BODY (CAMERA BODY)
212 IMAGING LENS UNIT (INTERCHANGEABLE LENS)
213 GRIP PORTION
214 MONITOR
215 ELECTRONIC VIEWFINDER (EYEPIECE WINDOW)

The invention claimed is:

1. A display device comprising:
a substrate;
a first light emitting region above the substrate and configured to emit a first color light;
a second light emitting region above the substrate and configured to emit a second color light;
a third light emitting region above the substrate and configured to emit a third color light;
a first color filter corresponding to the first light emitting region;

a second color filter corresponding to the second light emitting region;

a third color filter corresponding to the third light emitting region;

a first drive circuit configured to drive the first light emitting region;

a second drive circuit configured to drive the second light emitting region; and a third drive circuit configured to drive the third light emitting region, wherein the first light emitting region includes, in a cross-sectional view, a first electrode corresponding to the first light emitting region, a second electrode above the first electrode, a light emitting layer between the first electrode and the second electrode, a reflective layer below the light emitting layer and configured to reflect light emitted by the light emitting layer, and an insulating film between the first electrode and the reflective layer;

the second light emitting region includes, in the cross-sectional view, a first electrode corresponding to the second light emitting region, a second electrode above the first electrode, a light emitting layer between the first electrode and the second electrode, a reflective layer below the light emitting layer and configured to reflect light emitted by the light emitting layer, and an insulating film between the first electrode and the reflective layer;

the third light emitting region includes, in the cross-sectional view, a first electrode corresponding to the third light emitting region, a second electrode above the first electrode, a light emitting layer between the first electrode and the second electrode, a reflective layer below the light emitting layer and configured to reflect light emitted by the light emitting layer, and an insulating film between the first electrode and the reflective layer;

in the cross-sectional view, portions comprising the reflective layer, the insulating film, the first electrode, the light emitting layer, and the second electrode respectively corresponding to at least two of the first light emitting region, the second light emitting region and the third light emitting region have a same structural relationship;

the light emitting layers respectively corresponding to the first light emitting region, the second light emitting region, and the third light emitting region are formed in a same layer;

the first drive circuit includes a drive transistor and is configured to drive multiple instances of the first light emitting region;

the first drive circuit is connected to a first signal line to send data signals to the multiple instances of the first light emitting region;

the multiple instances of the first light emitting region are arranged in a first direction; and the first signal line extends in the first direction.

2. The display device according to claim 1, wherein a fourth color of light based upon the first color light emitted from the first light emitting region exits the first color filter without passing through a lens, a fifth color of light based upon the second color light emitted from the second light emitting region exits the second color filter without passing through a lens, a sixth color of light based upon the third color light emitted from the third light emitting region exits the third color filter without passing through a lens, and the fourth color, the fifth color and the sixth color are different from each other.

3. The display device according to claim 1, wherein the first drive circuit is configured to simultaneously emits light from the multiple instances of the first light emitting region when the drive transistor is conducting.

4. The display device according to claim 1, wherein a source/drain region of the drive transistor is electrically connected to multiple first electrodes respectively corresponding to the multiple instances of the first light emitting region.

5. The display device according to claim 1, where the light emitting layers respectively corresponding to the first light emitting region, the second light emitting region, and the third light emitting region are formed of a same material.

6. The display device according to claim 1, wherein respective areas of the first drive circuit, the second drive circuit, and the third drive circuit are the same.

7. The display device according to claim 1, wherein organic layers respectively corresponding to the first light emitting region, the second light emitting region, and the third light emitting region are formed of a same material.

8. The display device according to claim 1, wherein, in a plan view, the first drive circuit and the first signal line overlap each other.

9. The display device according to claim 1, wherein the first drive circuit and the second drive circuit are arranged along a second direction orthogonal to the first signal line.

10. The display device according to claim 1, wherein the first drive circuit and the third drive circuit are arranged along the first direction.

11. The display device according to claim 1, further comprising:

a first light-absorbing member between the first color filter and the second color filter, and a second light-absorbing member between the second color filter and the third color filter.

12. The display device according to claim 1, wherein the first drive circuit, the second drive circuit, and the third drive circuit respectively include a transistor.

13. The display device according to claim 1, wherein the first light emitting region is larger than the second light emitting region and is larger than the third light emitting region.

14. The display device according to claim 1, wherein a scan line that supplies a control signal extends along the second direction.

15. The display device according to claim 1, wherein the first color light is either red or blue, the second color light is the other of red or blue, and the third color light is green.

16. The display device according to claim 1, wherein, in the cross-sectional view, portions comprising the first electrode, the second electrode, and the light emitting layer respectively corresponding to the first light emitting region, the second light emitting region, and the third light emitting region have a same structural relationship.

17. The display device according to claim 1, wherein the insulating film respectively corresponding to the first light emitting region, the second light emitting region, and the third light emitting region has a first thickness corresponding to the first light emitting region, a second thickness corresponding to the second light emitting region, and a third thickness corresponding to the third light emitting region, and the first thickness, the second thickness and the third thickness are different from each other.

* * * * *